United States Patent
Chen et al.

(10) Patent No.: US 12,148,664 B2
(45) Date of Patent: Nov. 19, 2024

(54) SEMICONDUCTOR DEVICE AND METHOD HAVING A THROUGH SUBSTRATE VIA AND AN INTERCONNECT STRUCTURE

(71) Applicant: Taiwan Semiconductor Manufacturing Co., Ltd., Hsinchu (TW)

(72) Inventors: Ming-Fa Chen, Taichung (TW); Tzuan-Horng Liu, Longtan Township (TW); Chao-Wen Shih, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/874,741

(22) Filed: Jul. 27, 2022

(65) Prior Publication Data

US 2022/0375793 A1  Nov. 24, 2022

Related U.S. Application Data

(62) Division of application No. 17/012,312, filed on Sep. 4, 2020, now Pat. No. 11,658,069.

(Continued)

(51) Int. Cl.
*H01L 21/768* (2006.01)
*H01L 21/3065* (2006.01)
(Continued)

(52) U.S. Cl.
CPC .. *H01L 21/76898* (2013.01); *H01L 21/76805* (2013.01); *H01L 21/76831* (2013.01);
(Continued)

(58) Field of Classification Search
CPC ......... H01L 21/76898; H01L 21/76805; H01L 21/76831; H01L 21/76832; H01L 24/08;
(Continued)

(56) References Cited

U.S. PATENT DOCUMENTS

| | | |
|---|---|---|
| 5,946,596 A | 8/1999 | Ying |
| 9,525,001 B2 | 12/2016 | Cheng et al. |

(Continued)

FOREIGN PATENT DOCUMENTS

| | | |
|---|---|---|
| JP | 2013168679 A | 8/2013 |
| KR | 101720406 B1 | 3/2017 |
| KR | 101761016 B1 | 7/2017 |

*Primary Examiner* — Khiem D Nguyen
(74) *Attorney, Agent, or Firm* — Slater Matsil, LLP

(57) ABSTRACT

An embodiment is a method including forming a first interconnect structure over a first substrate, the first interconnect structure comprising dielectric layers and metallization patterns therein, patterning the first interconnect structure to form a first opening, coating the first opening with a barrier layer, etching a second opening through the barrier layer and the exposed portion of the first substrate, depositing a liner in the first opening and the second opening, filling the first opening and the second opening with a conductive material, and thinning the first substrate to expose a portion of the conductive material in the second opening, the conductive material extending through the first interconnect structure and the first substrate forming a through substrate via.

20 Claims, 57 Drawing Sheets

Related U.S. Application Data

(60) Provisional application No. 63/000,404, filed on Mar. 26, 2020.

(51) Int. Cl.
 H01L 23/00 (2006.01)
 H01L 25/00 (2006.01)
 H01L 25/065 (2023.01)

(52) U.S. Cl.
 CPC ........ H01L 21/76832 (2013.01); H01L 24/08 (2013.01); H01L 24/11 (2013.01); H01L 24/13 (2013.01); H01L 24/32 (2013.01); H01L 24/83 (2013.01); H01L 25/0657 (2013.01); H01L 25/50 (2013.01); *H01L 21/30655* (2013.01); *H01L 21/76814* (2013.01); *H01L 2224/02311* (2013.01); *H01L 2224/02313* (2013.01); *H01L 2224/02372* (2013.01); *H01L 2224/02379* (2013.01); *H01L 2224/08225* (2013.01); *H01L 2224/13024* (2013.01); *H01L 2224/32145* (2013.01); *H01L 2224/8083* (2013.01); *H01L 2224/83896* (2013.01); *H01L 2225/06524* (2013.01); *H01L 2225/06544* (2013.01)

(58) Field of Classification Search
 CPC ......... H01L 24/11; H01L 24/13; H01L 24/32; H01L 24/83; H01L 2224/83896; H01L 2224/13024; H01L 2224/8083; H01L 2224/02372; H01L 2224/06524; H01L 2224/08225; H01L 2224/32145; H01L 2224/02311; H01L 23/481; H01L 25/0657; H01L 2224/02313
 See application file for complete search history.

(56) References Cited

U.S. PATENT DOCUMENTS

| | | | |
|---|---|---|---|
| 9,633,929 B2 | 4/2017 | Yang et al. | |
| 9,716,066 B2* | 7/2017 | Lee | H01L 23/564 |
| 9,764,153 B2* | 9/2017 | Tsai | H01L 27/0688 |
| 10,147,682 B2* | 12/2018 | Kao | H01L 24/00 |
| 10,459,159 B2 | 4/2019 | Huang et al. | |
| 10,319,629 B1 | 6/2019 | Yang et al. | |
| 10,510,641 B2 | 12/2019 | Lin et al. | |
| 10,586,732 B2* | 3/2020 | Mignot | H01L 21/76831 |
| 2011/0193226 A1 | 8/2011 | Kirby et al. | |
| 2012/0199976 A1* | 8/2012 | Yang | H01L 21/76805 257/751 |
| 2013/0052755 A1 | 2/2013 | Chou et al. | |
| 2013/0193555 A1* | 8/2013 | Tu | H01L 29/66181 257/532 |
| 2014/0061924 A1 | 3/2014 | Chen et al. | |
| 2014/0225258 A1* | 8/2014 | Chiu | H01L 21/6835 257/737 |
| 2014/0264883 A1* | 9/2014 | Tsai | H01L 27/0688 257/762 |
| 2015/0021771 A1 | 1/2015 | Lin | |
| 2015/0028494 A1* | 1/2015 | Park | H01L 21/76831 257/774 |
| 2015/0054139 A1 | 2/2015 | Gao et al. | |
| 2015/0179612 A1 | 6/2015 | Tsai et al. | |
| 2015/0206823 A1* | 7/2015 | Lin | H01L 21/76877 438/643 |
| 2015/0228584 A1 | 8/2015 | Huang et al. | |
| 2015/0318246 A1 | 11/2015 | Yu et al. | |
| 2016/0197029 A1 | 7/2016 | Tsai et al. | |
| 2016/0240568 A1* | 8/2016 | Hung | H01L 21/266 |
| 2017/0358534 A1 | 12/2017 | Kim et al. | |
| 2018/0025970 A1 | 1/2018 | Kao et al. | |
| 2019/0131276 A1 | 5/2019 | Chen et al. | |
| 2020/0051918 A1 | 2/2020 | Bae et al. | |

\* cited by examiner

SEMICONDUCTOR DEVICE AND METHOD HAVING A THROUGH SUBSTRATE VIA AND AN INTERCONNECT STRUCTURE

PRIORITY CLAIM AND CROSS-REFERENCE

This application is a divisional of U.S. patent application Ser. No. 17/012,312, filed Sep. 4, 2020, issued as U.S. Pat. No. 11,658,069 entitled "Semiconductor Device and Method," which claims the benefit of U.S. Provisional Application No. 63/000,404, filed on Mar. 26, 2020, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
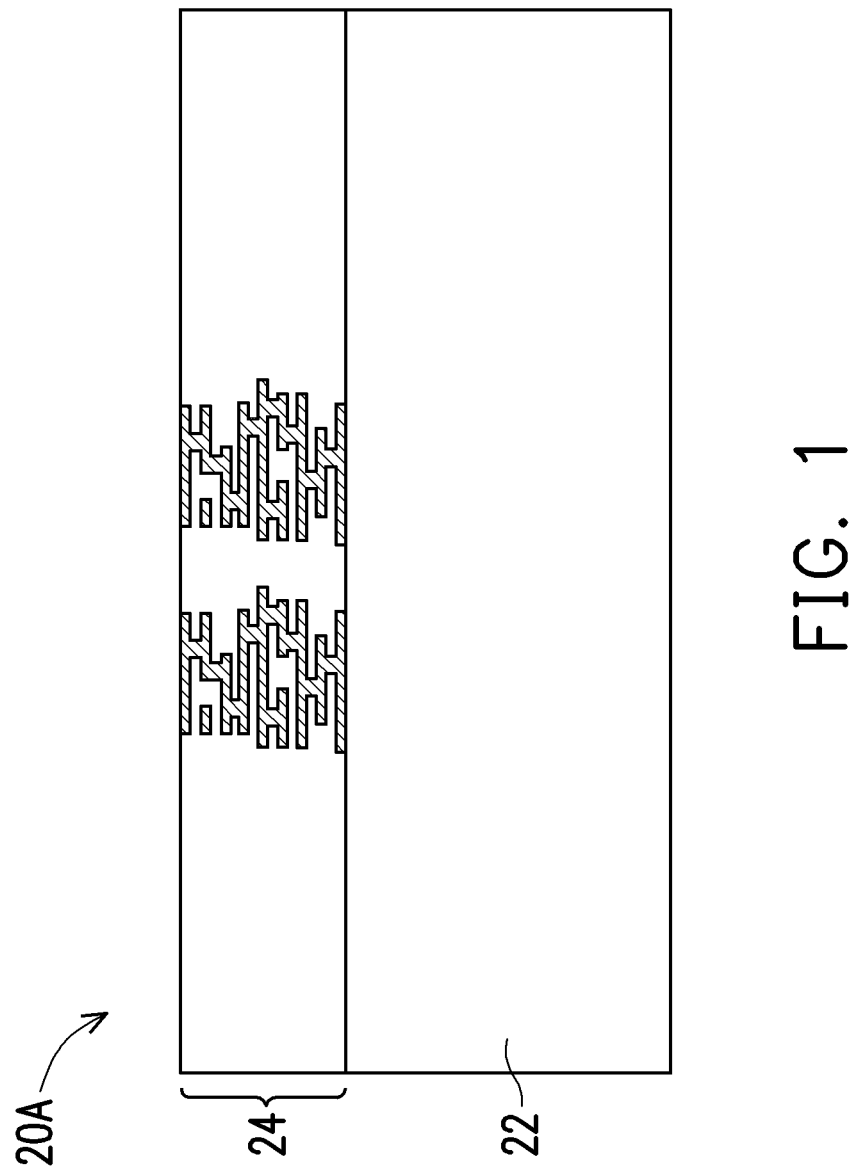
FIGS. 1 through 19 illustrate cross-sectional views of intermediate stages in the formation of a multi-stack die package, according to an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a device structure that can be integrated into a package (e.g., a chip-on-wafer (CoW) package structure or a wafer-on-wafer (WoW) package structure). The device structure includes a passivation layer between a through substrate via (TSV) and the interconnect or redistribution structure to block contamination from entering the interconnect or redistribution structure that may occur during the through via formation. In some embodiments, the passivation layer may include a nitride layer, an undoped silicate glass (USG) layer, the like, or a combination thereof. The contaminants from the formation of the through substrate via can include liquid or moisture used during the formation of the through substrate via and/or can include chemicals, such as sulfur, used during the etching of the through substrate via. In conventional structures, these contaminants can enter the exposed sidewalls of the interconnect layers during the formation of the through substrate via and can damage the metallization patterns and dielectric layers of the interconnect. By blocking the contamination, damage to the metallization patterns of the interconnect layers by the contamination can be prevented.

Further, the teachings of this disclosure are applicable to any device or package structures where a passivation layer can prevent contaminants from damaging an interconnect or redistribution structure. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIGS. 1 through 19 illustrate cross-sectional views of intermediate stages in the formation of a multi-stack die package, according to an embodiment.

FIG. 1 illustrates a cross-sectional view of an integrated circuit die 20A in accordance with some embodiments. The integrated circuit die 20A will be packaged in subsequent processing to form an integrated circuit package. The integrated circuit die 20A may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 20A may be formed in a wafer, which may include different device regions that are singulated in subsequent steps to form a plurality of integrated circuit dies. The integrated circuit die 20A may be processed according to applicable manufacturing processes to form integrated circuits. For example, the integrated circuit die 20A includes a semiconductor substrate 22, such as silicon, doped or undoped, or an active layer of a semiconductor-on-insulator (SOI) substrate. The substrate 22 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 22 has an active surface (e.g., the surface facing upwards in FIG. 1), sometimes called a front side, and an inactive surface (e.g., the surface facing downwards in FIG. 1), sometimes called a back side.

Devices (not shown) may be formed at the front surface of the substrate 22. The devices may be active devices (e.g., transistors, diodes, etc.), capacitors, resistors, the like, or a combination thereof. An inter-layer dielectric (ILD) (not separately illustrated) is over the front surface of the substrate 22. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), Undoped Silicate Glass (USG), or the like.

Conductive plugs (not separately illustrated) extend through the ILD to electrically and physically couple the devices. For example, when the devices are transistors, the conductive plugs may couple the gates and source/drain regions of the transistors. The conductive plugs may be formed of tungsten, cobalt, nickel, copper, silver, gold, aluminum, the like, or combinations thereof. An interconnect structure 24 is over the ILD and the conductive plugs. The interconnect structure 24 interconnects the devices to form an integrated circuit. The interconnect structure 24 may be formed by, for example, metallization patterns in dielectric layers on the ILD. The metallization patterns include metal lines and vias formed in one or more low-k dielectric layers. The metallization patterns of the interconnect structure 24 are electrically coupled to the devices by the conductive plugs. The metallization patterns may be formed using any suitable process, such as a single damascene process, a dual damascene process, a plating process, combinations thereof, or the like.

Figure 2:
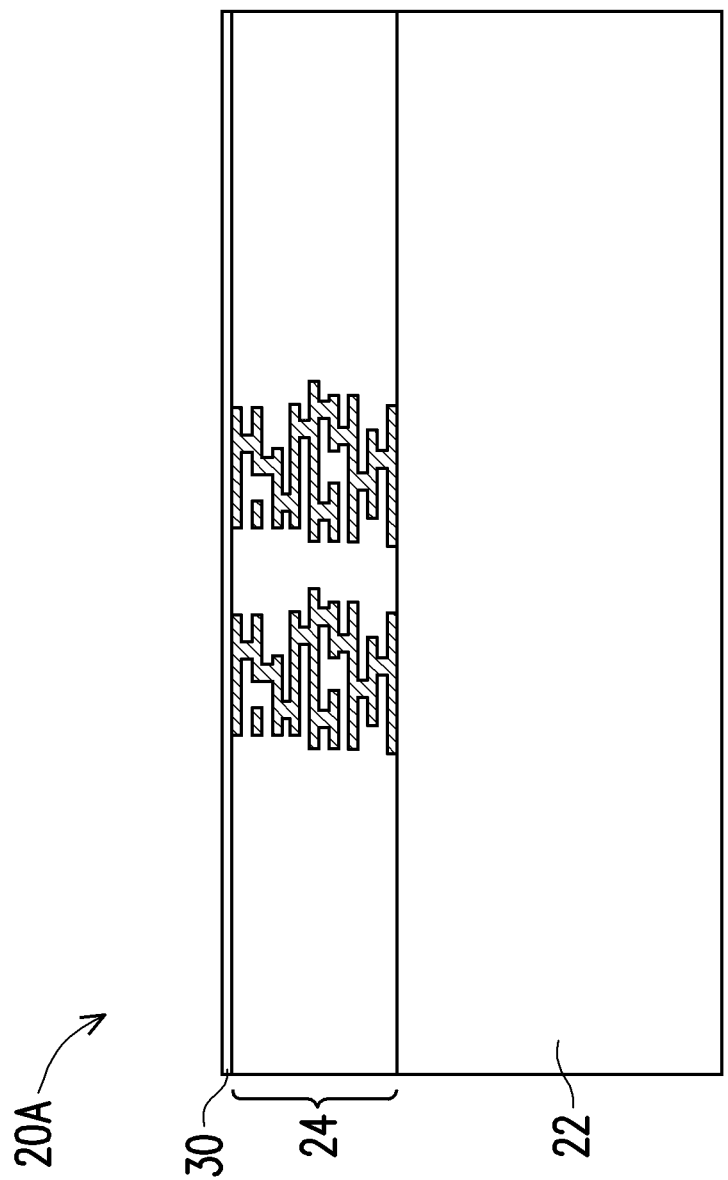

After forming the interconnect structure 24, as shown in FIG. 2, a chemical mechanical polishing (CMP) stop layer 30 is deposited over a top surface of the interconnect structure 24. The CMP stop layer 30 is used to prevent a subsequent CMP process from removing too much material by being resistant to the subsequent CMP process and/or by providing a detectable stopping point for the subsequent CMP process. In some embodiments, the CMP stop layer 30 may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, chemical vapor deposition (CVD), plasma-enhanced CVD (PECVD), atomic layer deposition (ALD), the like, or a combination thereof. In some embodiments, the CMP stop layer 30 has a thickness between about 20 nm and about 2000 nm.

Figure 3:
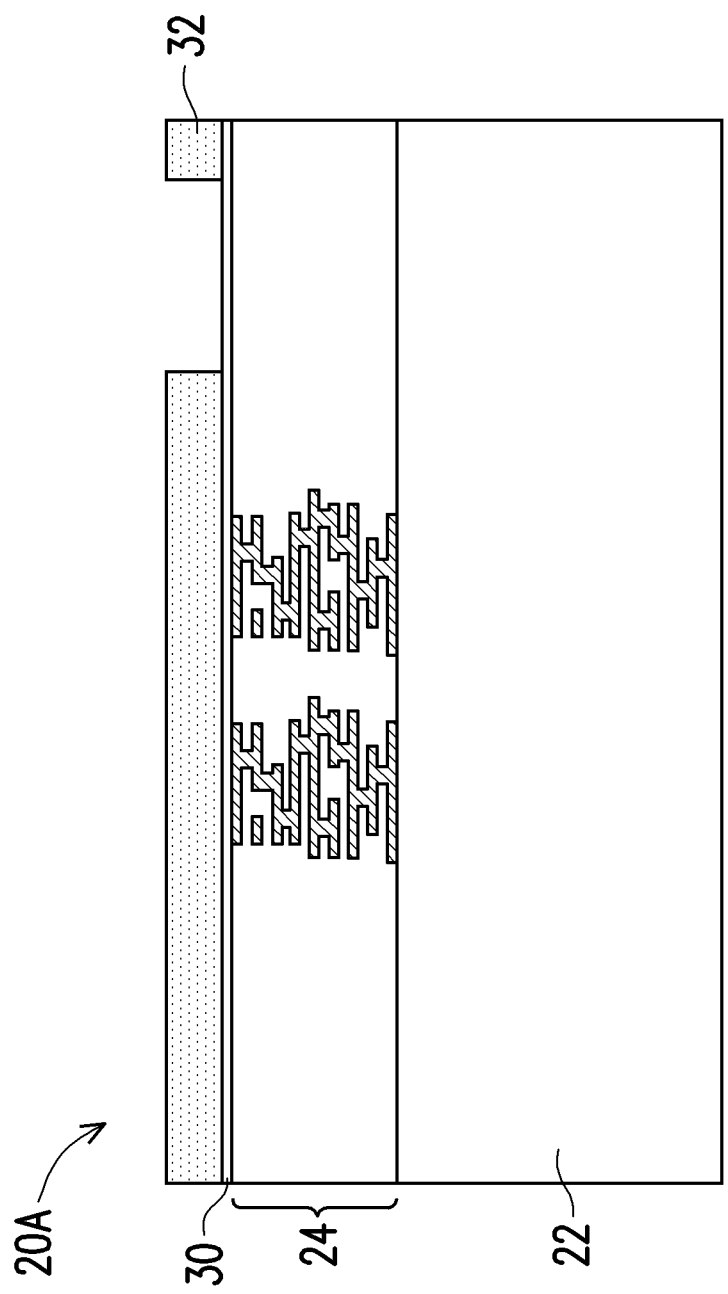
Figure 4:
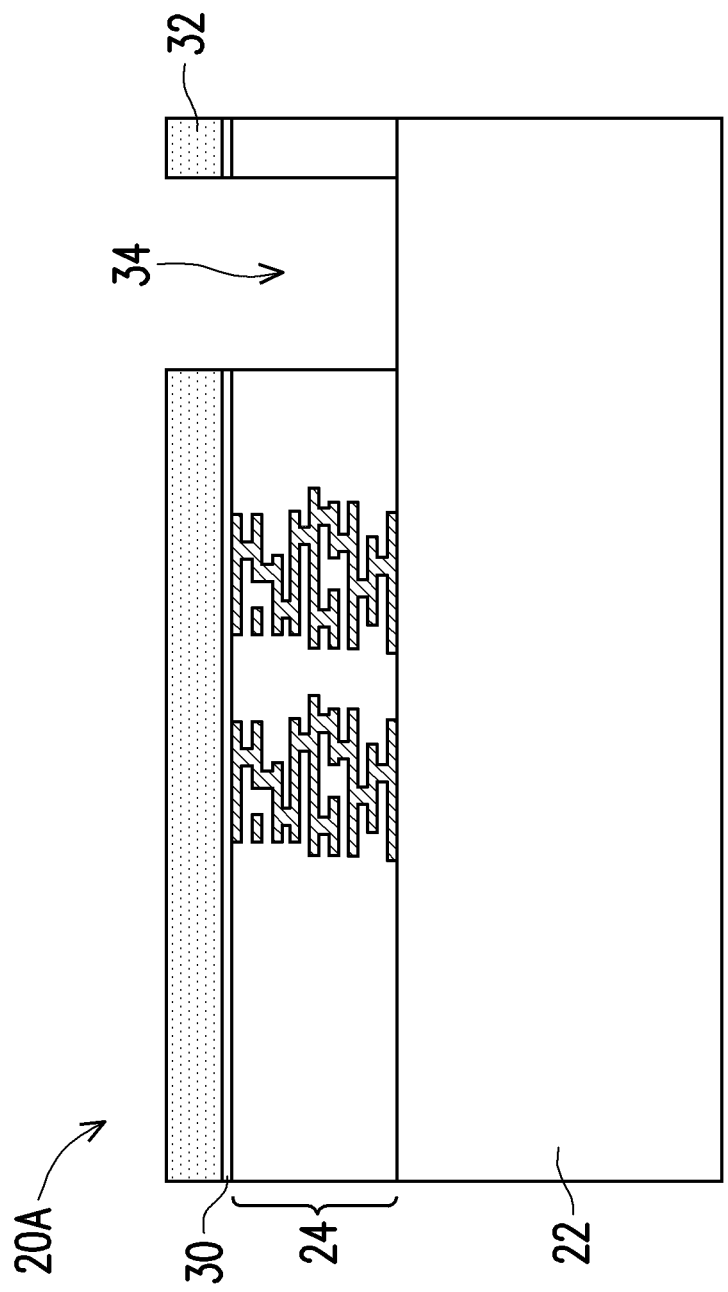

As illustrated in FIG. 3, a photoresist 32 is formed and patterned on the stop layer 30. The photoresist 32 may be formed by spin coating or the like and may be exposed to light for patterning. The pattern of the photoresist corresponds to an upper portion of the subsequently formed through substrate via (TSV) 64A (see, e.g., FIG. 13). The patterning forms at least one opening through the photoresist 32 to expose the stop layer 30.

Figure 5:
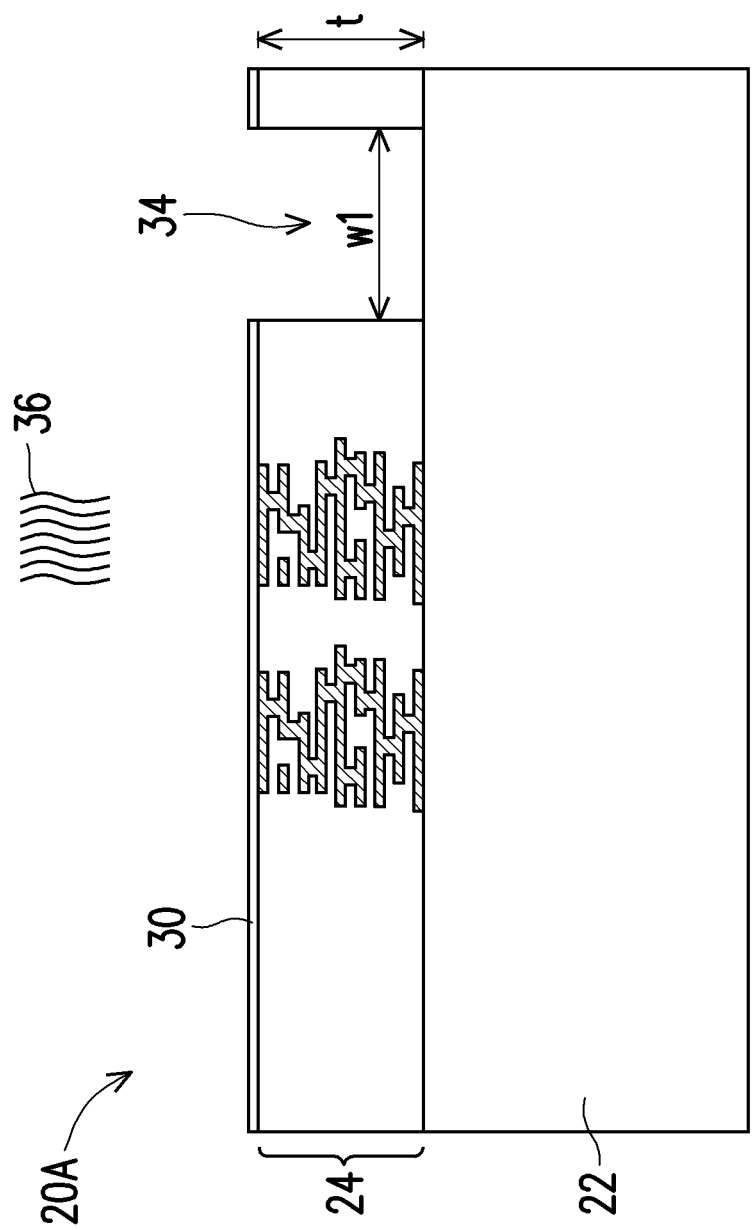

In FIG. 5, the remaining photoresist 32 acts as a mask during an etching process to remove the exposed portion of the stop layer 30 and underlying portions of the dielectric layer(s) of the interconnect structure 24 to expose the front surface of the substrate 22. A single etch process may be used to etch an opening 34 in the stop layer 30 and the interconnect structure 24 or a first etch process may be used to etch the stop layer 30 and a second etch process may be used to etch the dielectric layers of the interconnect structure 24. In some embodiments, the opening 34 is formed with a plasma dry etch process. The opening 34 exposes a top surface of the substrate 22. In some embodiments, the etch process(es) may any acceptable etching process, such as by wet or dry etching.

As illustrated in FIG. 5, after forming the opening 34, the photoresist 32 is removed. The photoresist 32 may be removed by an acceptable ashing or stripping process, such as using an oxygen plasma or the like. Once the photoresist 32 is removed, a baking process 36 (sometimes referred to as a thermal or heating process) is performed. The baking process 36 can help to remove moisture and liquid from the opening 34 that accumulated from the etching process for the opening 34 and the processing of the photoresist 32. The baking process 36 may be performed at a temperature of 150° C. to 450° C. for 1 to 30 minutes. In some embodiments, the baking process 36 uses a furnace or oven to heat the wafer. In some embodiments, the baking process 36 is a Rapid Thermal Anneal (RTA) or Rapid Thermal Processing (RTP) process. Following the baking process 36, the opening 34 may have a width w1 in a range from about 0.5 µm to about 5 µm and the thickness t of the interconnect structure 24 may be in a range from about 0.5 µm to about 5 µm.

Figure 6:
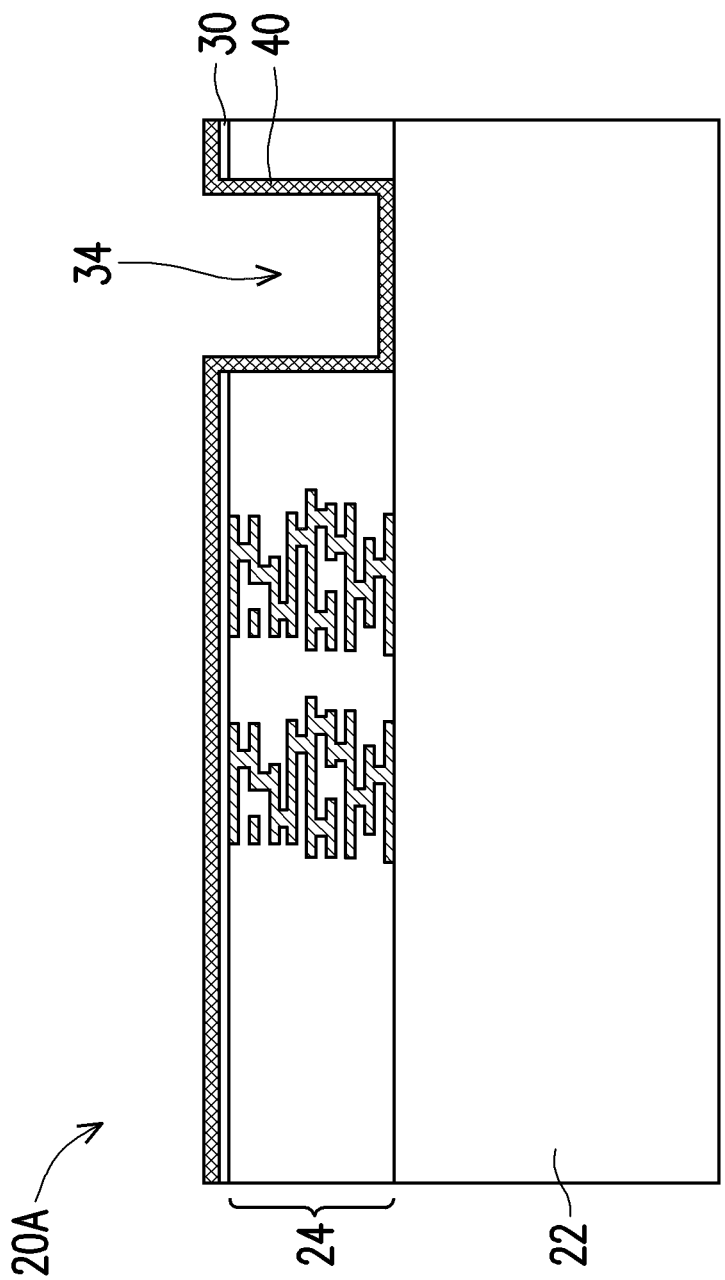

As illustrated in FIG. 6, after the baking process 36, a passivation layer 40 (sometimes referred to as a barrier layer 40) is conformally deposited on the stop layer 30 and on the bottom surface and the sidewalls of the opening 34. The passivation layer 40 can help to prevent the diffusion of the materials (such as water vapor and process byproduct) of the subsequently formed through substrate via 64A (see, e.g., FIG. 13) into the interconnect 24 during subsequent processing. In some embodiments, the interconnect 24 comprises low-k dielectric layers and copper metallization patterns, and the passivation layer prevents water vapor and process byproduct from penetrating into the interconnect 24 and causing interconnect corrosion. In some embodiments, the passivation layer 40 may comprise silicon nitride (SiN) the like and may, for example, have a dielectric constant of in a range from about 6.5 to about 8. The passivation layer 40 may be deposited conformally using a deposition process such as CVD, PECVD, ALD, plasma-enhanced ALD (PEALD) the like, or a combination thereof and may be formed The passivation layer 40 may be deposited to a thickness of about 0.05 µm to about 0.2 µm.

Figure 7:
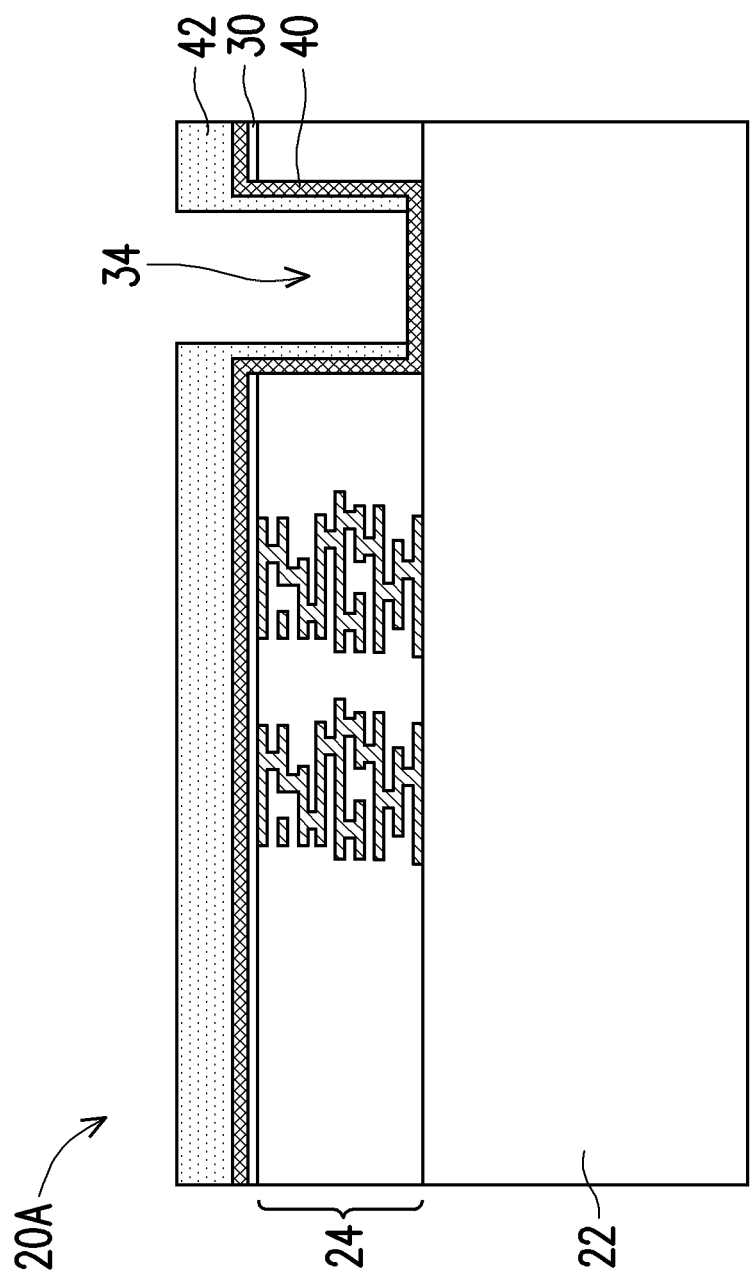

As illustrated in FIG. 7, a photoresist 42 is formed and patterned on the passivation layer 40. The photoresist 42 may be formed by spin coating or the like and may be exposed to light for patterning. The pattern of the photoresist corresponds to a lower portion of the subsequently formed TSV 64A (see, e.g., FIG. 13). The patterning forms at least one opening through the photoresist 42 to expose the passivation layer 40 at the bottom of the opening 34.

Figure 8:
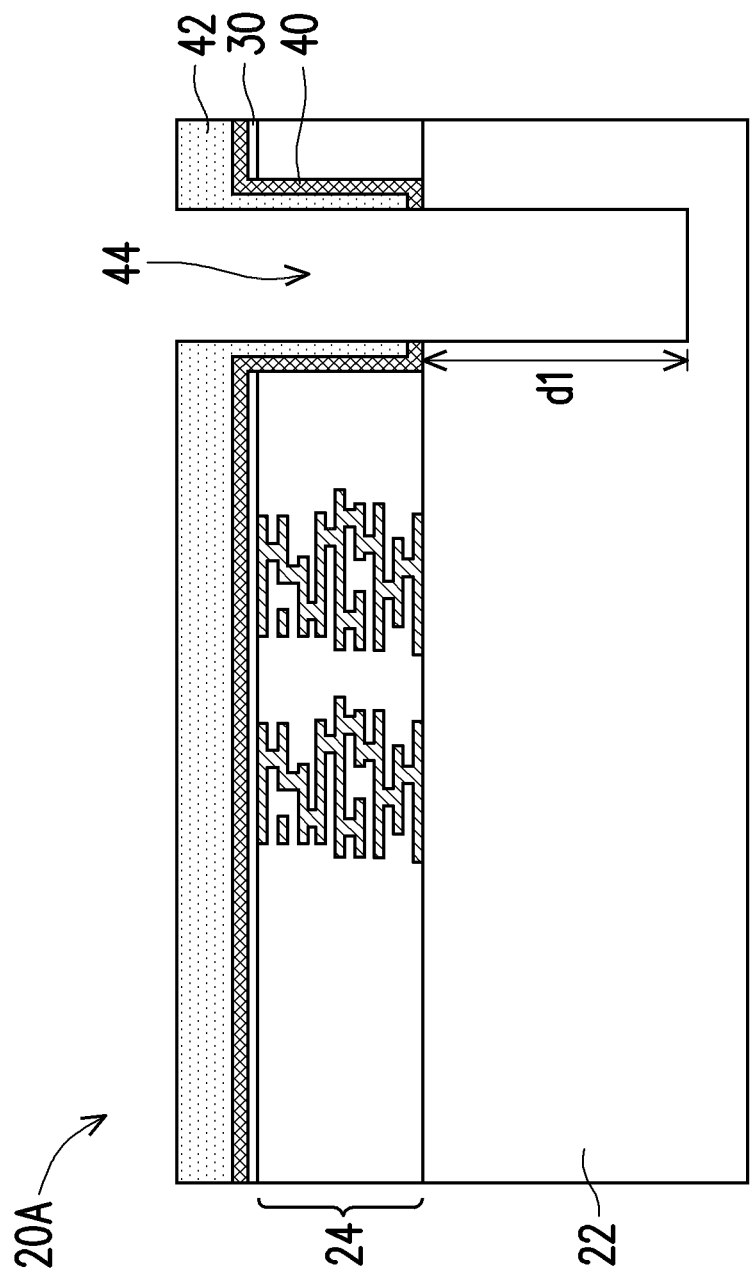

The remaining photoresist 42 acts as a mask during an etching process to remove the exposed portion of the passivation layer 40 and underlying portions of the substrate 22 as illustrated in FIG. 8. A single etch process may be used to etch an opening 44 in the exposed portion of the passivation layer 40 and the substrate 22 or a first etch process may be used to etch the passivation layer 40 and a second etch process may be used to etch the substrate 22. In some embodiments, the etch process is a reactive ion etch (RIE) process, such as a deep RIE (DRIE) process. In some embodiments, the DRIE process includes etch cycle(s) and passivation cycle(s) with the etch cycle(s) using, for example, $SF_6$, and the passivation cycle(s) using, for example, $C_4F_8$. The utilization of a DRIE process with the passivation cycle(s) and the etch cycle(s) enables a highly anisotropic etching process. In some embodiments, the etch process(es) may any acceptable etching process, such as by wet or dry etching. The opening 44 in the substrate 22 may have a depth d1 in a range from about 2 µm to about 20 µm.

Because the passivation layer 40 is covering the exposed sidewalls of the interconnect 24 in the opening 34 during the process to form the opening 44, any possible contamination from the etching process for the opening 44 is blocked from entering the interconnect 24. By blocking the contamination, damage to the metallization patterns of the interconnect layers by, for example, sulfur, used during the etching of the through substrate via is prevented.

Figure 9:
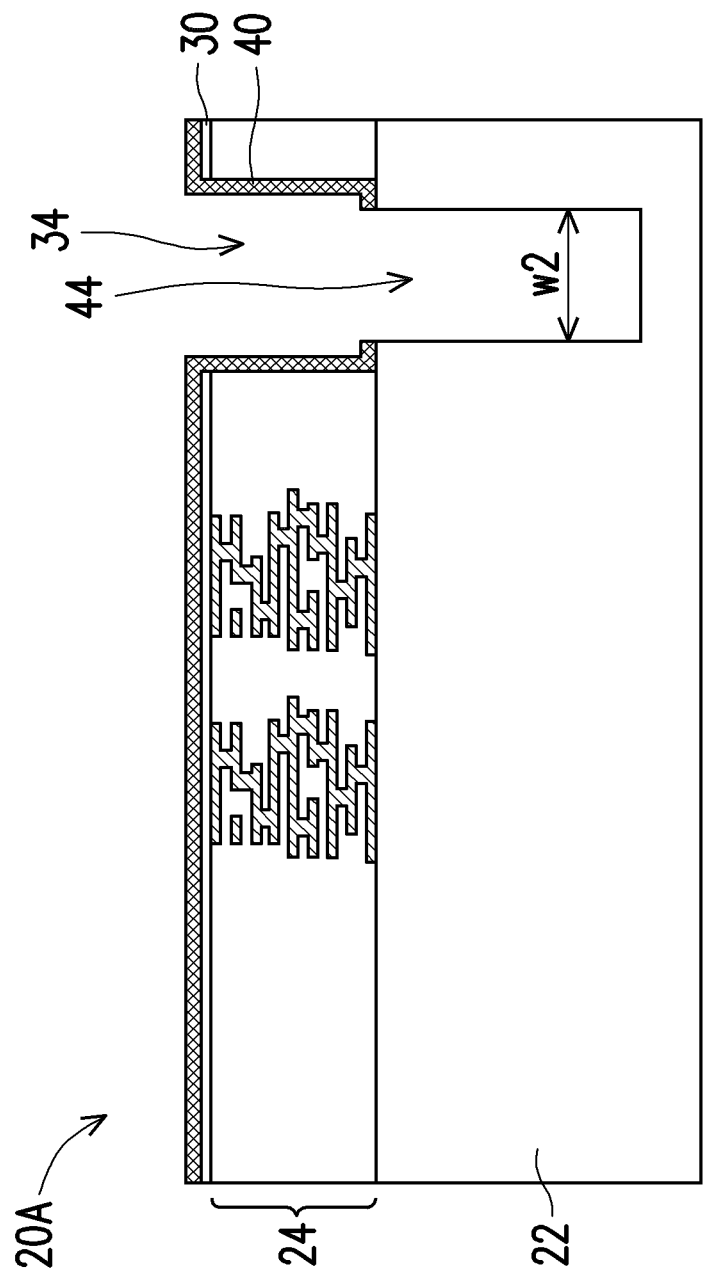

As illustrated in FIG. 9, after forming the opening 44, the photoresist 42 is removed. The photoresist 42 may be removed by an acceptable ashing or stripping process, such as using an oxygen plasma or the like. Following the removal of the photoresist 42, the opening 44 may have a width w2 that is less than the width w1 of the opening 34. In an embodiment, the width w2 is in a range from about 0.1 µm to about 4.5 µm.

Figure 10:
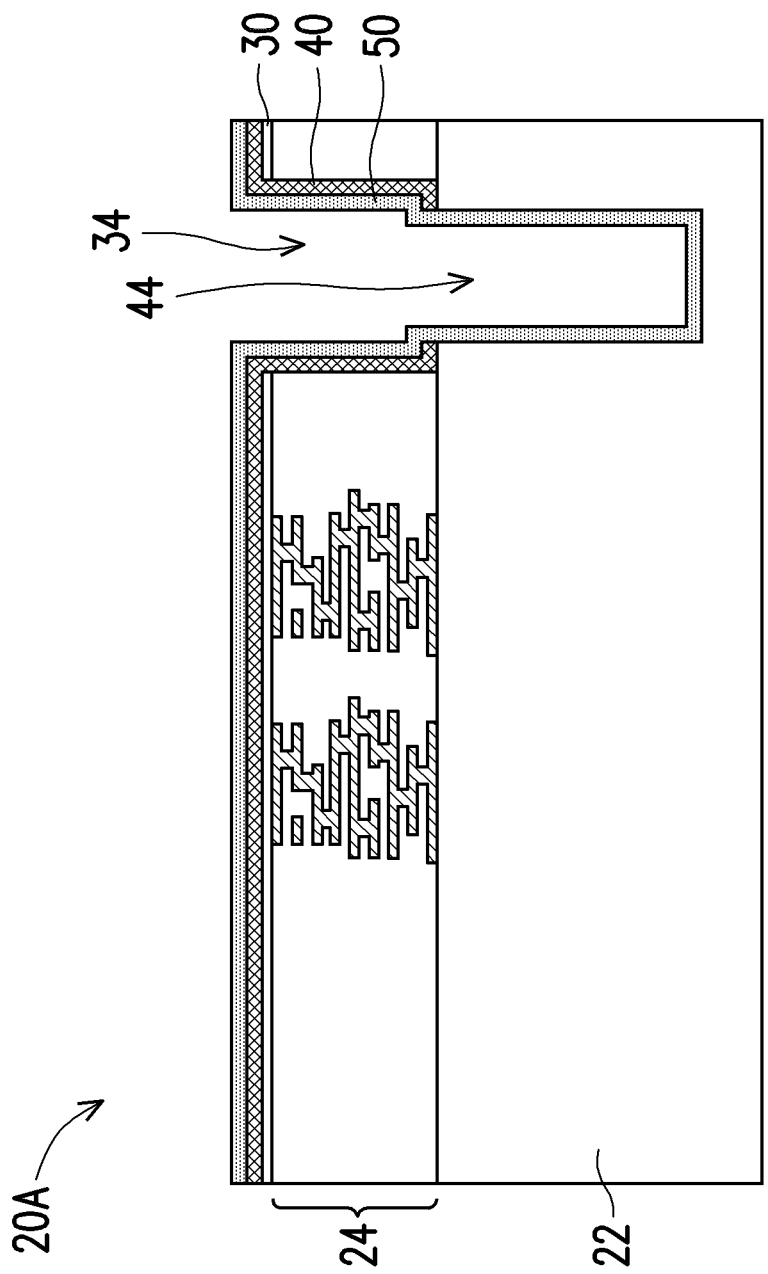

In FIG. 10, a liner layer 50 is conformally deposited on the passivation layer 40, including on the passivation layer 40 within the opening 34, and on the bottom surface and sidewalls of the opening 44. In some embodiments, the liner layer 50 includes one or more layers of dielectric materials and may be used to physically and electrically isolate the subsequently formed through vias from the substrate 22. Suitable dielectric materials may include oxides (such as silicon oxide, aluminum oxide, or the like), nitrides (such as SiN, or the like), oxynitrides (such as SiON, or the like), combinations thereof, or the like. The liner layer 50 may be formed using CVD, PECVD, ALD, the like, or a combination thereof. In some embodiments, the liner layer 50 has a thickness of about in a range from about 0.1 µm to about 1 µm.

Figure 11:
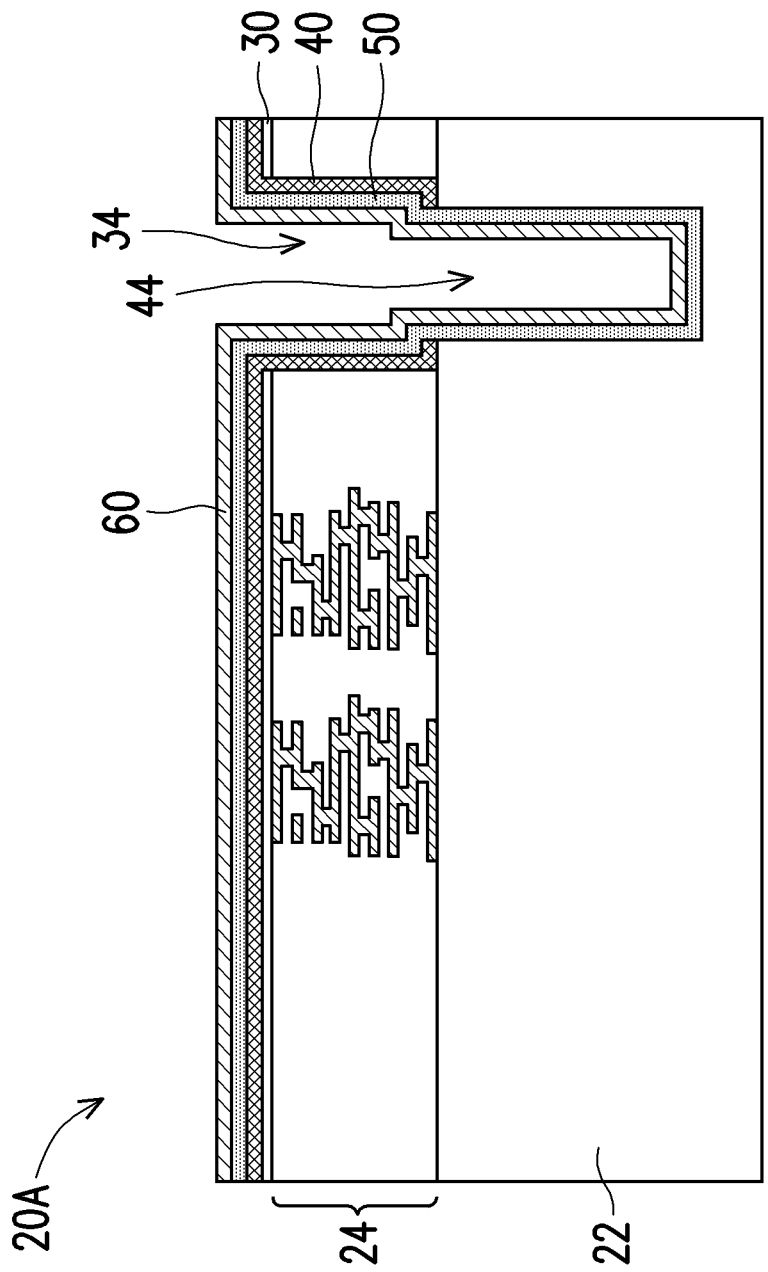

In a subsequent step, as shown in FIG. 11, a seed layer 60 is formed over liner layer 50. In some embodiments, the seed layer 60 is a metal layer, which may be a single layer or a composite layer comprising a plurality of sub-layers formed of different materials. In some embodiments, the seed layer 60 comprises a titanium layer and a copper layer over the titanium layer. The seed layer may be formed using, for example, physical vapor deposition (PVD) or the like. In some embodiments, a barrier layer (not shown) may be formed on the liner layer 50 prior to forming the seed layer 60. The barrier layer may comprise Ti and TiN, for example.

Figure 12:
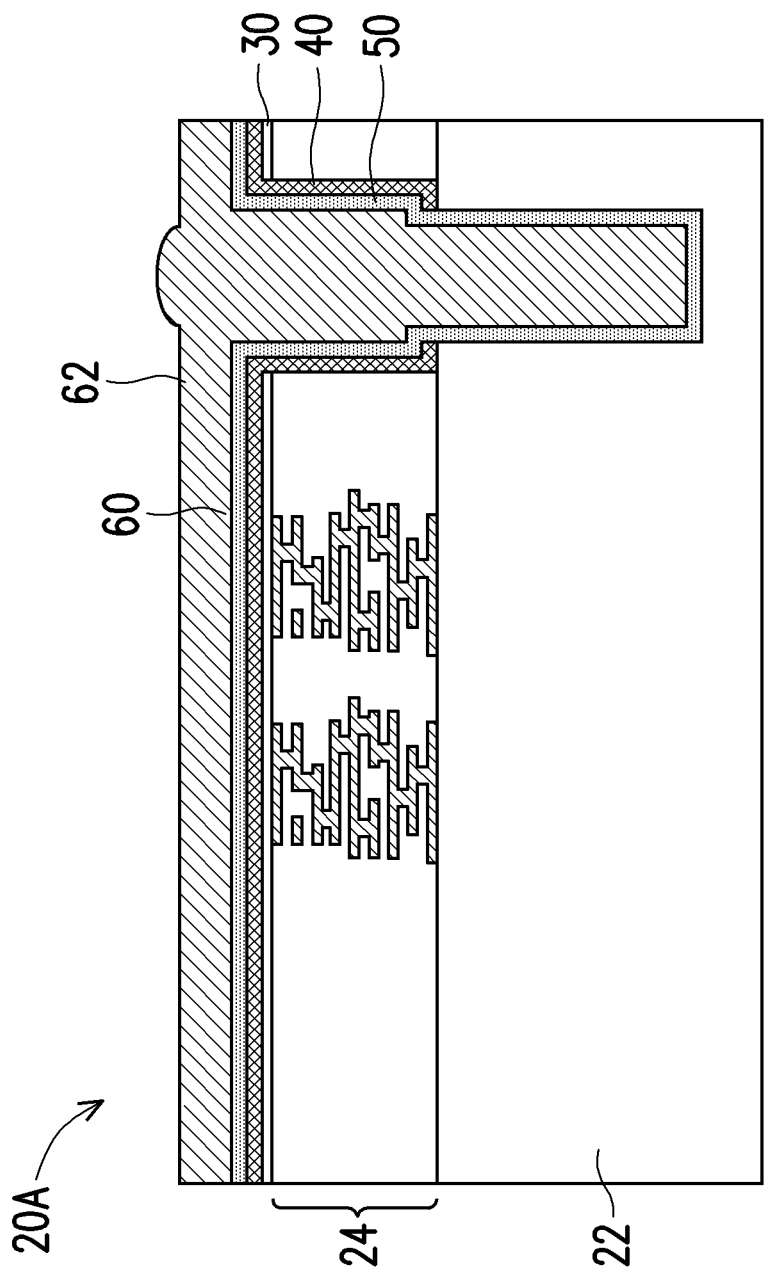

In FIG. 12, a conductive material 62 is formed on the seed layer 60 and fills the openings 34 and 44. The conductive material may be formed by plating, such as electroplating including electrochemical plating, electroless plating, or the like. The conductive material may comprise a metal, like copper, titanium, tungsten, aluminum, or the like.

After the conductive material 62 is formed, an anneal process is then performed. The anneal process may be performed a temperature between about 150° C. and about 450° C. for a duration between about 1 mins and about 60 min, so that the conductive material 62. The anneal process can prevent subsequent extrusion of the conductive material of the TSV 64A (sometime referred to as TSV pumping). The TSV pumping is caused by a coefficient of thermal expansion (CTE) mismatch between the conductive material 62 and the substrate 22 and can cause damage to structures (e.g., metallization patterns) over the TSV.

Figure 13:
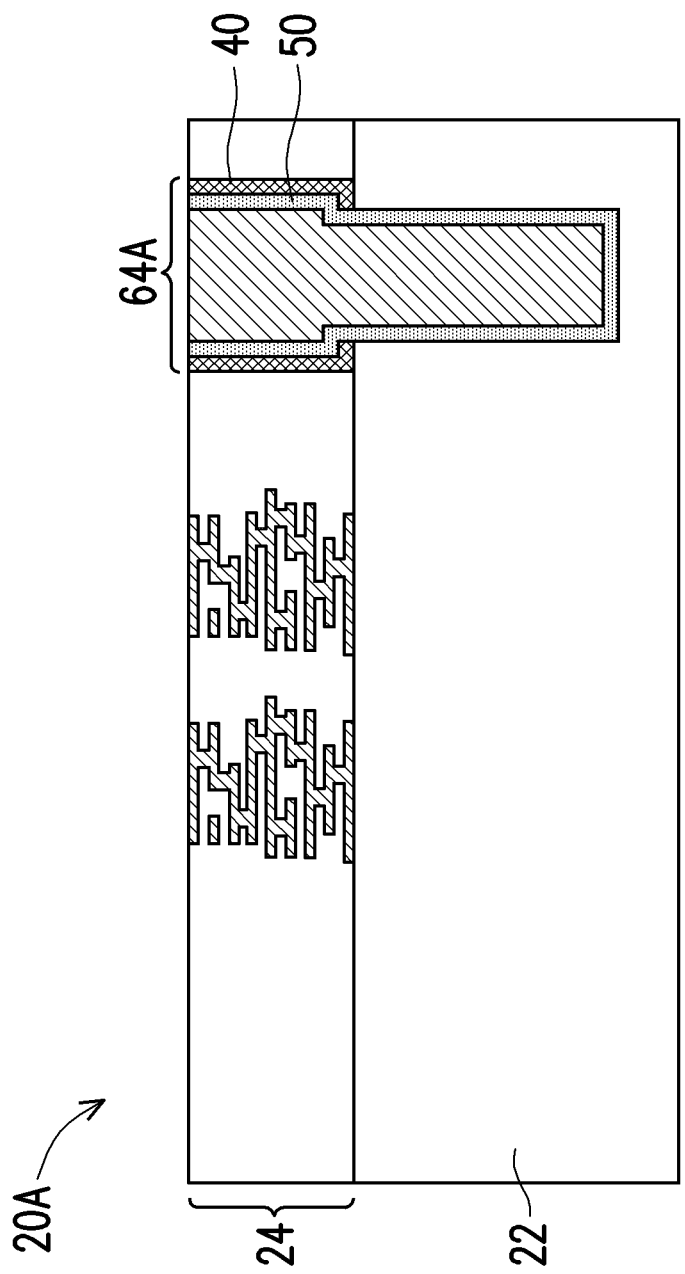

Following the anneal process, a planarization process is performed to remove portions of the conductive material 62, the seed layer 60, the liner layer 50, the passivation layer 40, and the stop layer 30 outside the openings 34 and 44 to form a TSV 64A as illustrated in FIG. 13. Top surfaces of the TSV 64A and the topmost dielectric layer of the interconnect structure 24 are substantially coplanar after the planarization process within process variations. The planarization process may be, for example, a chemical-mechanical polish (CMP), a grinding process, or the like. The upper portion of the TSV 64A (formed in the interconnect structure 24) has a greater width than the lower portion of the TSV 64A (formed in the substrate 22). Also as shown in FIG. 13, the passivation layer 40 has a cup shape with a hole (the hole caused by opening 44) in the bottom of the cup.

Figure 14:
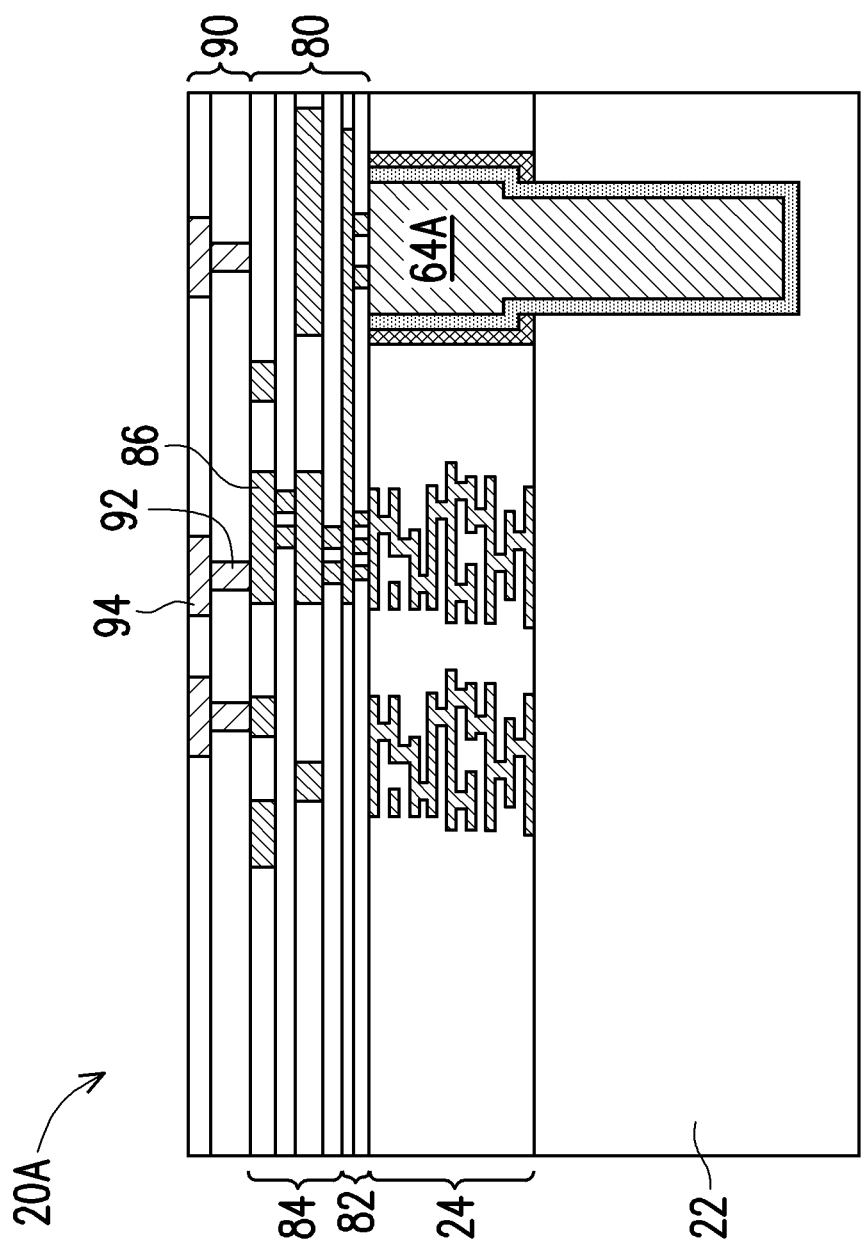

Referring to FIG. 14, an interconnect structure 80 is formed over the structure of FIG. 13. The interconnect structure 80 includes dielectric layers 82 and 84 and metallization patterns and vias 86. More or fewer dielectric layers and metallization patterns and vias may be formed than is shown in FIG. 14. The interconnect structure 80 is connected to the interconnect structure 24 and TSV 64A by metallization patterns and vias formed in the dielectric layer(s) 82. The metallization patterns and vias may be formed similar processes and materials as the interconnect structure 24 and the description is not repeated herein.

In some embodiments, the dielectric layers 82 are a same material as the dielectric layers of the interconnect structure 24, e.g., low-k dielectric. In other embodiments, the dielectric layers 82 are formed of a silicon-containing oxide (which may or may not include oxygen). For example, the dielectric layers 82 may include an oxide such as silicon oxide, a nitride such as silicon nitride, or the like. The dielectric layers 84 may be formed of a silicon-containing oxide.

The metallization patterns and vias 86 may be formed using be achieved using any suitable process, such as a single damascene process, a dual damascene process, a plating process, combinations thereof, or the like. An example of forming the metallization patterns and vias 86 by a damascene process includes etching dielectric layers 82 and 84 to form openings, depositing a conductive barrier layer into the openings, plating a metallic material such as copper or a copper alloy, and performing a planarization to remove the excess portions of the metallic material. In other embodiments, the formation of the dielectric layers 82 and 84 and the metallization patterns and vias 86 may include forming the dielectric layer 82 or 84, patterning the dielectric layer 82 or 84 to form openings, forming a metal seed layer (not shown), forming a patterned plating mask (such as a photoresist) to cover some portions of the metal seed layer, while leaving other portions exposed, plating the metallization patterns and vias 86, removing the plating mask, and etching undesirable portions of the metal seed layer.

FIG. 14 further illustrates dielectric layers 90 formed on the interconnect structure 80. Although FIG. 14 illustrates two dielectric layers 90, more or fewer than two dielectric layers 90 may be formed. Bond pad vias 92 and bond pads 94 are formed in the dielectric layers 90. The Bond pad vias 92 and bond pads 94 may be formed using be achieved using any suitable process, such as a single damascene process, a dual damascene process, a plating process, combinations thereof, or the like. The top surfaces of the bond pads 94 are coplanar with the top surface of the uppermost dielectric layer 90. The planarization is achieved through a CMP process or a mechanical grinding process. The bond pads 94 may be formed of or comprise copper, for example.

Figure 15:
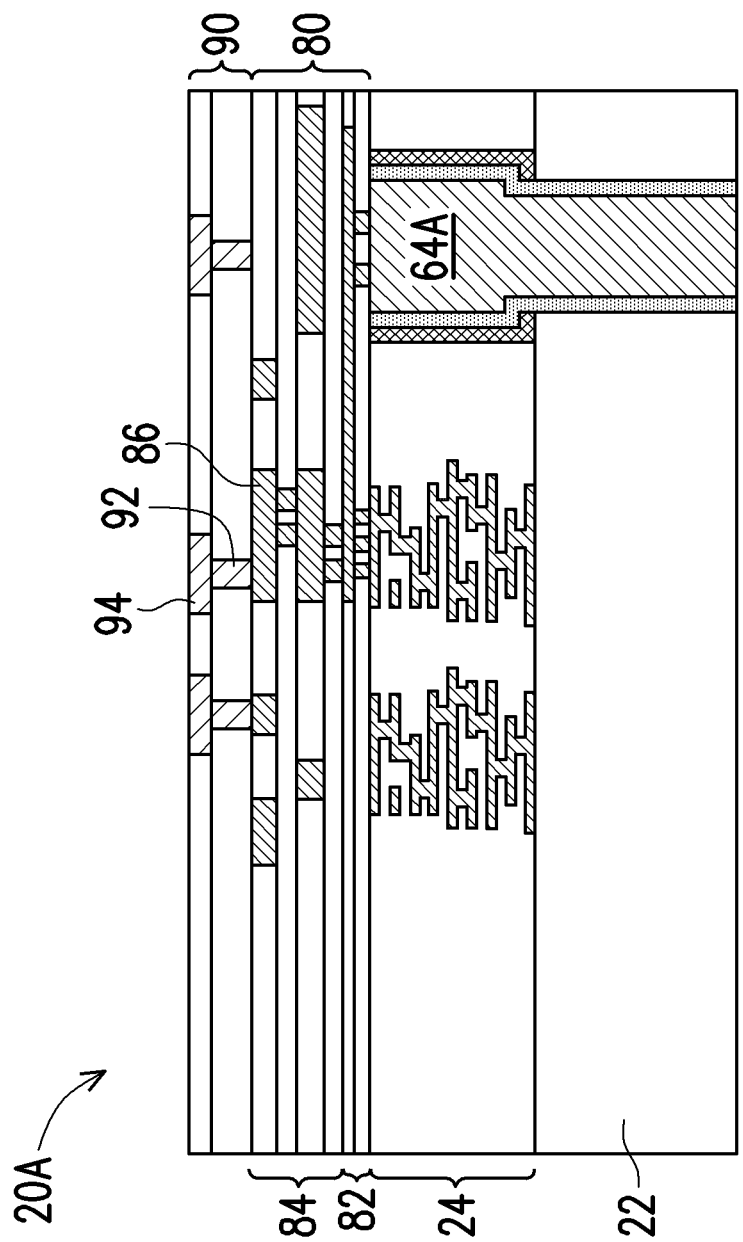

In accordance with some embodiments, as shown in FIG. 15, the integrated circuit die 20A is thinned by thinning the substrate 22 before the subsequent singulation process. The thinning may be performed through a planarization process such as a mechanical grinding process or a CMP process. The thinning process exposes the TSV 64A. After thinning, the through via 64A provides electrical connection from a back side of the substrate 22 to a front side of the substrate 22 (e.g., the interconnects 24/80/90).

Figure 16:
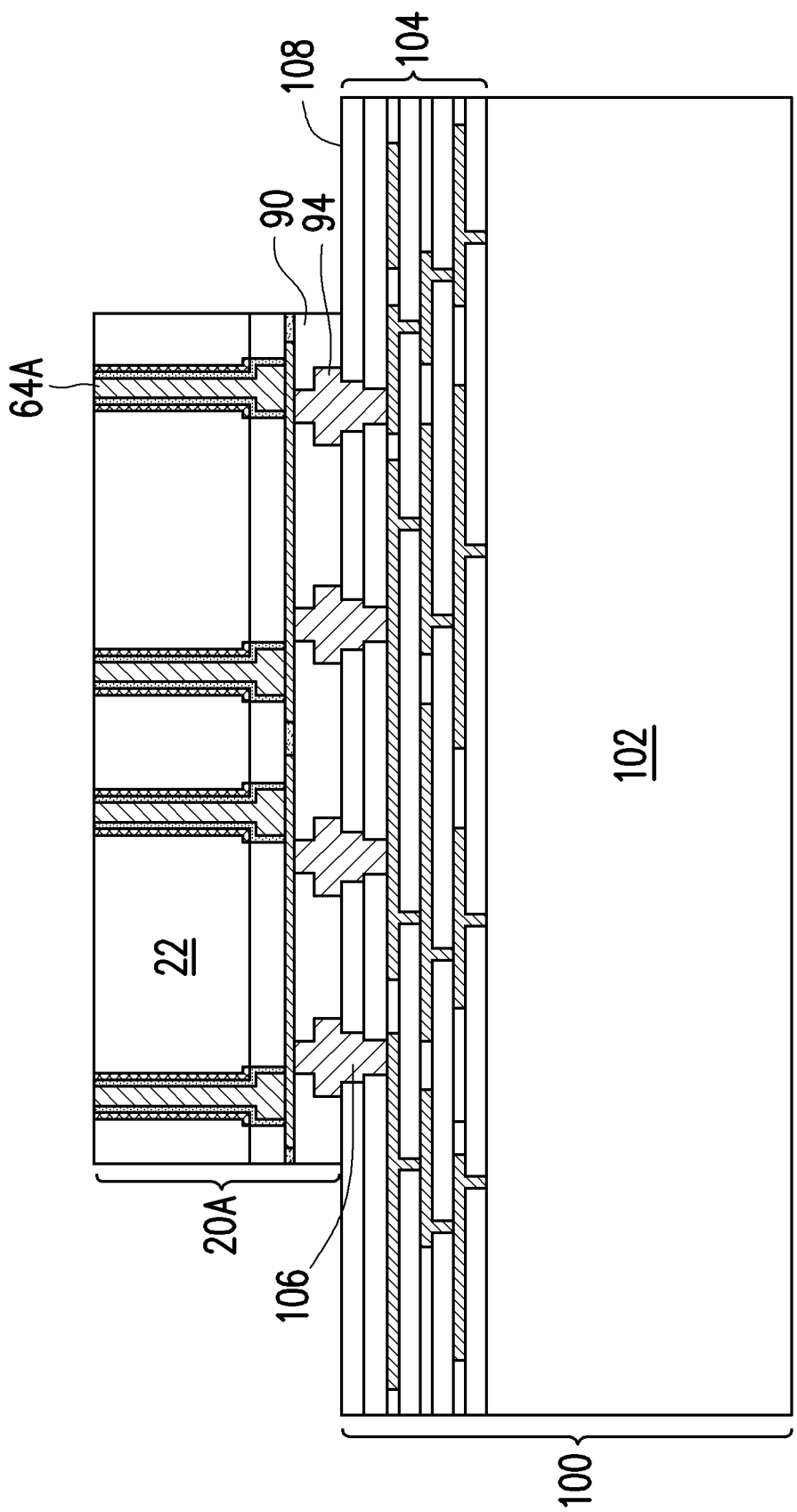

Referring to FIG. 16, the integrated circuit die 20A is bonded to a package structure 100. The bonding of the integrated circuit die 20A to the package structure 100 may be achieved through hybrid bonding, in which both metal-to-metal direct bonding (between the bond pads 94 and 106) and dielectric-to-dielectric bonding (such as Si—O—Si bonding between surface dielectric layers of the integrated circuit die 20A and the package structure 100) are formed. Furthermore, there may be a single integrated circuit die 20A or a plurality of dies 20A bonded to the same package structure 100. The plurality of dies 20A bonded to the same package structure 100 may be identical to, or different from, each other to form a homogenous or a heterogeneous structure.

The package structure 100 includes a substrate 102, similar to the substrate 22 of the integrated circuit die 20A, and an interconnect structure 104 including bond pads 106. The interconnect structure 104 and the bond pads 106 may be similar to the interconnect structures 24/80/90 and bond pads 94, respectively, described above and the descriptions are not repeated herein. The interconnect structure 104 may be formed by, for example, metallization patterns in dielectric layers on the ILD. The metallization patterns include metal lines and vias formed in one or more low-k dielectric layers. The metallization patterns may be formed using any suitable process, such as a single damascene process, a dual damascene process, a plating process, combinations thereof, or the like. An example of forming the metallization patterns by a damascene process includes etching the dielectric layers to form openings, depositing a conductive barrier layer into the openings, plating a metallic material such as copper or a copper alloy, and performing a planarization to remove the excess portions of the metallic material.

The die 20A is disposed face down such that the front sides of the die 20A face the package structure 100 and the back sides of the dies 20A face away from the package structure 100. The die 20A is bonded to the package structure 100 at an interface 108. As illustrated by FIG. 16, the hybrid bonding process directly bonds the topmost dielectric layer of the interconnect 104 of the package structure 100 to the topmost dielectric layer 90 of the die 20A at the interface 108 through fusion bonding. In an embodiment, the bond between the topmost dielectric layer of the interconnect 104 and the topmost dielectric layer 90 of the die 20A may be an oxide-to-oxide bond. The hybrid bonding process further directly bonds the bond pads 94 of the die 20A to the bond pads 106 of the package structure 100 at the interface 108 through direct metal-to-metal bonding. Thus, electrical connection can between the die 20A and the package structure 100 is provided by the physical connection of the bond pads 94 to the bond pads 106.

As an example, the hybrid bonding process starts with aligning the die 20A with the package structure 100, for example, by aligning the bond pads 94 to the bond pads 106. When the die 20A and the package structure 100 are aligned, the bond pads 94 may overlap with the corresponding bond pads 106. Next, the hybrid bonding includes a pre-bonding step, during which the die 20A is put in contact with the package structure 100. The hybrid bonding process continues with performing an anneal, for example, at a temperature between about 150° C. and about 400° C. for a duration between about 0.5 hours and about 3 hours, so that the copper in the bond pads 94 and the bond pads 106 interdiffuses to each other, and hence the direct metal-to-metal bonding is formed.

Figure 17:
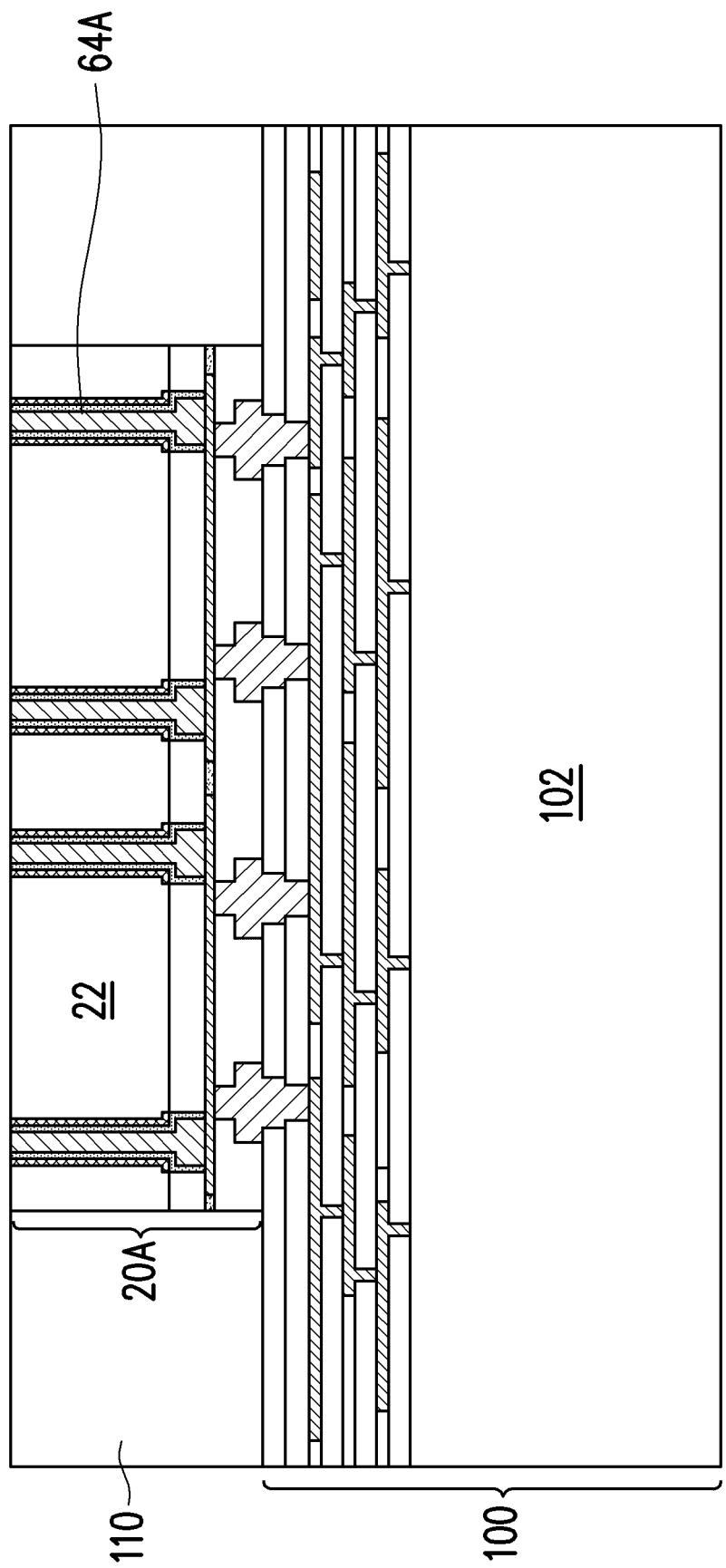

Next, as shown in FIG. 17, a gap-filling process is performed to encapsulate the integrated circuit die 20A in an encapsulant 110. After formation, the encapsulant 110 encapsulates the integrated circuit die 20A, the interconnect structure 80, and the dielectric layers 90. The encapsulant 110 may comprise an oxide. Alternatively, the encapsulant may be a molding compound, a molding underfill, a resin, an epoxy, or the like. The encapsulant 110 may be applied by compression molding, transfer molding, or the like, and may be applied in liquid or semi-liquid form and then subsequently cured. After the encapsulant 110 is deposited, a planarization process is performed to level a back-side surface of the integrated circuit die 20A with the top surface of the encapsulant 110 and to expose the TSVs 64A. Surfaces of the TSVs 64A, the substrate 22, and the encapsulant 110 are substantially coplanar after the planarization process within process variations. The planarization process may be, for example, a chemical-mechanical polish (CMP), a grinding process, or the like. In some embodiments, the planarization may be omitted, for example, if the TSVs 64A are already exposed.

Figure 18:
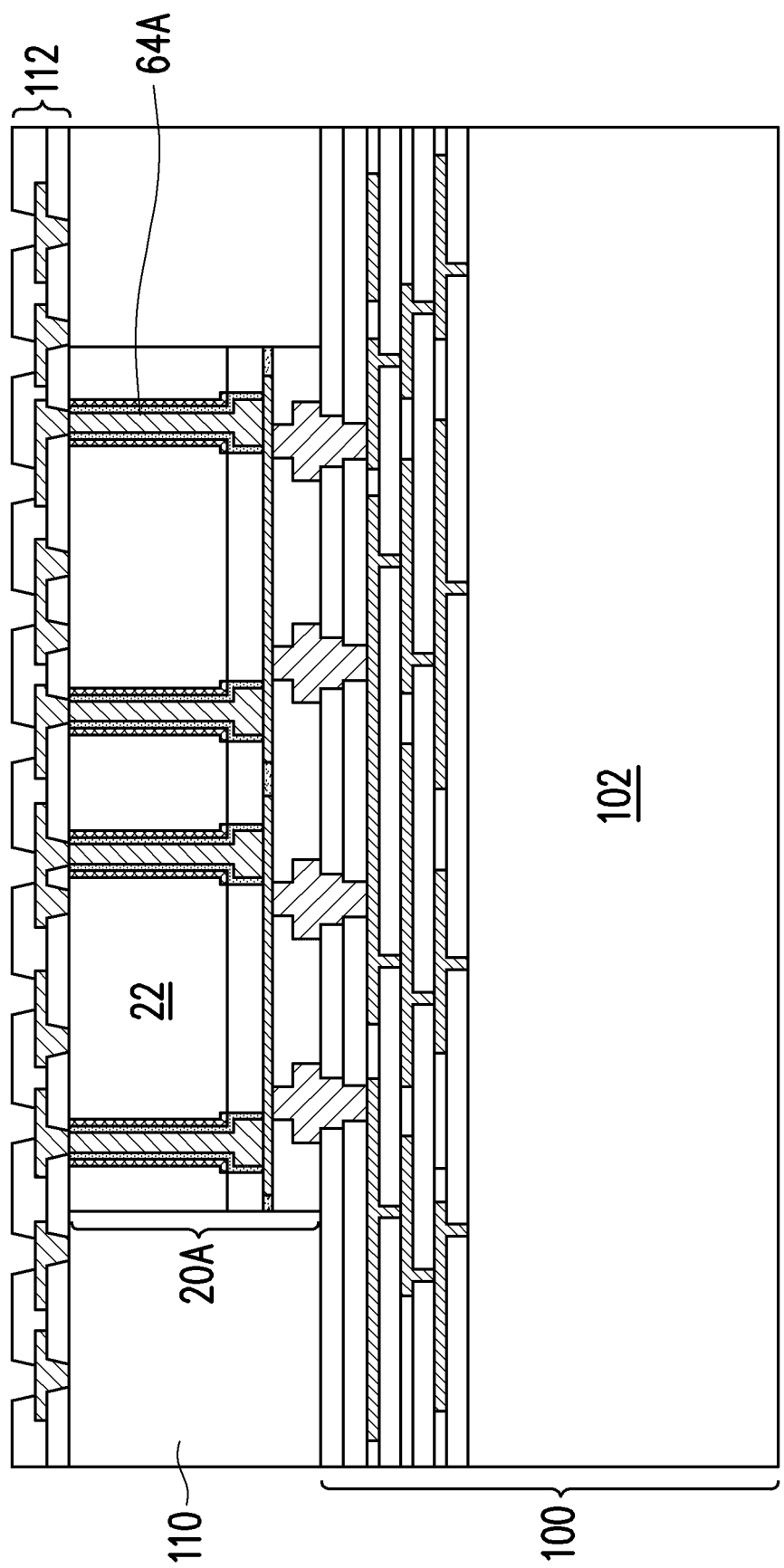

In FIG. 18, a redistribution structure 112 is deposited on the encapsulant 110, the TSVs 64A, and the integrated circuit die 20A. The redistribution structure 112 may include redistribution lines (RDLs), such as metal traces (or metal lines), and vias underlying and connected to the metal traces. The redistribution lines of the redistribution structure 112 are physically and electrically connected to the TSVs 64A of the die 20A.

In accordance with some embodiments of the present disclosure, the RDLs are formed through plating processes, wherein each of the RDLs includes a seed layer (not shown) and a plated metallic material over the seed layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the RDLs. The patterning forms openings through the photoresist to expose the seed layer. A conductive material is formed in the openings of the photoresist and on the exposed portions of the seed layer. The conductive material may be formed by plating, such as electroplating or electroless plating, or the like. The seed layer and the plated metallic material may be formed of the same material or different materials. The conductive material may be a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet and/or dry etching. The remaining portions of the seed layer and conductive material form the RDLs.

Dielectric or passivation layers may be formed over each layer of the metal traces. In some embodiments, the dielectric or passivation layers are formed of a polymer, which may be a photo-sensitive material such as PBO, polyimide, BCB, or the like, that may be patterned using a lithography mask. In other embodiments, the dielectric or passivation layers are formed of a nitride such as silicon nitride; an oxide such as silicon oxide, PSG, BSG, BPSG; or the like. The dielectric or passivation layers may be formed by spin coating, lamination, CVD, the like, or a combination thereof.

Openings may be formed in the top dielectric or passivation layer with a patterning process, exposing some or all of the top metal layer of the redistribution structure 112. The patterning process may be an acceptable process, such as by exposing the dielectric or passivation layer to light when the dielectric layer is a photo-sensitive material or by etching using, for example, an anisotropic etch.

Figure 19:
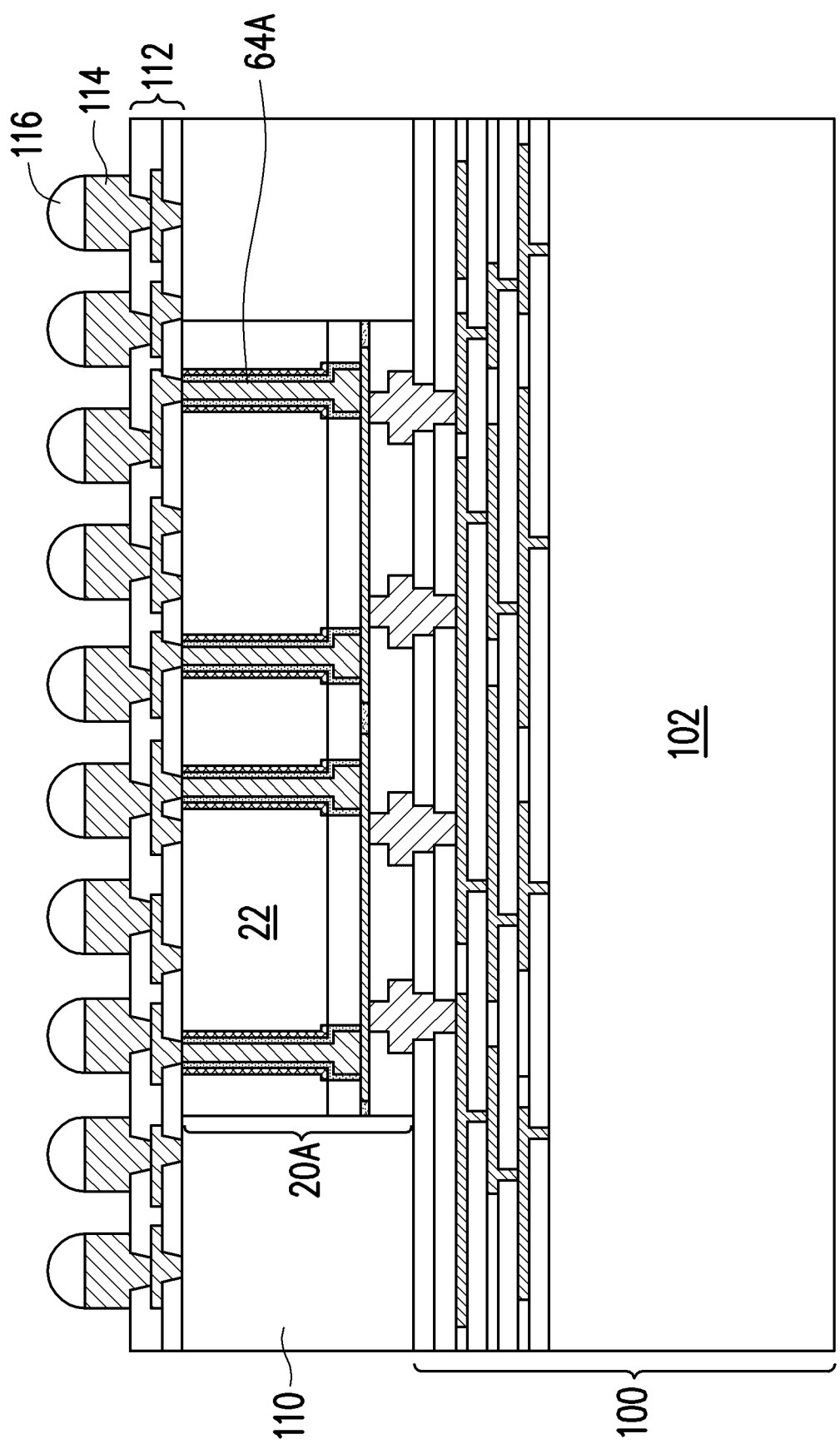

As shown in FIG. 19, bumps 114 are formed through the openings in the dielectric layers of the redistribution structure 112 to contact metallization patterns in the redistribution structure 112. The bumps 114 may be metal pillars, controlled collapse chip connection (C4) bumps, micro bumps, electroless nickel-electroless palladium-immersion gold technique (ENEPIG) formed bumps, ball grid array (BGA) bumps, or the like. In an embodiment, the bumps 114 are C4 bumps. The bumps 114 may be formed by sputtering, printing, electro plating, electroless plating, CVD, or the like. The bumps 114 may be solder free and have substantially vertical sidewalls. In some embodiments, a metal cap layer (not shown) is formed on the top of the bumps 114. The metal cap layer may include nickel, tin, tin-lead, gold, silver, palladium, indium, nickel-palladium-gold, nickel-gold, the like, or a combination thereof and may be formed by a plating process.

Further shown in FIG. 19, conductive connectors 116 are formed on the bumps 114. The conductive connectors 116 may be formed from a conductive material such as solder, copper, aluminum, gold, nickel, silver, palladium, tin, the like, or a combination thereof. In some embodiments, the conductive connectors 116 are formed by initially forming a layer of solder through methods such as evaporation, electroplating, printing, solder transfer, ball placement, or the like. Once a layer of solder has been formed on the structure, a reflow may be performed in order to shape the conductive connectors 116 into desired bump shapes.

The embodiment depicted in FIG. 19 is a chip-on-wafer structure bonded in a face-to-face configuration. Alternatively, the integrated circuit die 20A and the package structure 100 may be bonded in a face-to-back configuration. For example, the back of the die 20A (e.g., exposed ends of the TSVs 64A and substrate 22) could be bonded to the face of the package structure 100.

Figure 20:
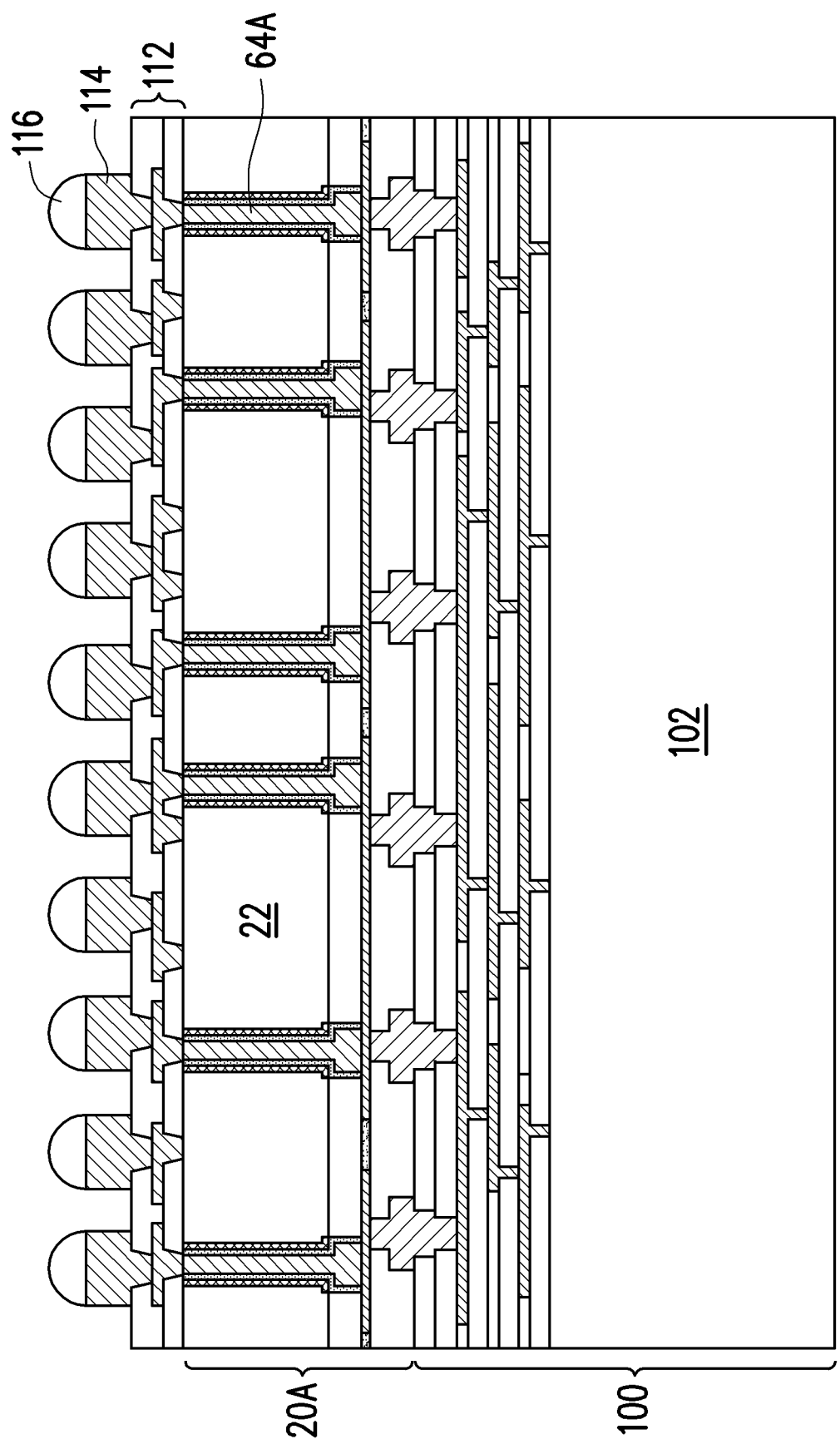
FIG. 20 illustrates a cross-sectional view of an intermediate stage in the formation of a multi-stack die package, according to another embodiment.

FIG. 20 illustrates a cross-sectional view of a wafer-on-wafer structure in accordance with some embodiments. This embodiment is similar to the embodiment illustrated in FIGS. 1 through 19 except that this embodiment is a wafer-on-wafer structure instead of a chip-on-wafer structure. Details regarding this embodiment that are similar to those for the previously described embodiment will not be repeated herein.

In FIG. 20, the structure is a wafer-on-wafer structure bonded in a face-to-face configuration in which the upper structure is a wafer 20A. The wafer 20A is formed similar to the die 20A described above and the description is not repeated herein. With this embodiment, the steps of singulating the die 20A and the formation of the encapsulant 110 in the previous embodiment are no longer needed and those steps can be omitted from this embodiment. In this embodiment, the wafer 20A and the package structure 100 are both wafers and are a same size.

In other embodiments, the wafer 20A may be bonded to the package structure 100 in a face-to-back configuration. For example, the back of the wafer 20A (e.g., exposed ends of the TSVs 64A and substrate 22) could be bonded to the face of the package structure 100.

FIGS. 21 through 25 illustrate cross-sectional views of intermediate stages in the formation of a multi-stack die package, according to an embodiment. This embodiment is similar to the embodiment illustrated in FIGS. 1 through 19 except that in this embodiment the TSV 64B is formed after the interconnect 80 (e.g., a TSV-last process) instead of before the interconnect 80 as in the embodiment of FIGS. 1 through 19 (e.g., a TSV-middle process). Details regarding this embodiment that are similar to those for the previously described embodiments will not be repeated herein.

Figure 21:
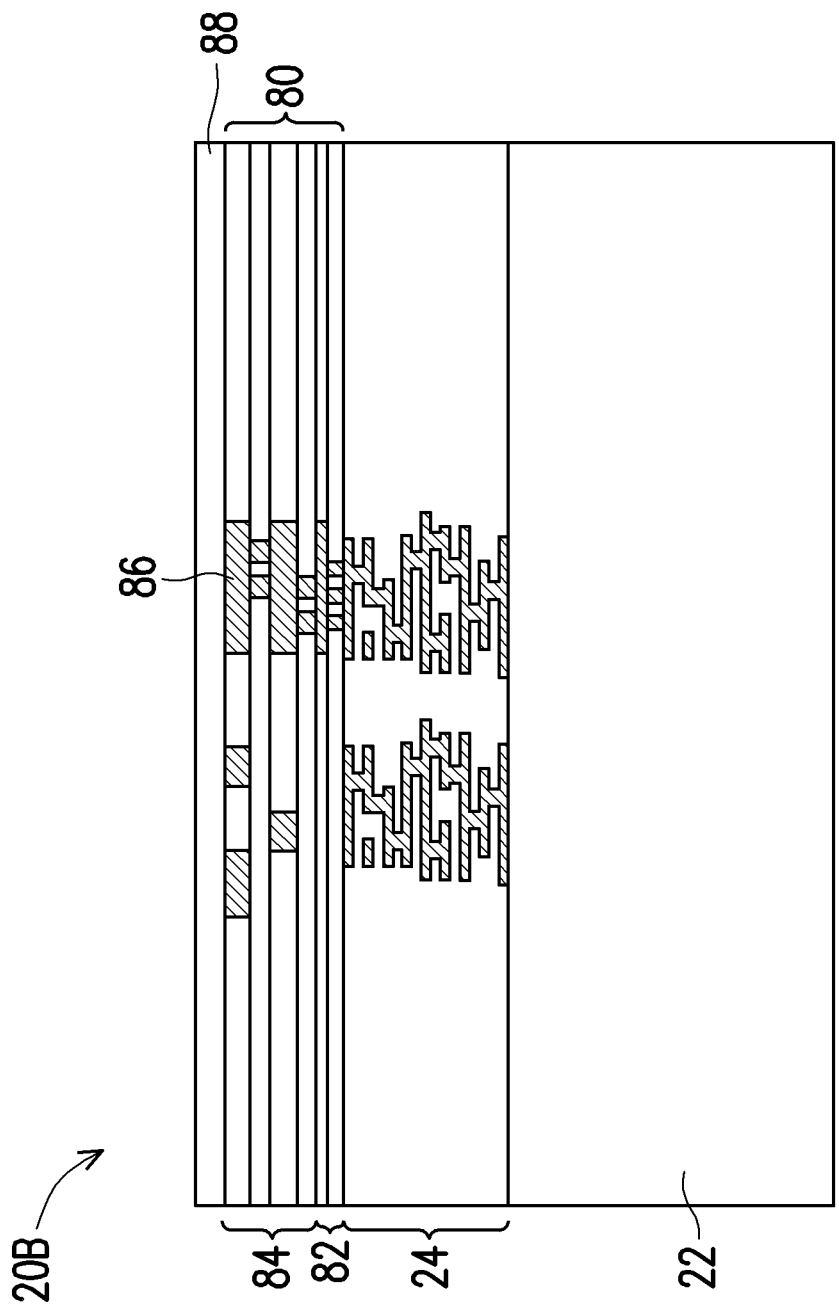
FIGS. 21 through 25 illustrate cross-sectional views of intermediate stages in the formation of a multi-stack die package, according to an embodiment.

FIG. 21 illustrates a cross-sectional view of an integrated circuit die 20B in accordance with some embodiments. The integrated circuit die 20B may be formed by similar processes and materials as the integrated circuit die 20A described above the description is not repeated herein.

A passivation layer 88 is formed over the interconnect structure 80. The passivation layer 88 may be formed of a silicon-containing oxide. For example, the passivation layer 88 may include an oxide such as silicon oxide, a nitride such as silicon nitride, or the like.

Figure 22:
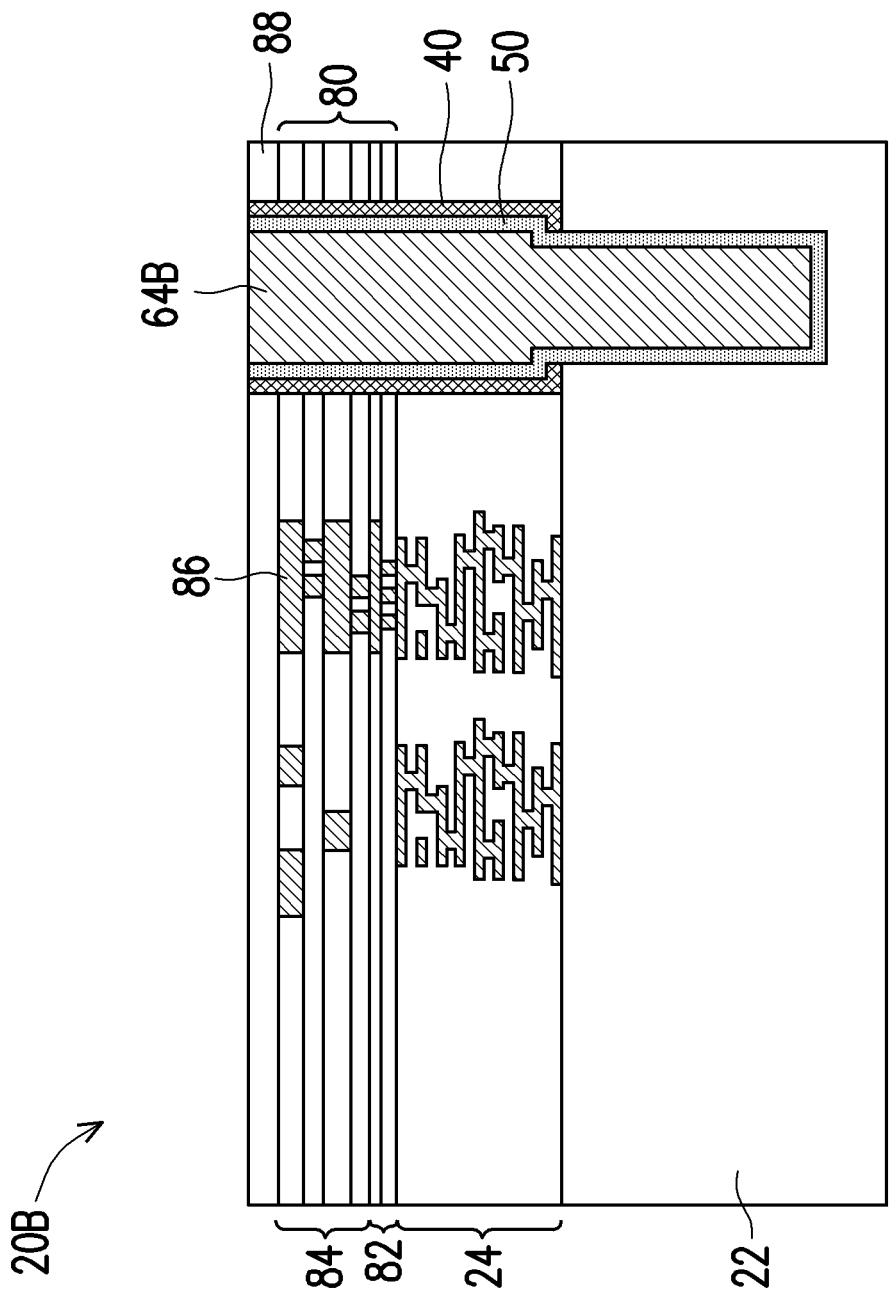

In FIG. 22, after forming the passivation layer 88, a TSV 64B is formed through the passivation layer 88, the interconnects 80 and 24, and at least partially into the substrate 22. The TSV 64B may be formed by similar processes and materials as the TSV 64A described above the description is not repeated herein.

One of the final steps of forming the TSV 64B is a planarization process (similar to that described above in reference to TSV 64A) to remove portions of the conductive material 62, the seed layer 60, the liner layer 50, the passivation layer 40, and the stop layer 30 outside the opening 34. Top surfaces of the TSV 64B and the passivation layer 88 are substantially coplanar after the planarization process within process variations. The planarization process may be, for example, a chemical-mechanical polish (CMP), a grinding process, or the like. The upper portion of the TSV 64B has a greater width than the lower portion of the TSV 64B (formed in the substrate 22). Also as shown in FIG. 22, the passivation layer 40 has a cup shape with a bottom hole.

Figure 23:
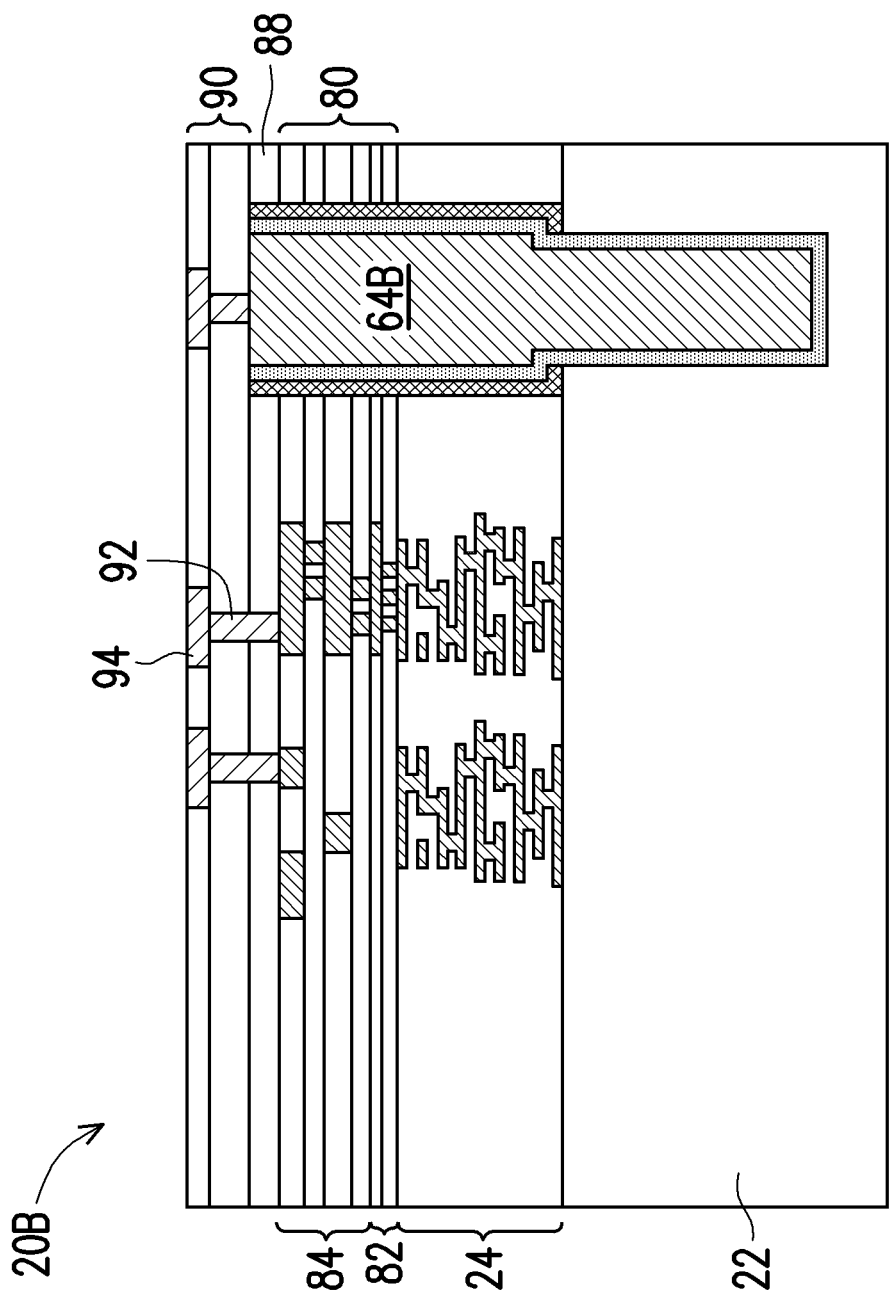

FIG. 23 illustrates dielectric layers 90, bond pad vias 92, and bond pads 94 formed on the passivation layer 88 and the TSV 64B. These structures were previously described, and the descriptions are not repeated herein. In this embodiment, one or more of the bond pad vias 92 may be in physical and electrical contact with the TSV 64B while other bond pad vias 92 may be with be in physical and electrical contact with the metallization patterns of the interconnect 80.

Figure 24:
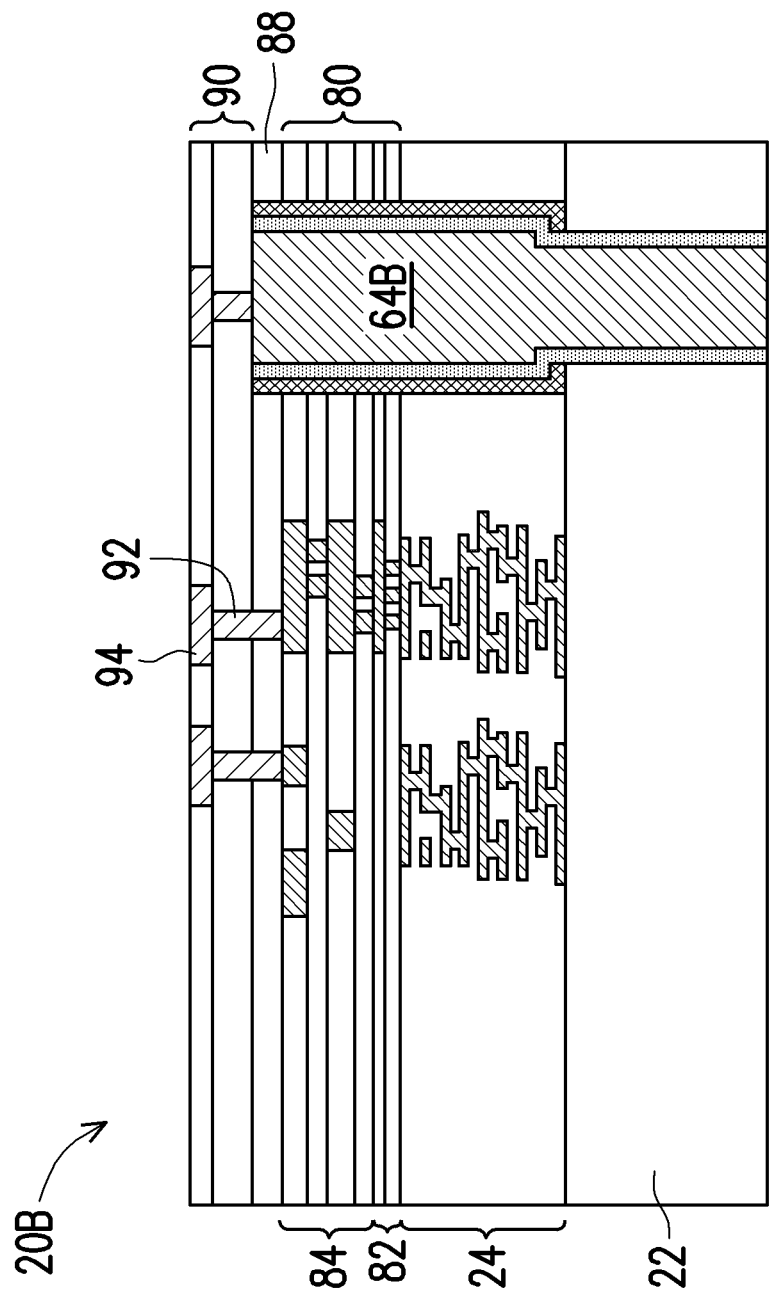

In FIG. 24, the integrated circuit die 20B is thinned by thinning the substrate 22 before the subsequent singulation process. This thinning process was described above in reference to TSV 64A and the description is not repeated herein.

Figure 25:
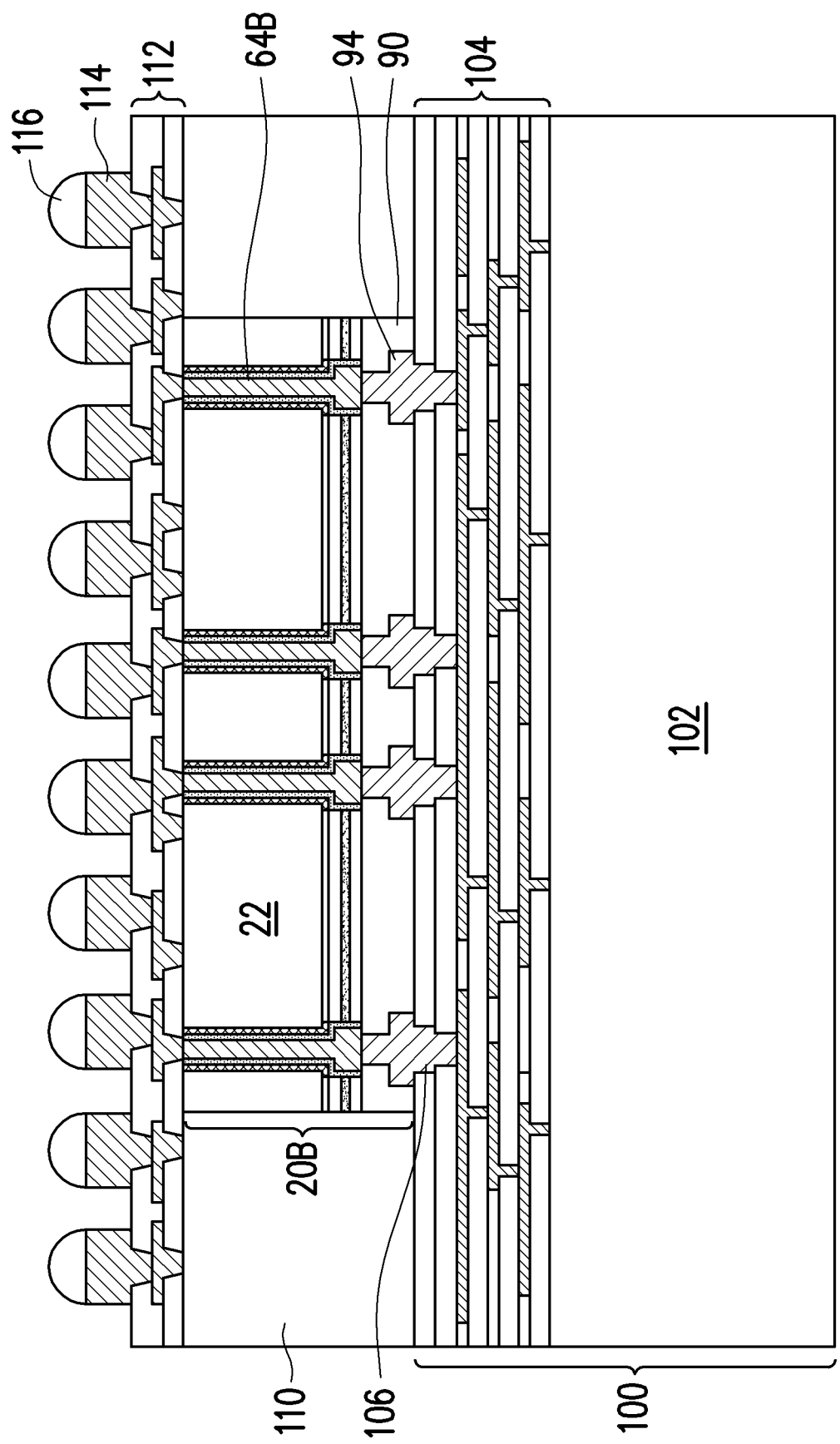

FIG. 25 illustrates subsequent processing on the integrated circuit die 20B of FIG. 24. This subsequent processing is similar to the processing illustrated and described in FIGS. 16 through 19 and the description is not repeated herein.

The embodiment depicted in FIG. 25 is a chip-on-wafer structure bonded in a face-to-face configuration. Alternatively, the integrated circuit die 20B and the package structure 100 may be bonded in a face-to-back configuration. For example, the back of the die 20B (e.g., exposed ends of the TSVs 64B and substrate 22) could be bonded to the face of the package structure 100.

Figure 26:
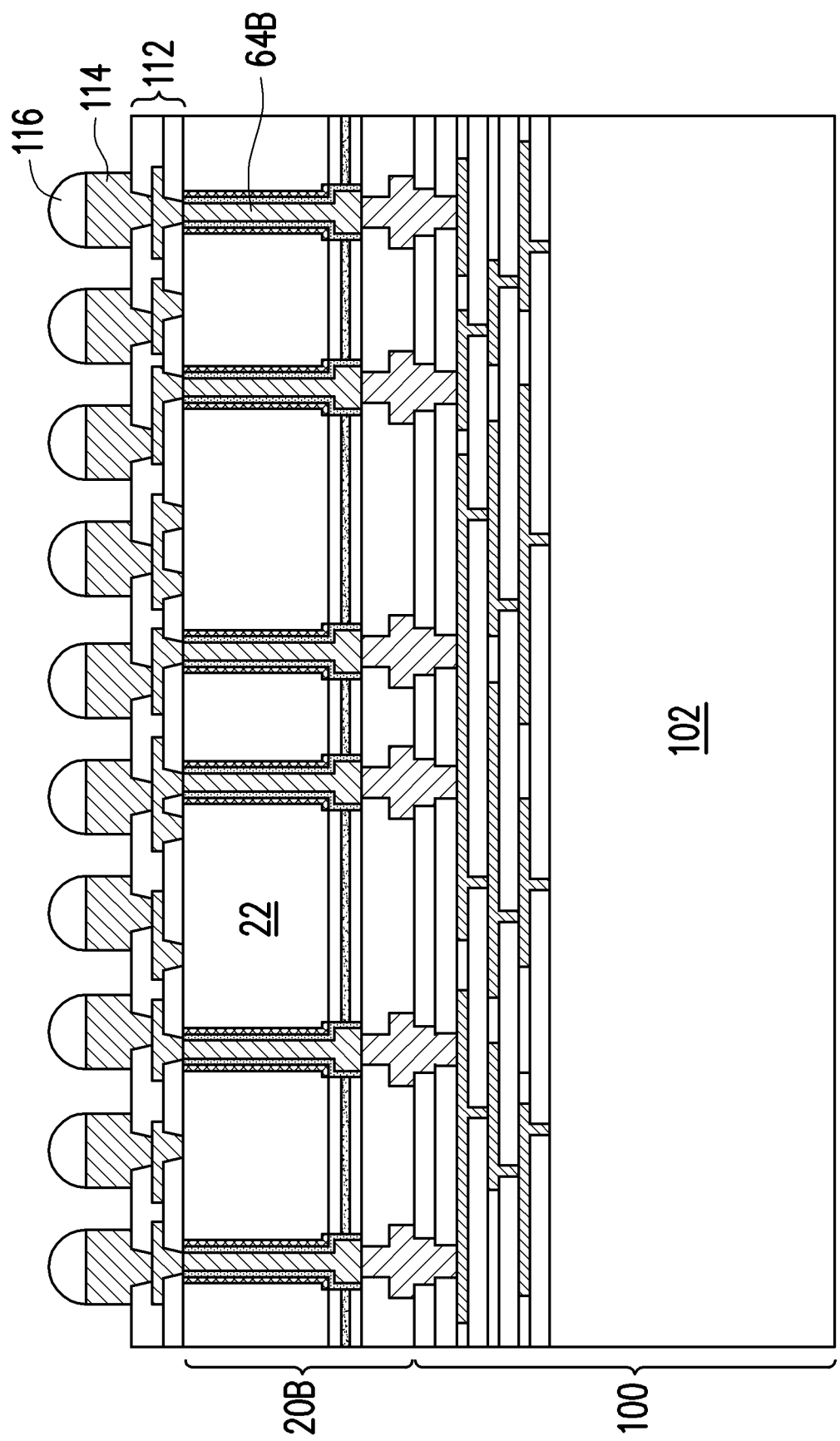
FIG. 26 illustrates a cross-sectional view of an intermediate stage in the formation of a multi-stack die package, according to another embodiment.

FIG. 26 illustrates a cross-sectional view of a wafer-on-wafer structure in accordance with some embodiments. This embodiment is similar to the embodiment illustrated in FIGS. 21 through 25 except that this embodiment is a wafer-on-wafer structure instead of a chip-on-wafer structure. Details regarding this embodiment that are similar to those for the previously described embodiments will not be repeated herein.

In FIG. 26, the structure is a wafer-on-wafer structure bonded in a face-to-face configuration in which the upper structure is a wafer 20B. The wafer 20B is formed similar to the die 20B described above and the description is not repeated herein. With this embodiment, the steps of singulating the die 20B and the formation of the encapsulant 110 in the previous embodiment are no longer needed and those steps can be omitted from this embodiment. In this embodiment, the wafer 20B and the package structure 100 are both wafers and are a same size.

In other embodiments, the wafer 20B may be bonded to the package structure 100 in a face-to-back configuration. For example, the back of the wafer 20B (e.g., exposed ends of the TSVs 64B and substrate 22) could be bonded to the face of the package structure 100.

FIGS. 27 through 33 illustrate cross-sectional views of intermediate stages in the formation of a multi-stack die package, according to an embodiment. This embodiment is similar to the embodiment illustrated in FIGS. 1 through 19 except that this embodiment includes a non-conformal passivation layer. Details regarding this embodiment that are similar to those for the previously described embodiments will not be repeated herein.

Figure 27:
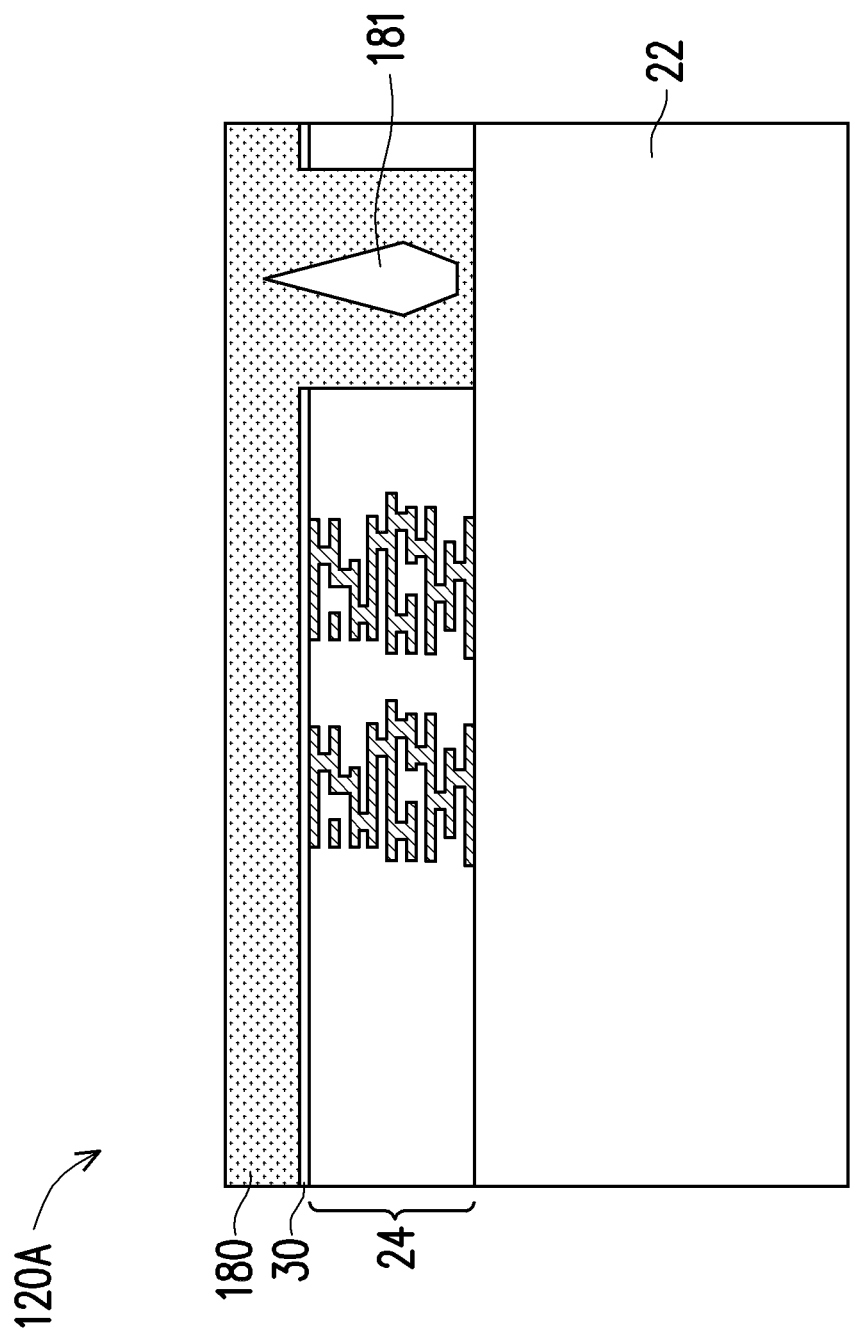
FIGS. 27 through 33 illustrate cross-sectional views of intermediate stages in the formation of a multi-stack die package, according to an embodiment.

FIG. 27 illustrates an intermediate stage of processing after that described in FIG. 5 above and the description of forming this intermediate stage of processing is not repeated herein In FIG. 27, a cross-sectional view of an integrated circuit die 120A in accordance with some embodiments. The integrated circuit die 120A is similar to the integrated circuit die 20A and the description is not repeated herein.

Further in FIG. 27, a passivation layer 180 is non-conformally deposited on the stop layer 30 and on the bottom surface and the sidewalls of the opening 34 (see FIG. 5). The passivation layer 180 has a thickness of about 0.5 μm to about 5 μm. In some embodiments, the non-conformal passivation layer 180 is an oxide deposited by a PECVD process, a high density plasma CVD (HDP-CVD), the like, or a combination thereof. In an embodiment, the non-conformal passivation layer 180 is an undoped silicate glass (USG) layer. The non-conformal deposition of the passivation layer 180 results in an air gap or void 181 in the opening 34.

Figure 28:
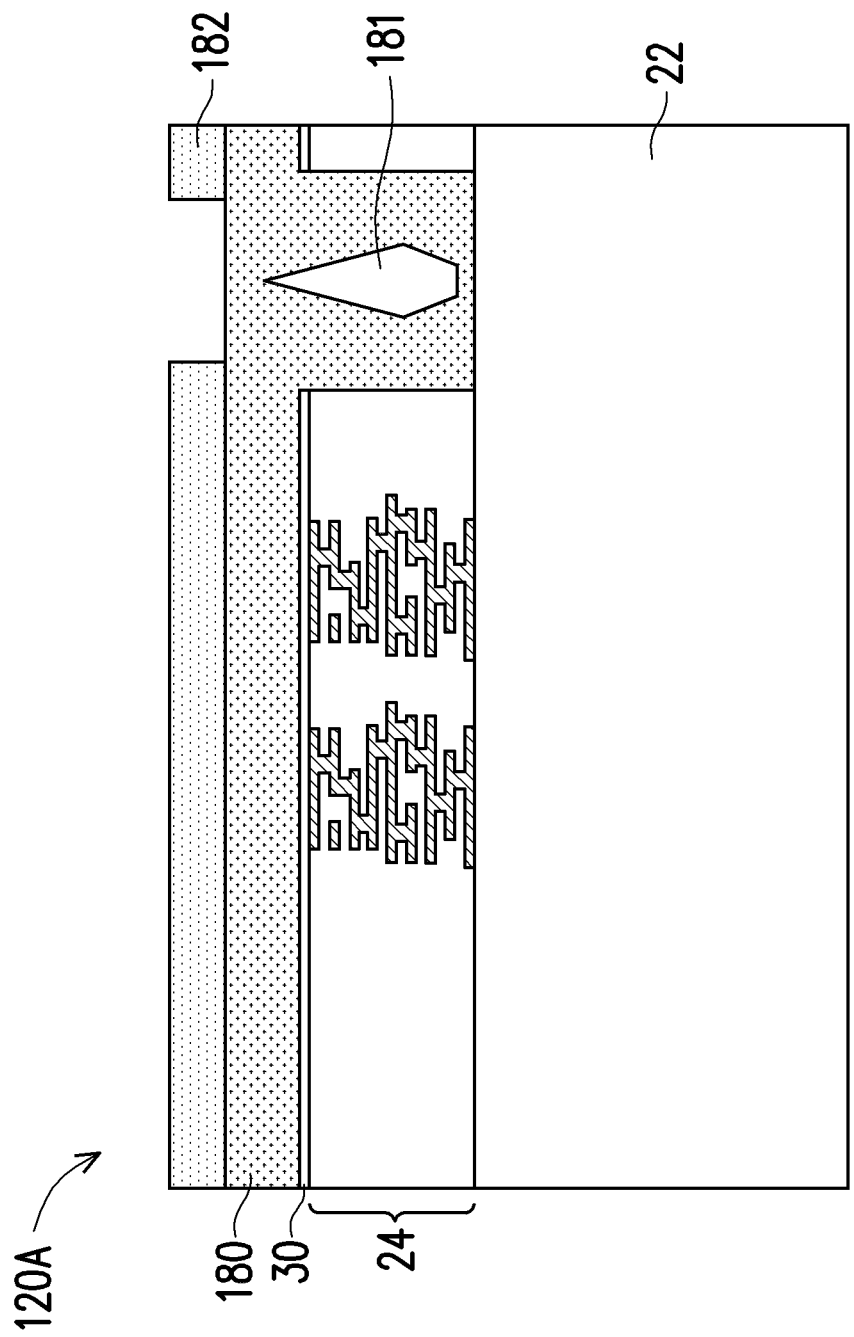

As illustrated in FIG. 28, a photoresist 182 is formed and patterned on the non-conformal passivation layer 180. The photoresist 182 may be formed by spin coating or the like and may be exposed to light for patterning. The pattern of the photoresist corresponds to a lower portion of a subsequently formed TSV. The patterning forms at least one opening through the photoresist 182 to expose the non-conformal passivation layer 180.

Figure 29:
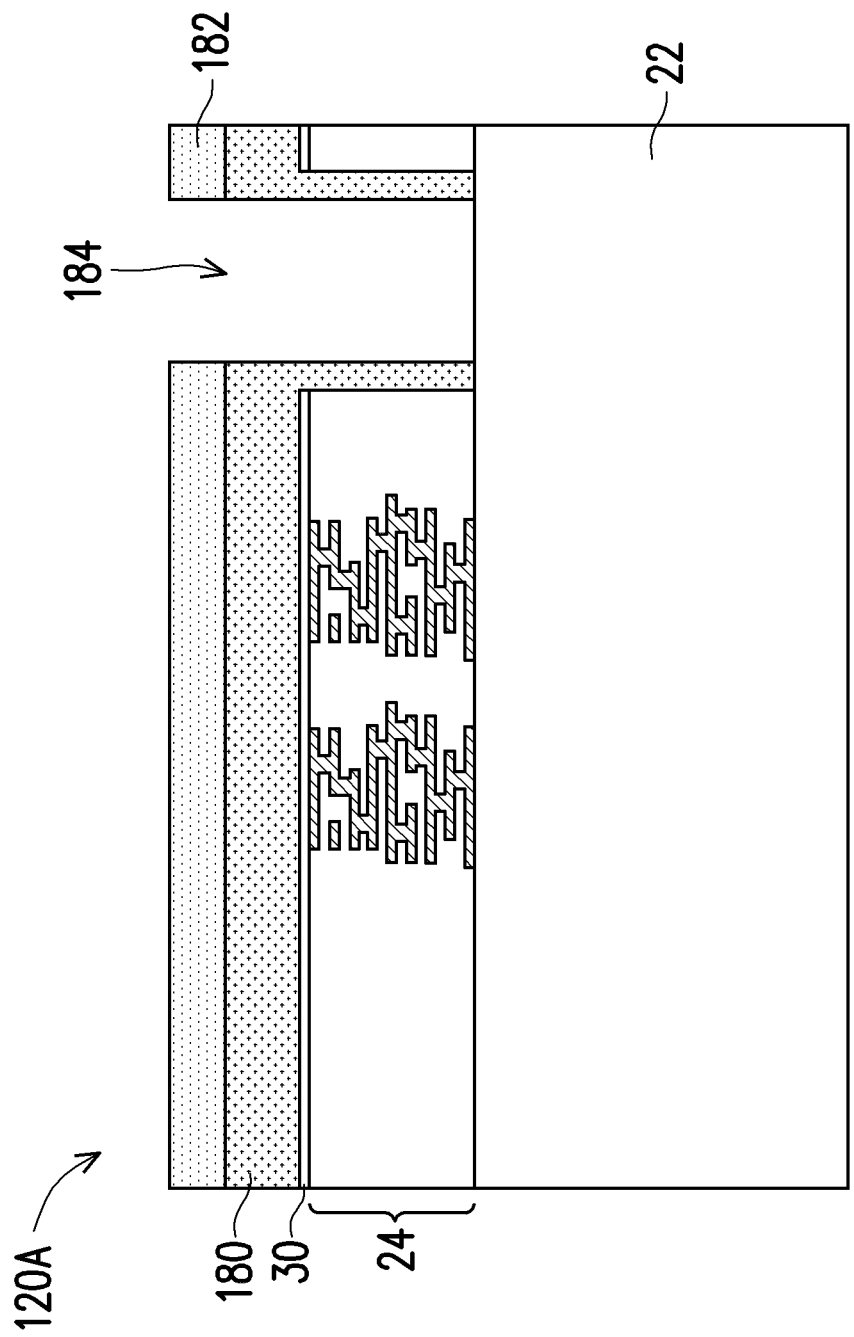

The remaining photoresist 182 acts as a mask during a subsequent etching process to remove portions of the passivation layer 180. The etching process to remove portions of the non-conformal passivation layer 180 forms an opening 184 as illustrated in FIG. 29. The substrate 22 is exposed at the bottom of the opening 184.

Figure 30:
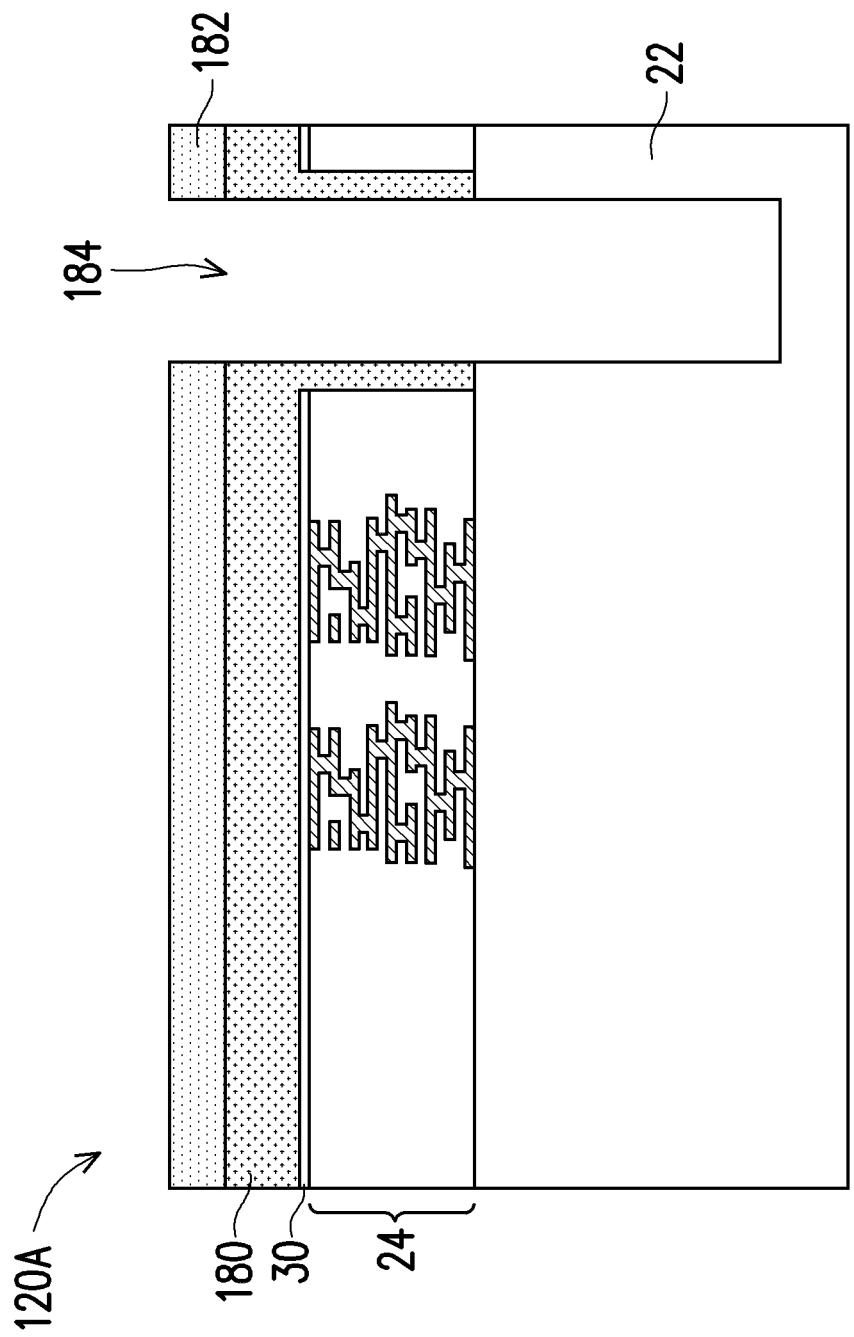

The photoresist 182 acts as a mask during another subsequent etching process to remove portions of the substrate 22 as illustrated in FIG. 30. The etching process to remove portions of the substrate 22 increases the depth of the opening 184. The opening 184 in the substrate 22 may have a depth of about 5 µm to 10 µm.

Because the passivation layer 180 is covering the exposed sidewalls of the interconnect 24 in the opening 184 during the process to form and extend the opening 184, any possible contamination from the etching process for the opening 184 is blocked from entering the interconnect 24. By blocking the contamination, damage to the metallization patterns of the interconnect layers by, for example, sulfur, used during the etching of the through substrate via is prevented.

Figure 31:
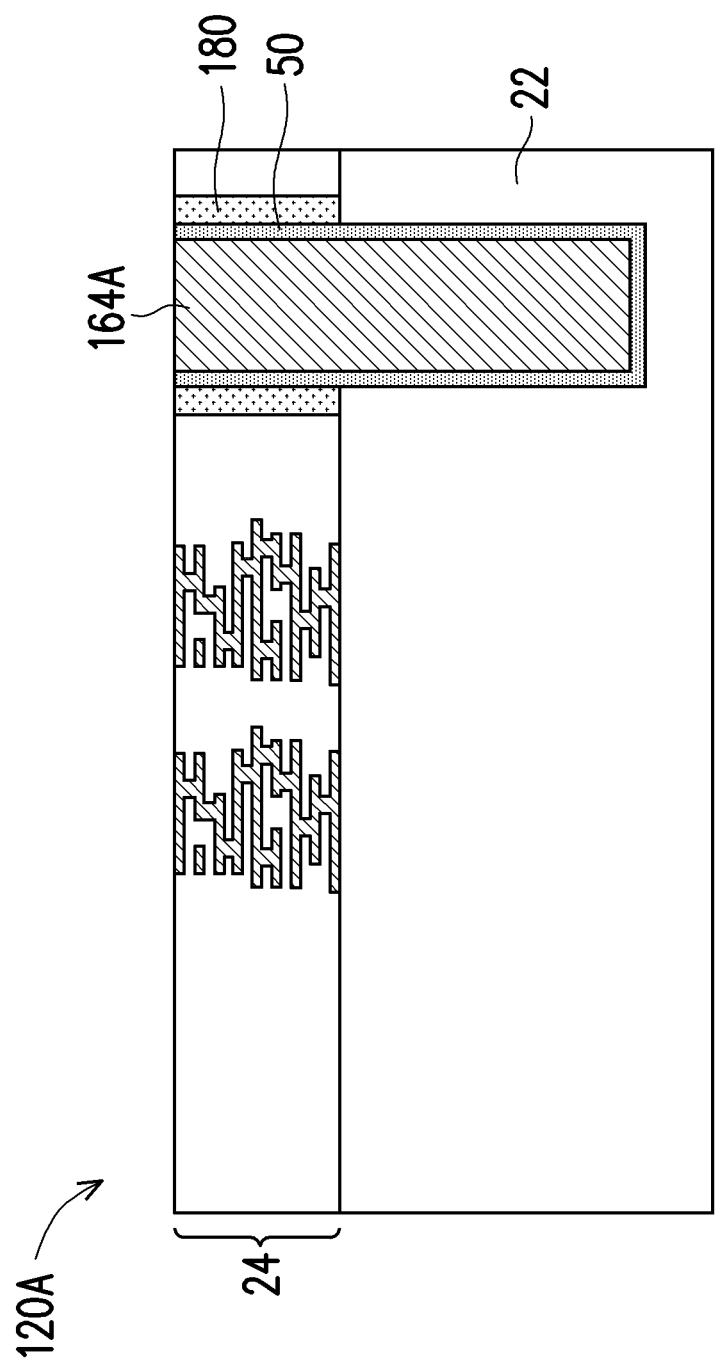

In FIG. 31, after etching the opening 184, a TSV 164A is formed in the opening 184 through the interconnect 24 and at least partially into the substrate 22. The TSV 164A may be formed by similar processes and materials as the TSV 64A described above the description is not repeated herein.

One of the final steps of forming the TSV 164A is a planarization process (similar to that described above in reference to TSV 64A) to remove portions of the conductive material 62, the seed layer 60, the liner layer 50, the passivation layer 180, and the stop layer 30 outside the opening 34. Top surfaces of the TSV 164A, the passivation layer 180, and the liner layer 50 are substantially coplanar after the planarization process within process variations. The planarization process may be, for example, a chemical-mechanical polish (CMP), a grinding process, or the like. In this embodiment because the same mask (e.g., photoresist 182) was used to etch the openings in the interconnect 24 and the substrate 22, the TSV 164A has a substantially constant width along the entire length of the TSV 164A.

Figure 32:
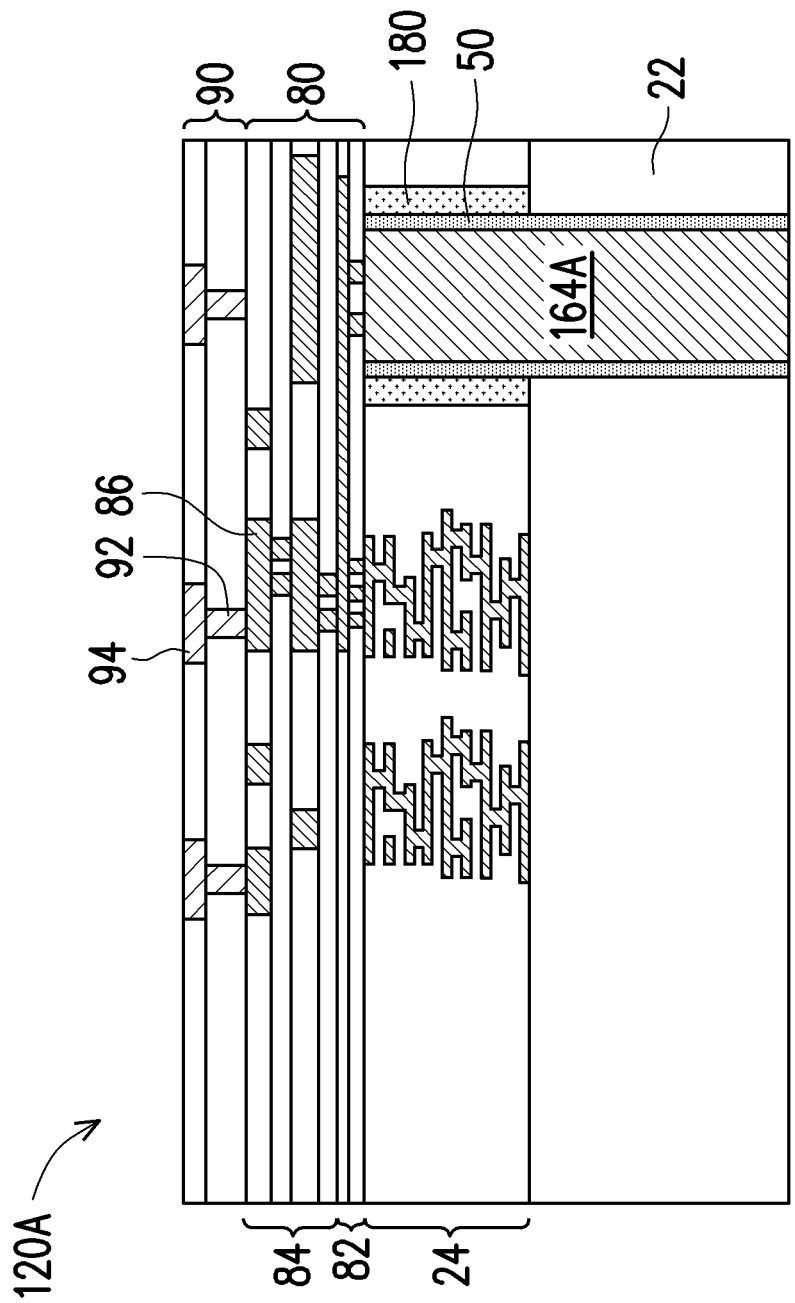

FIG. 32 illustrates subsequent processing on the integrated circuit die 120A of FIG. 31. This subsequent processing is similar to the processing illustrated and described in FIGS. 14 and 15 and the description is not repeated herein.

Figure 33:
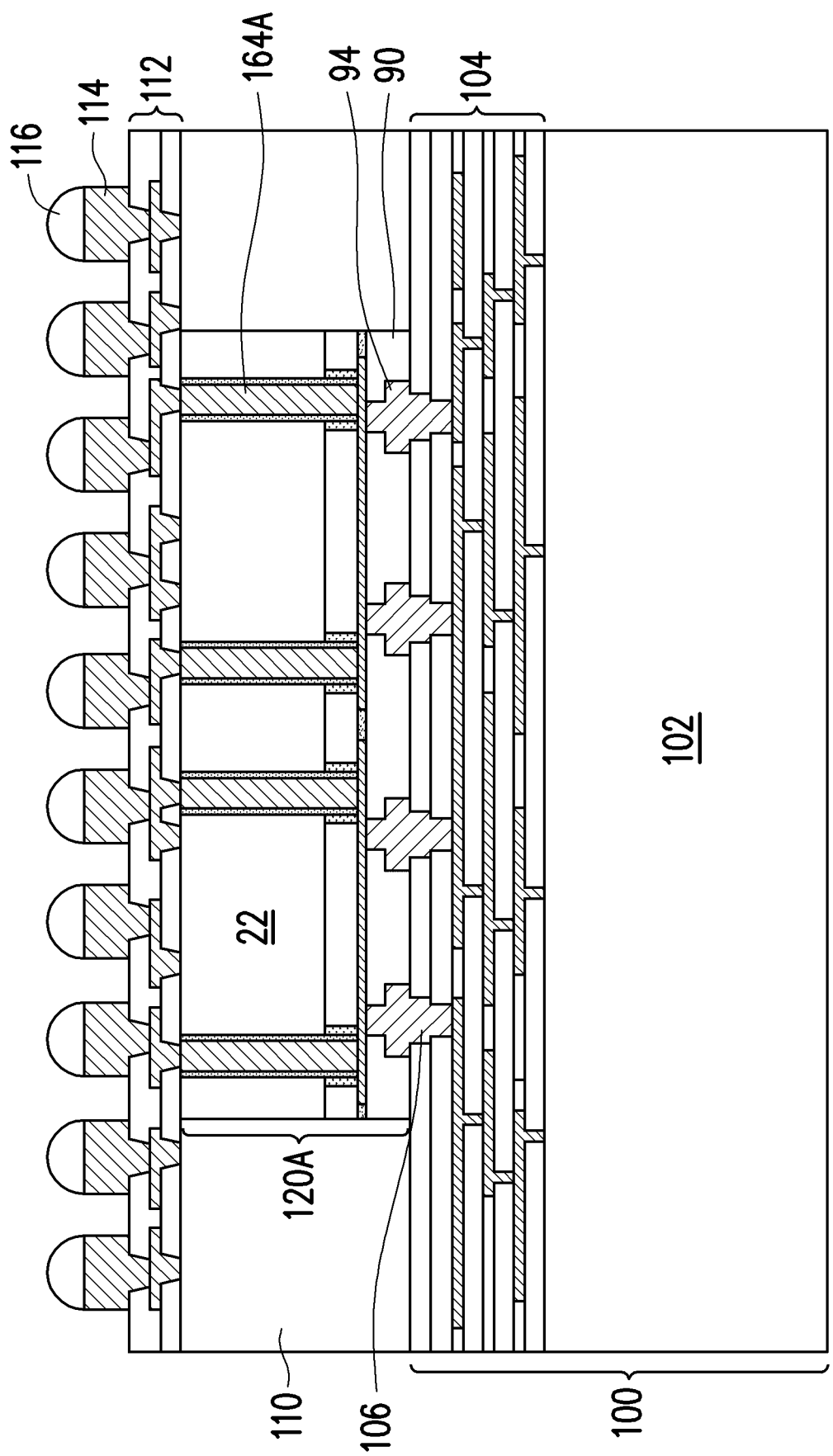

FIG. 33 illustrates subsequent processing on the integrated circuit die 120A of FIG. 32. This subsequent processing is similar to the processing illustrated and described in FIGS. 16 through 19 and the description is not repeated herein.

The embodiment depicted in FIG. 33 is a chip-on-wafer structure bonded in a face-to-face configuration. Alternatively, the integrated circuit die 120A and the package structure 100 may be bonded in a face-to-back configuration. For example, the back of the die 120A (e.g., exposed ends of the TSVs 164A and substrate 22) could be bonded to the face of the package structure 100.

Figure 34:
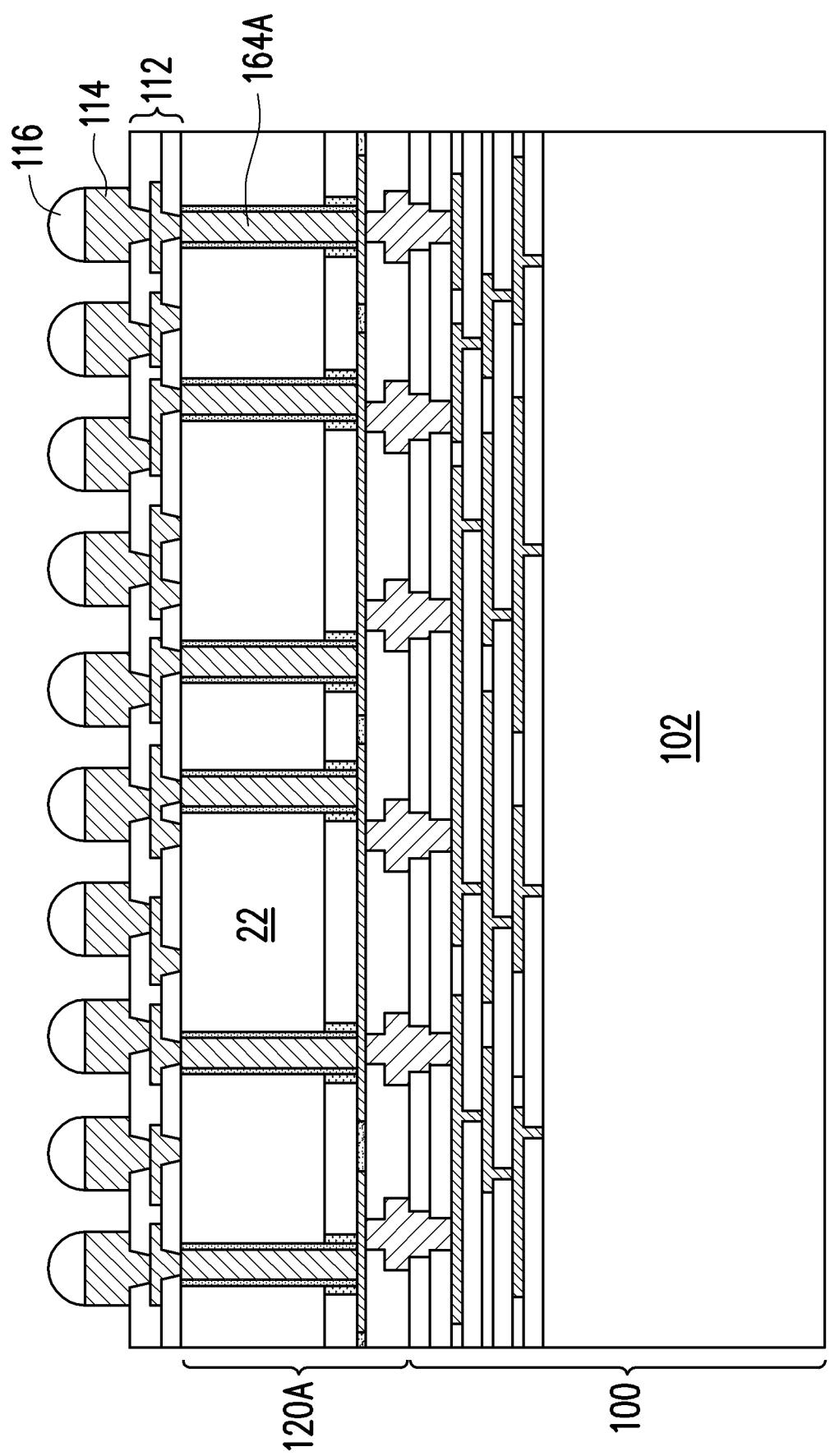
FIG. 34 illustrates a cross-sectional view of an intermediate stage in the formation of a multi-stack die package, according to another embodiment.

In FIG. 34, the structure is a wafer-on-wafer structure bonded in a face-to-face configuration in which the upper structure is a wafer 120A. The wafer 120A is formed similar to the die 120A described above and the description is not repeated herein. With this embodiment, the steps of singulating the die 120A and the formation of the encapsulant 110 in the previous embodiment are no longer needed and those steps can be omitted from this embodiment. In this embodiment, the wafer 120A and the package structure 100 are both wafers and are a same size.

In other embodiments, the wafer 120A may be bonded to the package structure 100 in a face-to-back configuration. For example, the back of the wafer 120A (e.g., exposed ends of the TSVs 164A and substrate 22) could be bonded to the face of the package structure 100.

Figure 35:
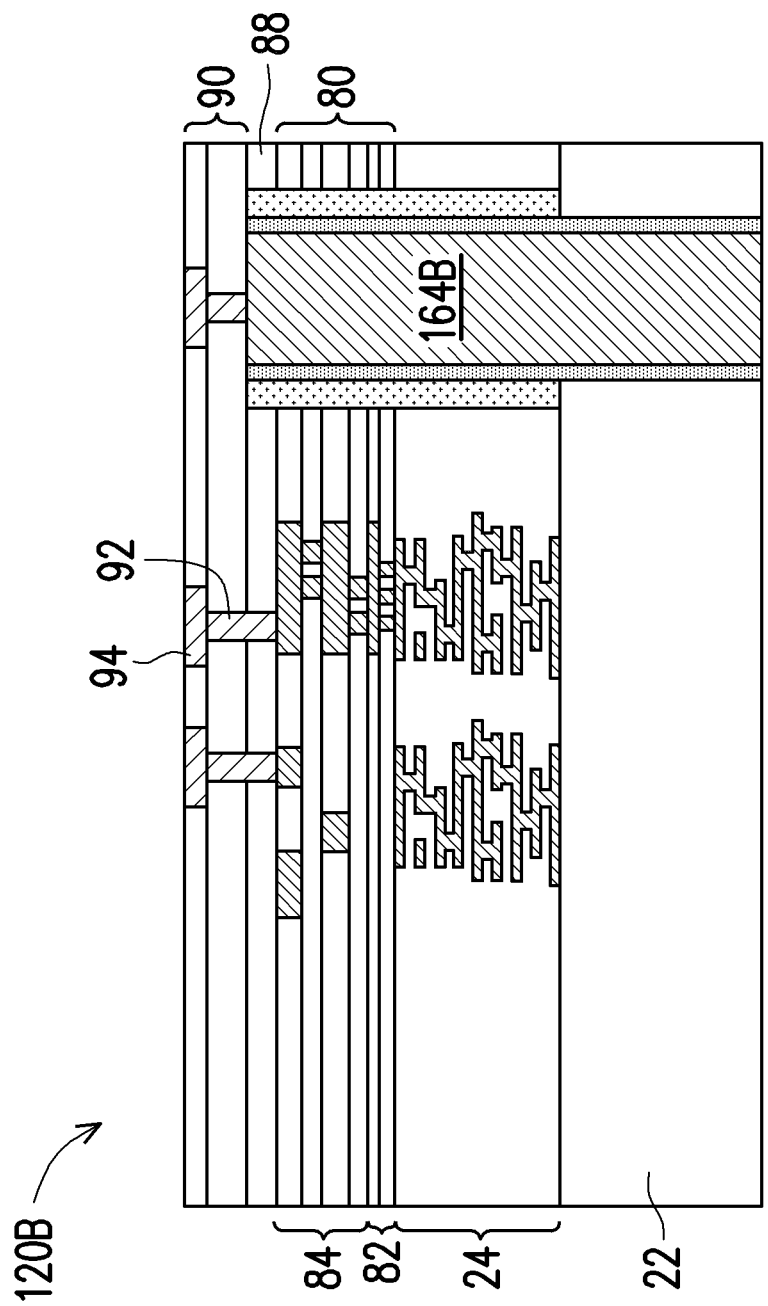
FIGS. 35 through 36 illustrate cross-sectional views of intermediate stages in the formation of a multi-stack die package, according to an embodiment.
Figure 36:
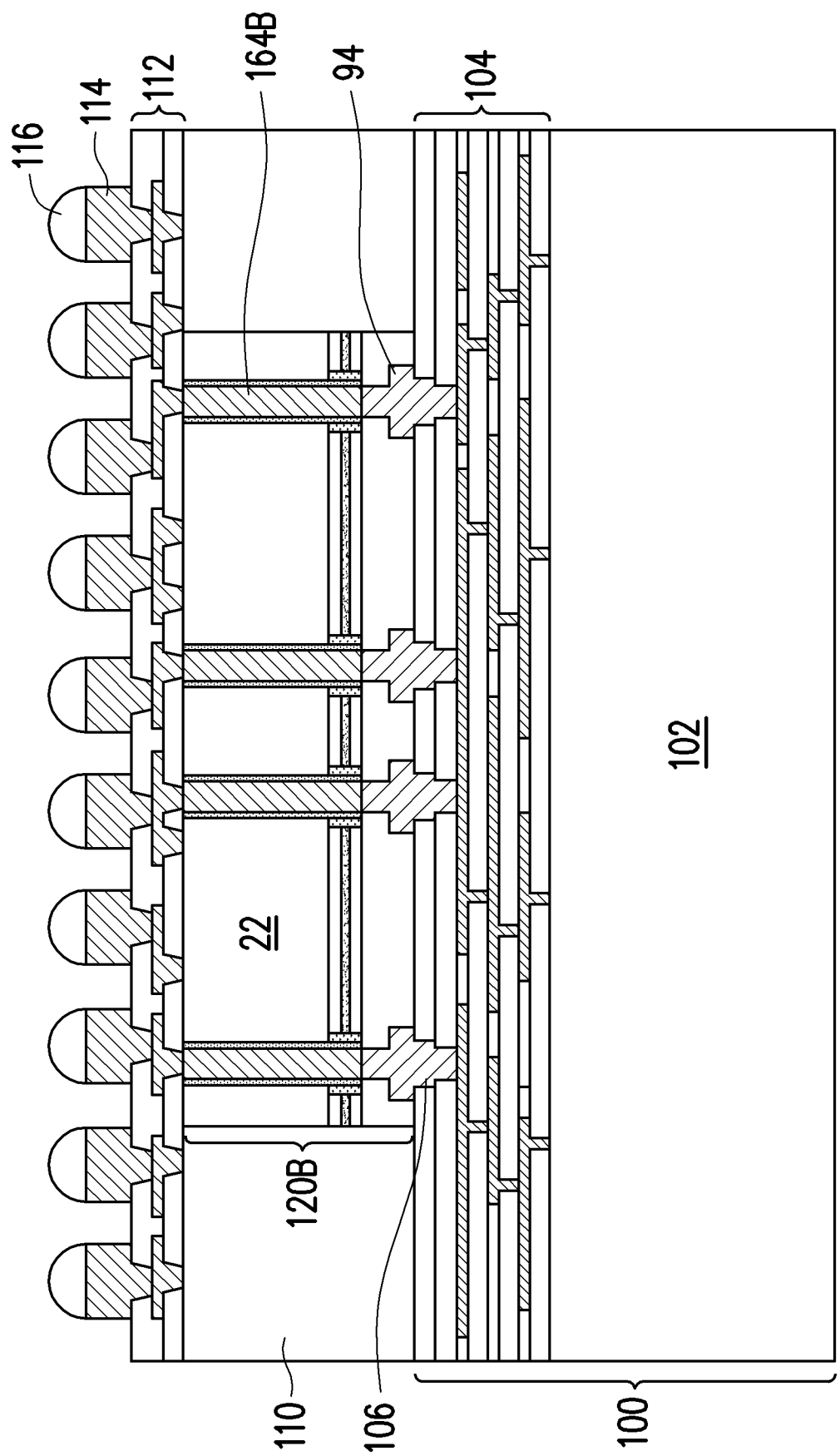

FIGS. 35 through 36 illustrate cross-sectional views of intermediate stages in the formation of a multi-stack die package, according to an embodiment. This embodiment is similar to the embodiment illustrated in FIGS. 27 through 33 except that this embodiment is a TSV-last process (similar to the process described above in FIGS. 21 through 25) instead of a TSV-middle process as described in FIGS. 27 through 33. Details regarding this embodiment that are similar to those for the previously described embodiments will not be repeated herein.

FIG. 35 illustrates a cross-sectional view of an integrated circuit die 120B in accordance with some embodiments. The integrated circuit die 120B may be formed by similar processes and materials as the integrated circuit die 120A described above the description is not repeated herein.

The interconnects 80 and 90 and passivation layer 88 are formed by similar processes and materials as the embodiment in FIGS. 21 through 25 and the description is not repeated herein. Also, similar to the embodiment in FIGS. 21 through 25, the TSV 164B is formed after and through the interconnect 80 and the passivation layer 88 and that description is not repeated herein.

FIG. 35 illustrates an intermediate stage of processing after that described in FIG. 24 above and the description of forming this intermediate stage of processing is not repeated herein.

FIG. 36 illustrates subsequent processing on the integrated circuit die 120B of FIG. 35. This subsequent processing is similar to the processing illustrated and described in FIGS. 16 through 19 and the description is not repeated herein.

The embodiment depicted in FIG. 36 is a chip-on-wafer structure bonded in a face-to-face configuration. Alternatively, the integrated circuit die 120B and the package structure 100 may be bonded in a face-to-back configuration. For example, the back of the die 120B (e.g., exposed ends of the TSVs 164B and substrate 22) could be bonded to the face of the package structure 100.

Figure 37:
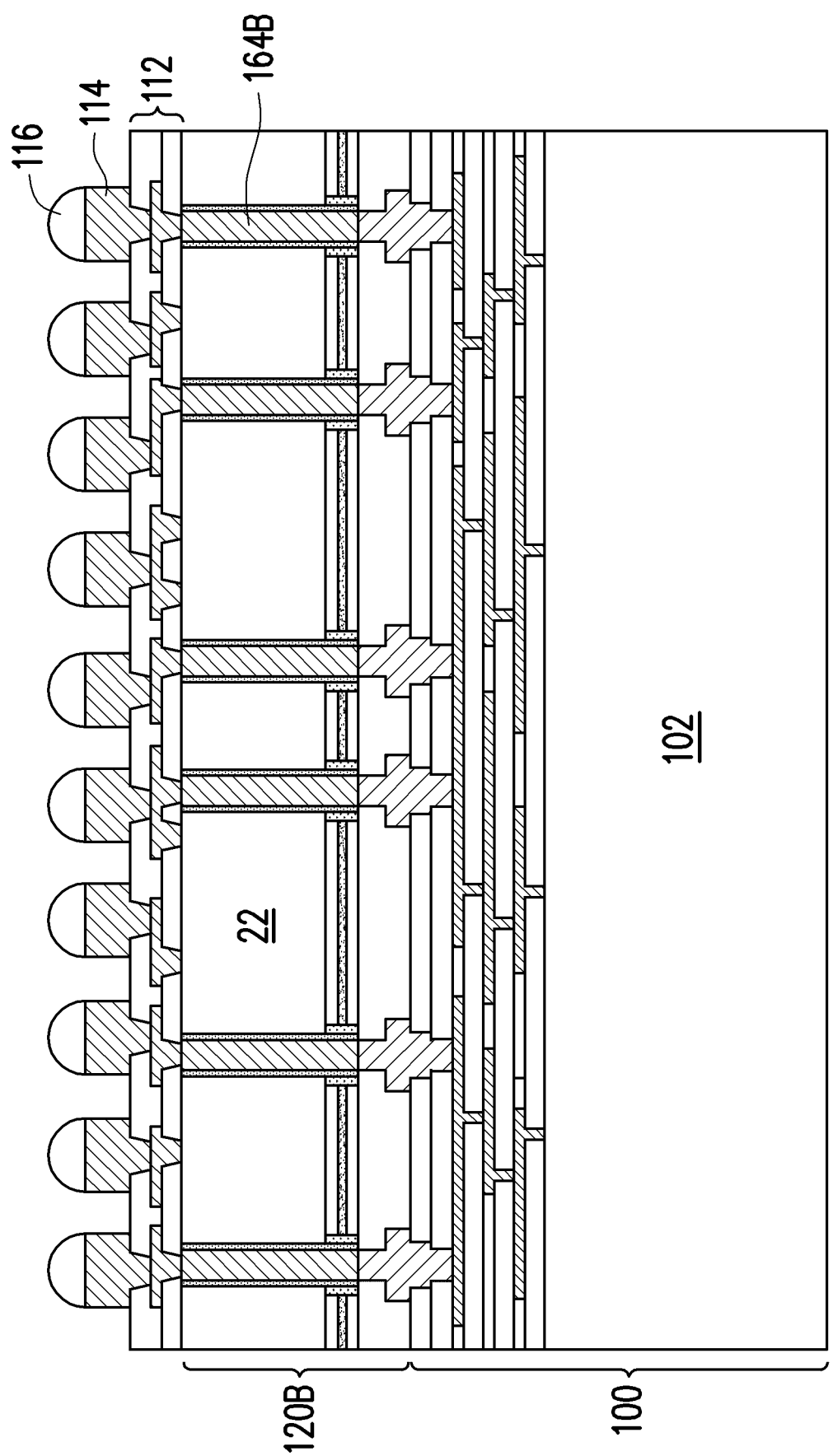
FIG. 37 illustrates a cross-sectional view of an intermediate stage in the formation of a multi-stack die package, according to another embodiment.

In FIG. 37, the structure is a wafer-on-wafer structure bonded in a face-to-face configuration in which the upper structure is a wafer 120B. The wafer 120B is formed similar to the die 120B described above and the description is not repeated herein. With this embodiment, the steps of singulating the die 120B and the formation of the encapsulant 110 in the previous embodiment are no longer needed and those steps can be omitted from this embodiment. In this embodiment, the wafer 120B and the package structure 100 are both wafers and are a same size.

In other embodiments, the wafer 120B may be bonded to the package structure 100 in a face-to-back configuration. For example, the back of the wafer 120B (e.g., exposed ends of the TSVs 164B and substrate 22) could be bonded to the face of the package structure 100.

FIGS. 38 through 43 illustrate cross-sectional views of intermediate stages in the formation of a multi-stack die package, according to an embodiment. This embodiment is similar to the embodiment illustrated in FIGS. 1 through 19 except that this embodiment includes a selective deposition of a passivation layer. Details regarding this embodiment that are similar to those for the previously described embodiments will not be repeated herein.

Figure 38:
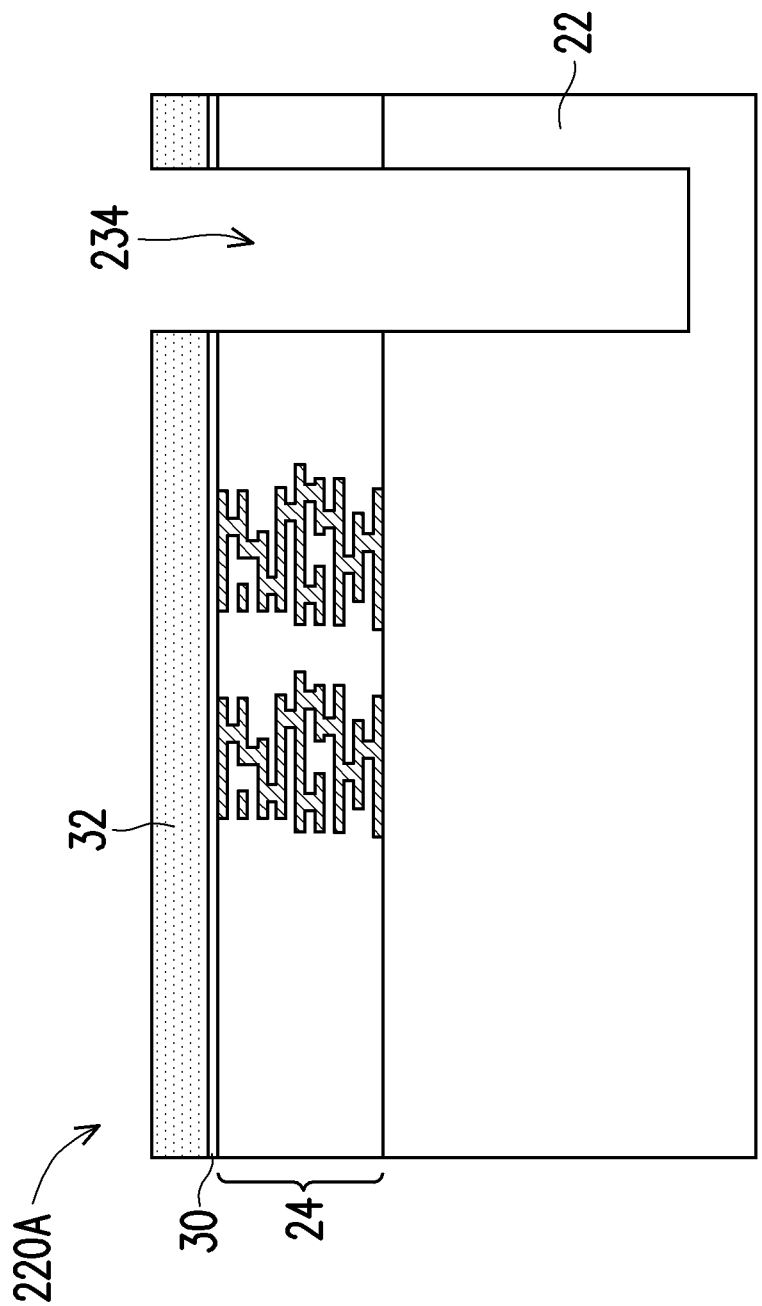
FIGS. 38 through 43 illustrate cross-sectional views of intermediate stages in the formation of a multi-stack die package, according to an embodiment.

FIG. 38 illustrates an intermediate stage of processing after that described in FIG. 5 above and the description of forming this intermediate stage of processing is not repeated herein. In FIG. 38, a cross-sectional view of an integrated circuit die 220A in accordance with some embodiments. The integrated circuit die 220A is similar to the integrated circuit die 20A and the description is not repeated herein.

Further in FIG. 38, the opening 34 from FIG. 5 is extended to form opening 234 after subsequent etching process to remove portions of the substrate 22 using the photoresist 32 as a mask. The opening 234 in the substrate 22 may have a depth of about 5 µm to 10 µm.

Figure 39:
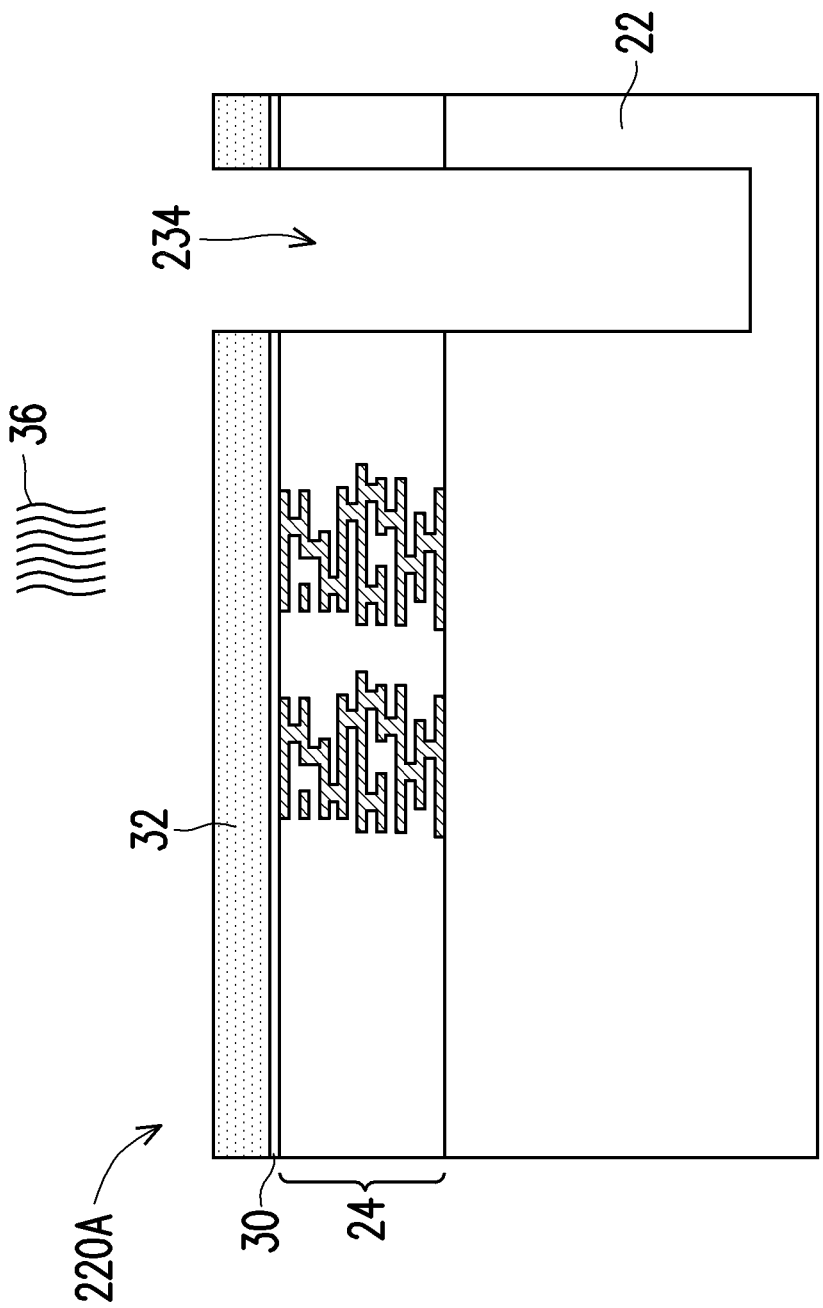

In FIG. 39, a baking process 38 is performed. The baking process 38 is similar to the baking process 36 described above and the description is not repeated herein. The baking process 38 can help to remove moisture and liquid from the openings 234 that accumulated from the etching process for the openings 34 and 234 and the processing of the photoresist 32. Even though the sidewalls of the interconnect 24 are exposed during the formation of the opening 234 and during the processing of the photoresist 32, the extra baking process 38 removes the remaining moisture and liquid and can help to prevent damage to the interconnect structure 24.

Figure 40:
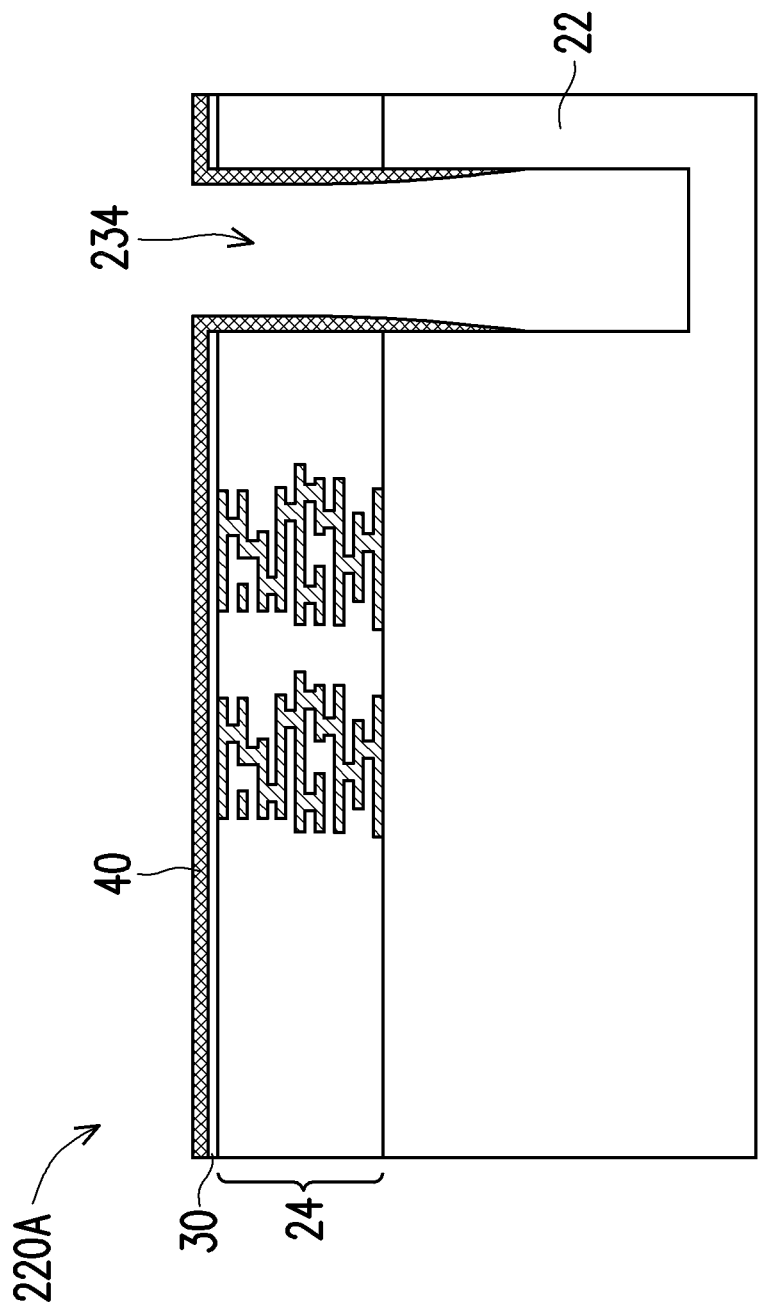

In FIG. 40, the passivation layer 40 is selectively deposited on the stop layer 30 and on the exposed sidewalls of the interconnect 24 in the opening 234. The passivation layer 40 can help to prevent the diffusion of the materials of the subsequently formed through substrate via 264A (see, e.g., FIG. 41) into the interconnect 24 during subsequent processing. In some embodiments, the exposed sidewalls and bottom of the substrate in the opening 234 is substantially free of the passivation layer 40. In some embodiments, the passivation layer 40 may partially cover the exposed sidewalls and bottom of the substrate in the opening 234 while fully covering the exposed interconnect 24 in the opening 234. In some embodiments, the passivation layer 40 may decrease in thickness on the sidewall of the opening 234 as moving from a top of the opening 234 (e.g., near stop layer 30) to a bottom of the opening 234 (e.g., near bottom surface in substrate 22).

In some embodiments, the passivation layer 40 may comprise silicon nitride or the like and may, for example, have a dielectric constant of in a range from about 6.5 to about 8. The passivation layer 40 may be deposited conformally using a deposition process such as CVD, PECVD, ALD, plasma-enhanced ALD (PEALD) the like, or a combination thereof and may be formed The passivation layer 40 may be deposited to a thickness of about 0.05 µm to about 0.5 µm.

Figure 41:
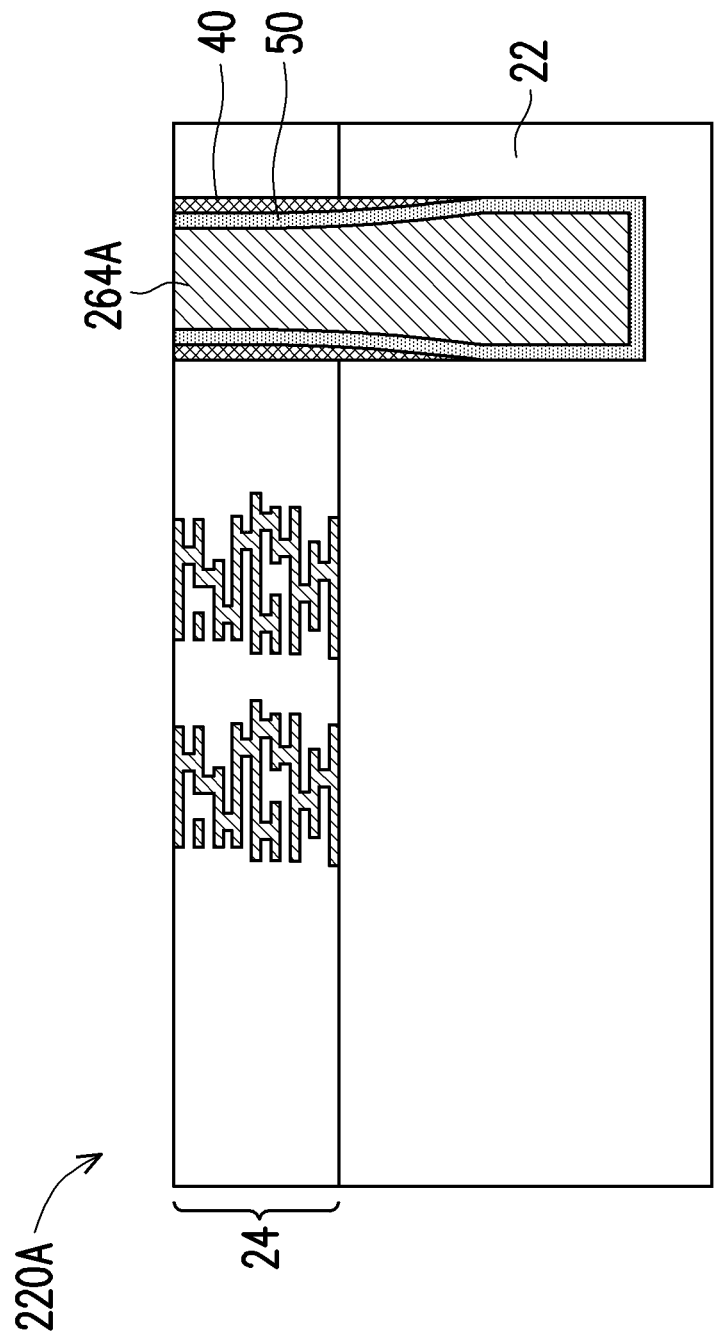

In FIG. 41, after forming the selective passivation layer 40, a TSV 264A is formed in the opening 234 through the interconnect 24 and at least partially into the substrate 22. The TSV 264A may be formed by similar processes and materials as the TSV 64A described above the description is not repeated herein.

One of the final steps of forming the TSV 264A is a planarization process (similar to that described above in reference to TSV 64A) to remove portions of the conductive material 62, the seed layer 60, the liner layer 50, the passivation layer 40, and the stop layer 30 outside the opening 234. Top surfaces of the TSV 264A, the passivation layer 40, and the liner layer 50 are substantially coplanar after the planarization process within process variations. The planarization process may be, for example, a chemical-mechanical polish (CMP), a grinding process, or the like. In this embodiment because the same mask (e.g., photoresist 32) was used to etch the openings in the interconnect 24 and the substrate 22, the TSV 264A has a substantially constant width along the entire length of the TSV 264A.

Figure 42:
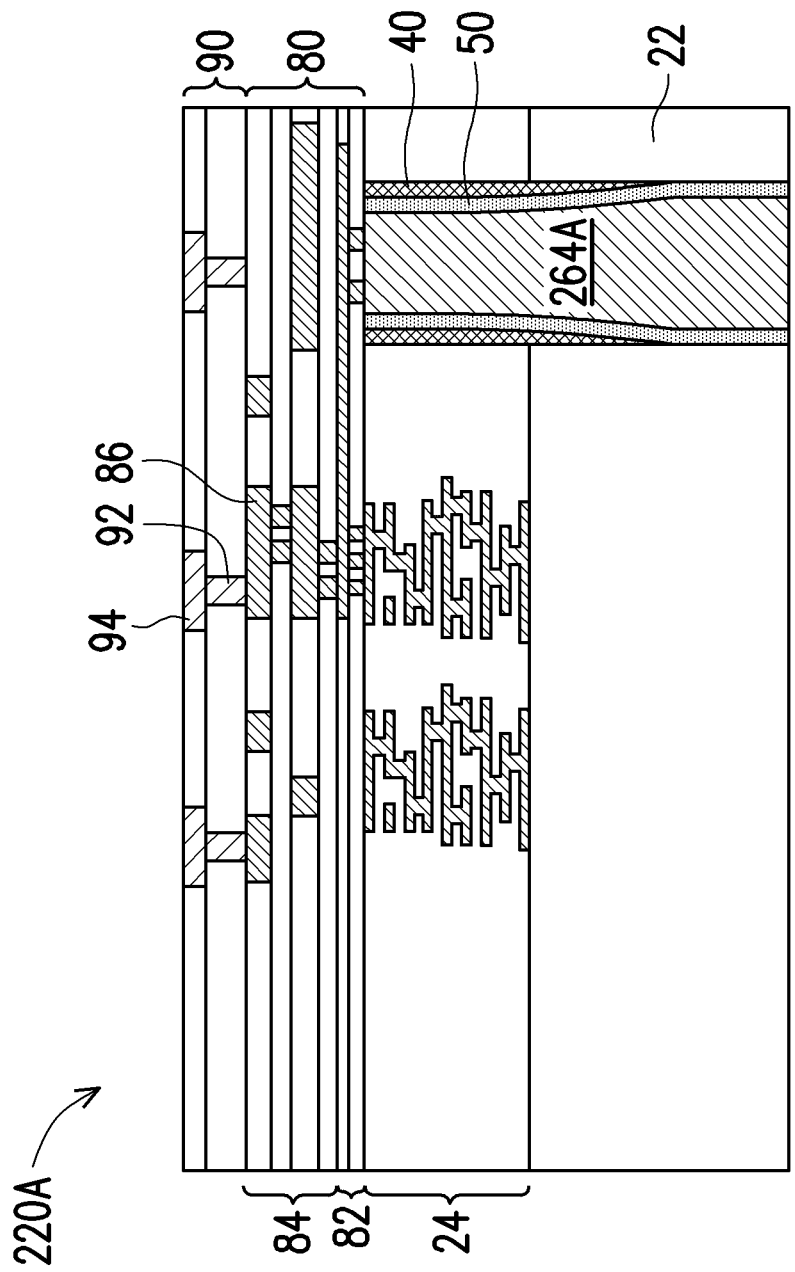

FIG. 42 illustrates subsequent processing on the integrated circuit die 220A of FIG. 41. This subsequent processing is similar to the processing illustrated and described in FIGS. 14 and 15 and the description is not repeated herein.

Figure 43:
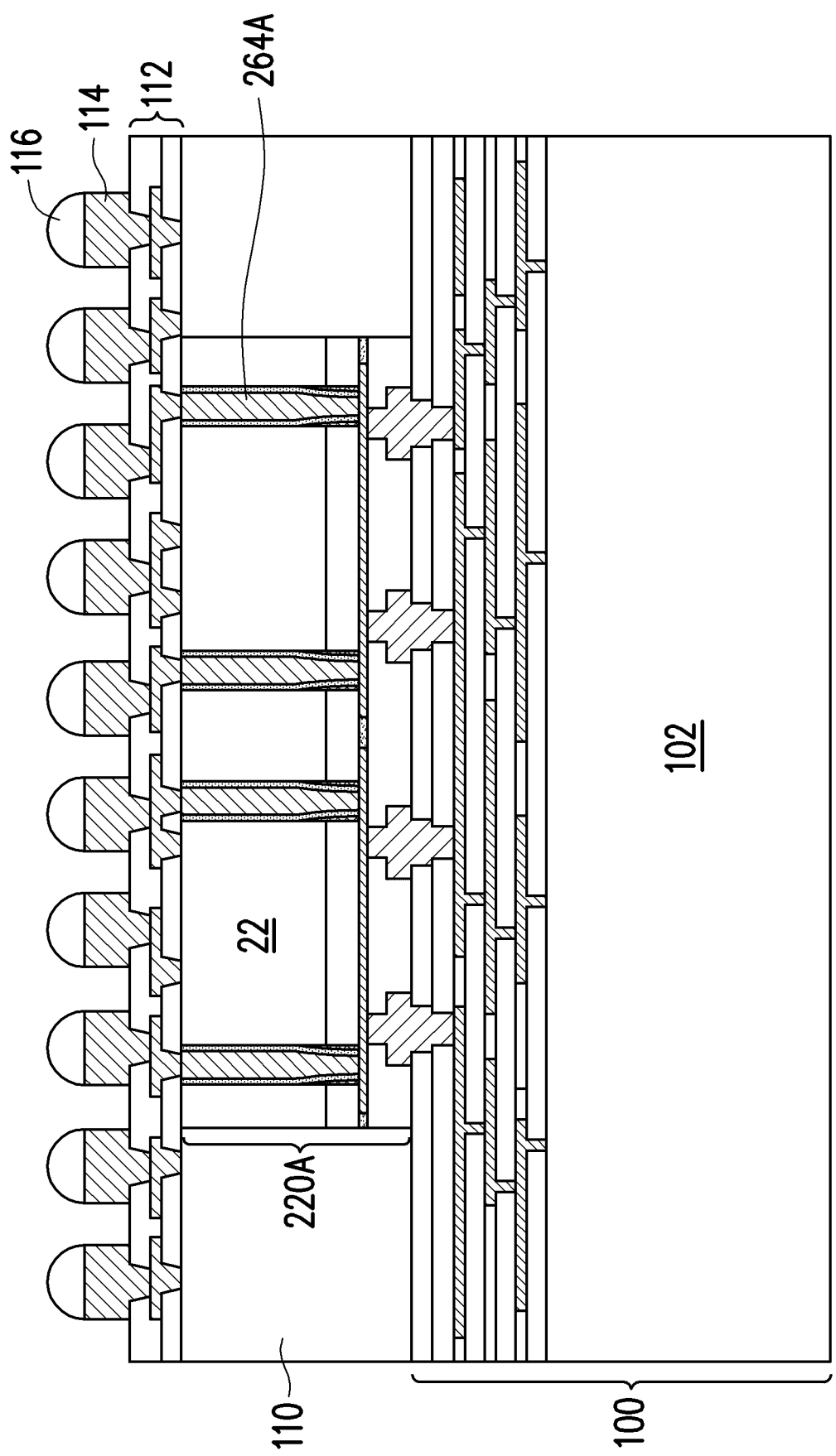

FIG. 43 illustrates subsequent processing on the integrated circuit die 220A of FIG. 42. This subsequent processing is similar to the processing illustrated and described in FIGS. 16 through 19 and the description is not repeated herein.

The embodiment depicted in FIG. 43 is a chip-on-wafer structure bonded in a face-to-face configuration. Alternatively, the integrated circuit die 220A and the package structure 100 may be bonded in a face-to-back configuration. For example, the back of the die 220A (e.g., exposed ends of the TSVs 264A and substrate 22) could be bonded to the face of the package structure 100.

Figure 44:
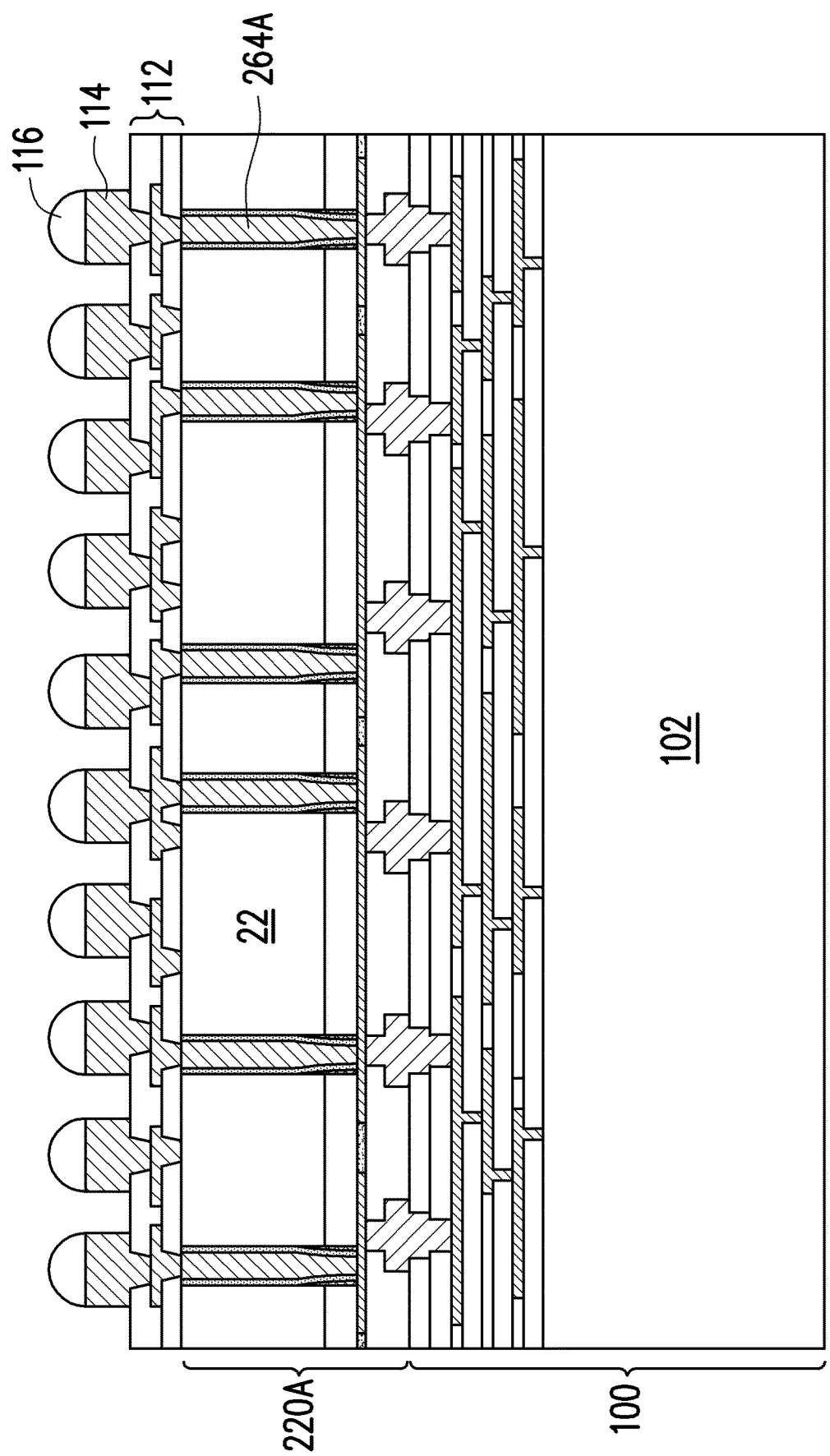
FIG. 44 illustrates a cross-sectional view of an intermediate stage in the formation of a multi-stack die package, according to another embodiment.

In FIG. 44, the structure is a wafer-on-wafer structure bonded in a face-to-face configuration in which the upper structure is a wafer 220A. The wafer 220A is formed similar to the die 220A described above and the description is not repeated herein. With this embodiment, the singulation step of singulating the die 220A and the formation of the encapsulant 110 in the previous embodiment is no longer needed and those steps can be omitted from this embodiment. In this embodiment, the wafer 220A and the package structure 100 are both wafers and are a same size.

In other embodiments, the wafer 220A may be bonded to the package structure 100 in a face-to-back configuration. For example, the back of the wafer 220A (e.g., exposed ends of the TSVs 264A and substrate 22) could be bonded to the face of the package structure 100.

Figure 45:
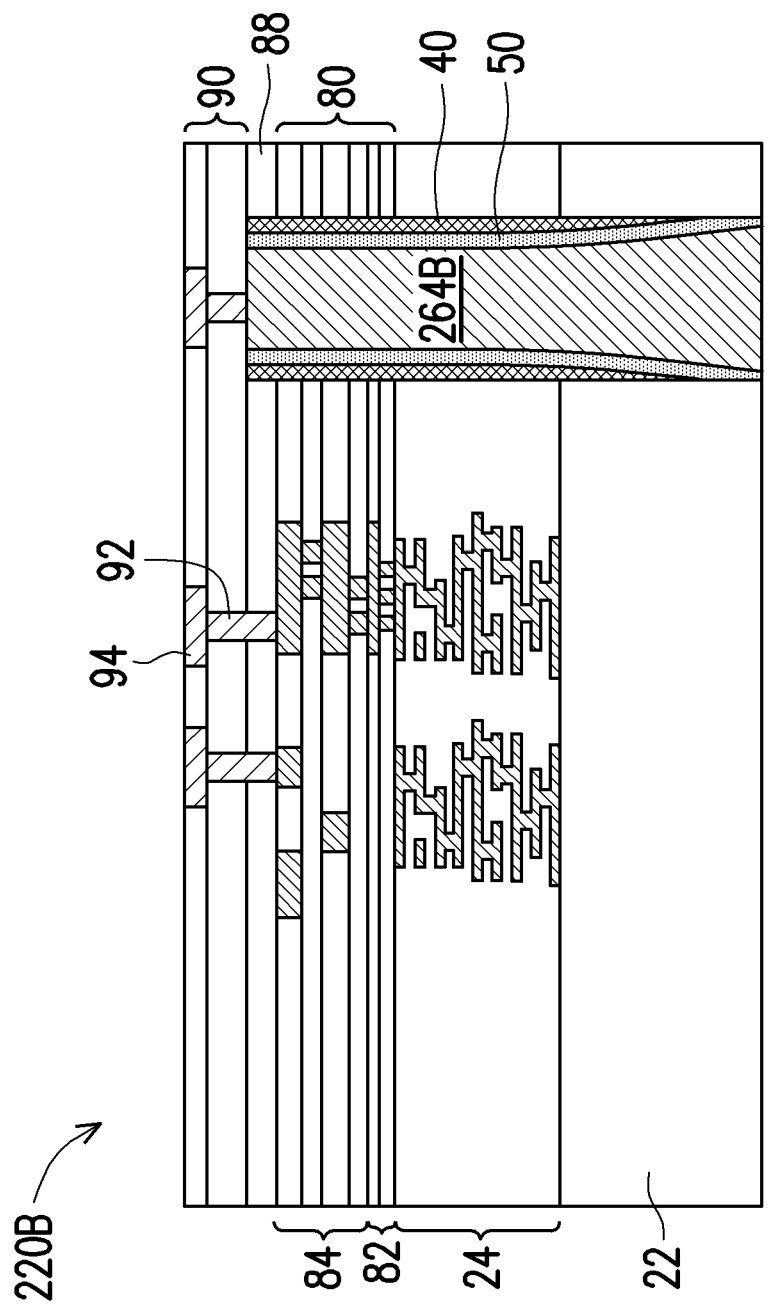
FIGS. 45 through 46 illustrate cross-sectional views of intermediate stages in the formation of a multi-stack die package, according to an embodiment.
Figure 46:
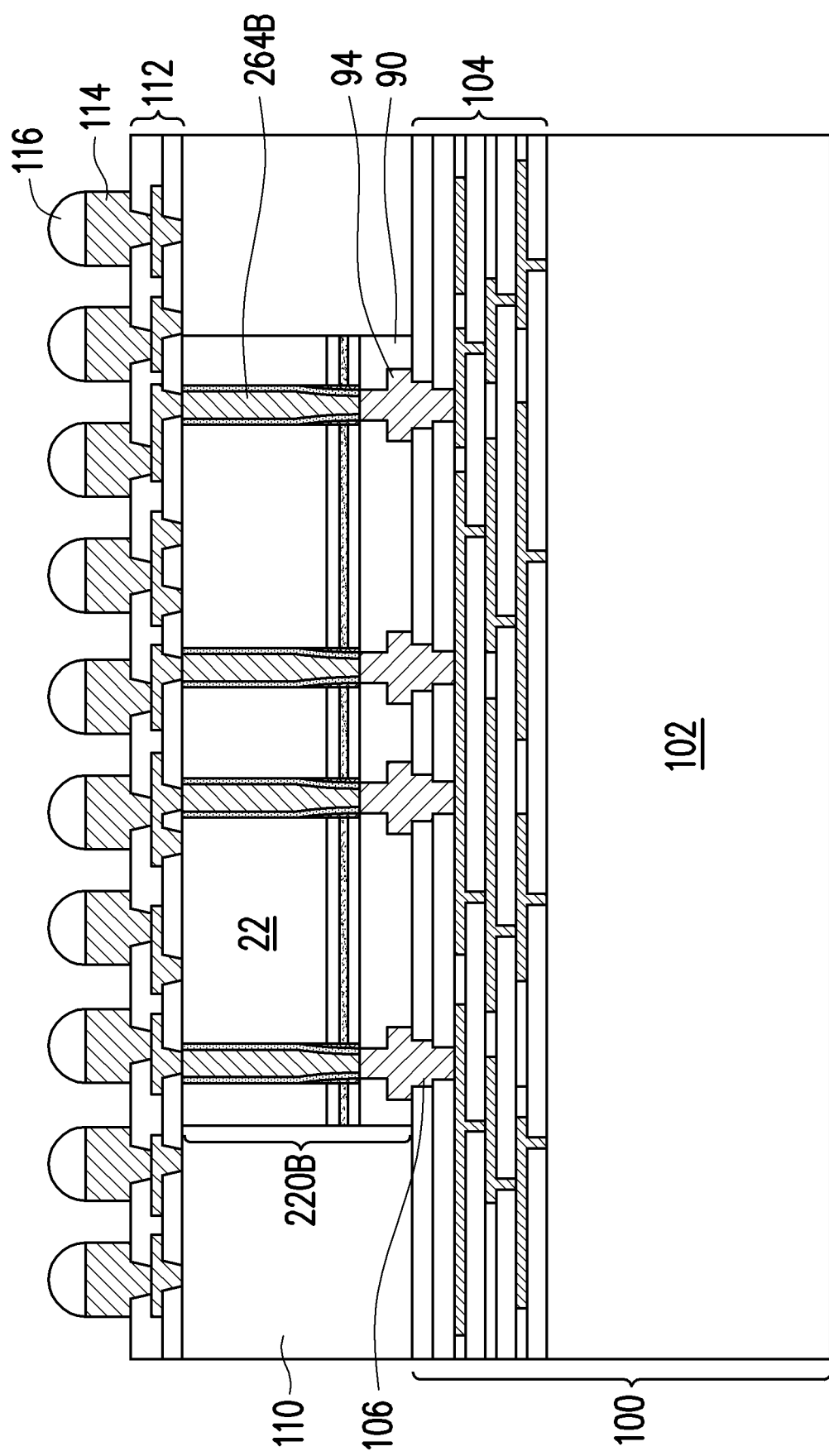

FIGS. 45 through 46 illustrate cross-sectional views of intermediate stages in the formation of a multi-stack die package, according to an embodiment. This embodiment is similar to the embodiment illustrated in FIGS. 38 through 43 except that this embodiment is a TSV-last process (similar to the process described above in FIGS. 21 through 25) instead of a TSV-middle process as described in FIGS. 38 through 43. Details regarding this embodiment that are similar to those for the previously described embodiments will not be repeated herein.

FIG. 45 illustrates a cross-sectional view of an integrated circuit die 220B in accordance with some embodiments. The integrated circuit die 220B may be formed by similar processes and materials as the integrated circuit die 220A described above the description is not repeated herein.

The interconnects 80 and 90 and passivation layer 88 are formed by similar processes and materials as the embodiment in FIGS. 21 through 25 and the description is not repeated herein. Also, similar to the embodiment in FIGS. 21 through 25, the TSV 264B is formed after and through the interconnect 80 and the passivation layer 88 and that description is not repeated herein.

FIG. 45 illustrates an intermediate stage of processing after that described in FIG. 24 above and the description of forming this intermediate stage of processing is not repeated herein.

FIG. 46 illustrates subsequent processing on the integrated circuit die 220B of FIG. 45. This subsequent processing is similar to the processing illustrated and described in FIGS. 16 through 19 and the description is not repeated herein.

The embodiment depicted in FIG. 46 is a chip-on-wafer structure bonded in a face-to-face configuration. Alternatively, the integrated circuit die 220B and the package structure 100 may be bonded in a face-to-back configuration. For example, the back of the die 220B (e.g., exposed ends of the TSVs 264B and substrate 22) could be bonded to the face of the package structure 100.

Figure 47:
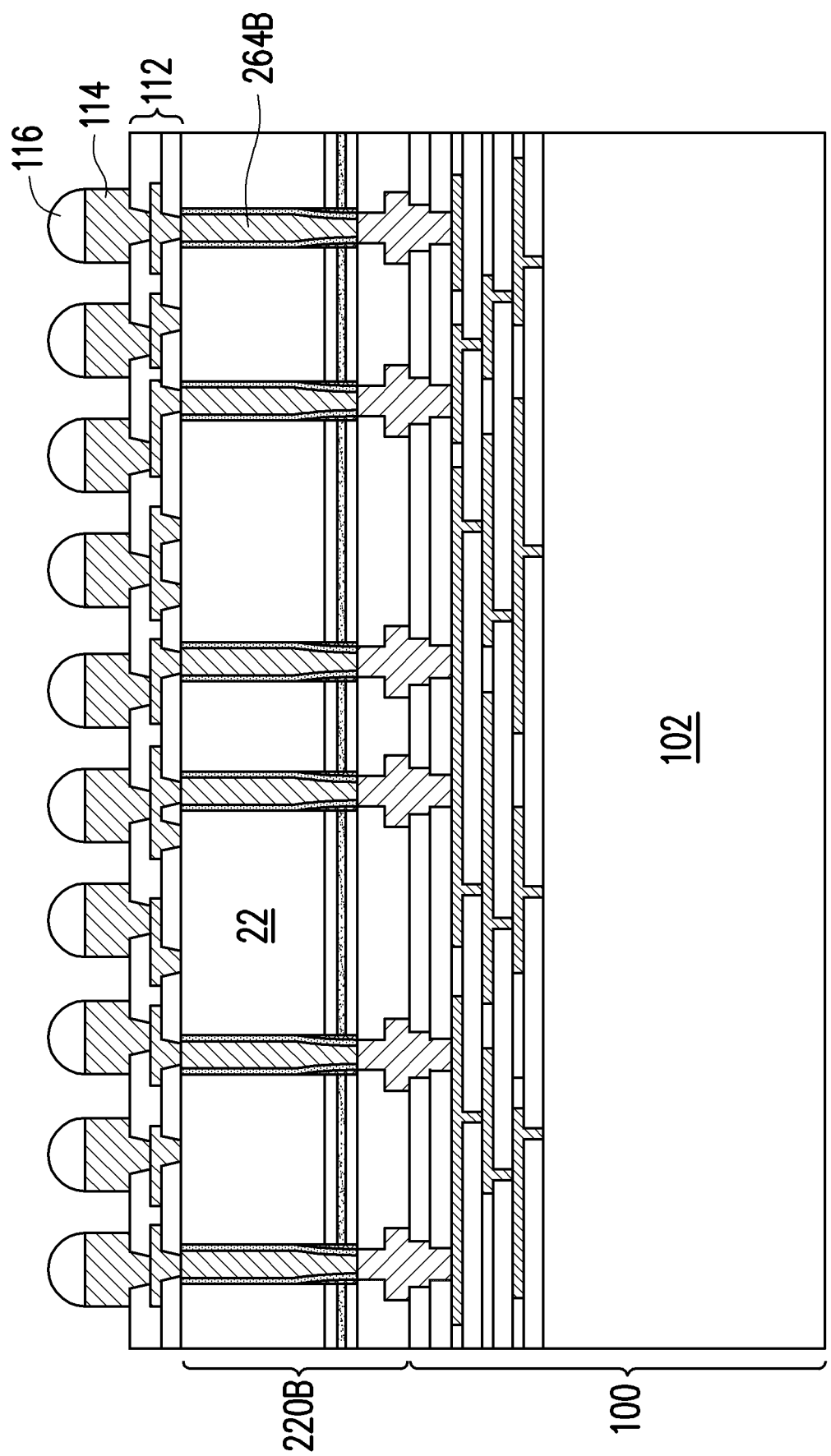
FIG. 47 illustrates a cross-sectional view of an intermediate stage in the formation of a multi-stack die package, according to another embodiment.

In FIG. 47, the structure is a wafer-on-wafer structure bonded in a face-to-face configuration in which the upper structure is a wafer 220B. The wafer 220B is formed similar to the die 220B described above and the description is not repeated herein. With this embodiment, the singulation step of singulating the die 220B and the formation of the encapsulant 110 in the previous embodiment is no longer needed and those steps can be omitted from this embodiment. In this embodiment, the wafer 220B and the package structure 100 are both wafers and are a same size.

In other embodiments, the wafer 220B may be bonded to the package structure 100 in a face-to-back configuration. For example, the back of the wafer 220B (e.g., exposed ends of the TSVs 264B and substrate 22) could be bonded to the face of the package structure 100.

FIGS. 48 through 53 illustrate cross-sectional views of intermediate stages in the formation of a multi-stack die package, according to an embodiment. This embodiment is similar to the embodiment illustrated in FIGS. 1 through 19 except that this embodiment includes a passivation layer only on the sidewalls of the interconnect 24 in the TSV opening and also the TSV has a substantially constant width for the entire length of the TSV. Details regarding this embodiment that are similar to those for the previously described embodiments will not be repeated herein.

Figure 48:
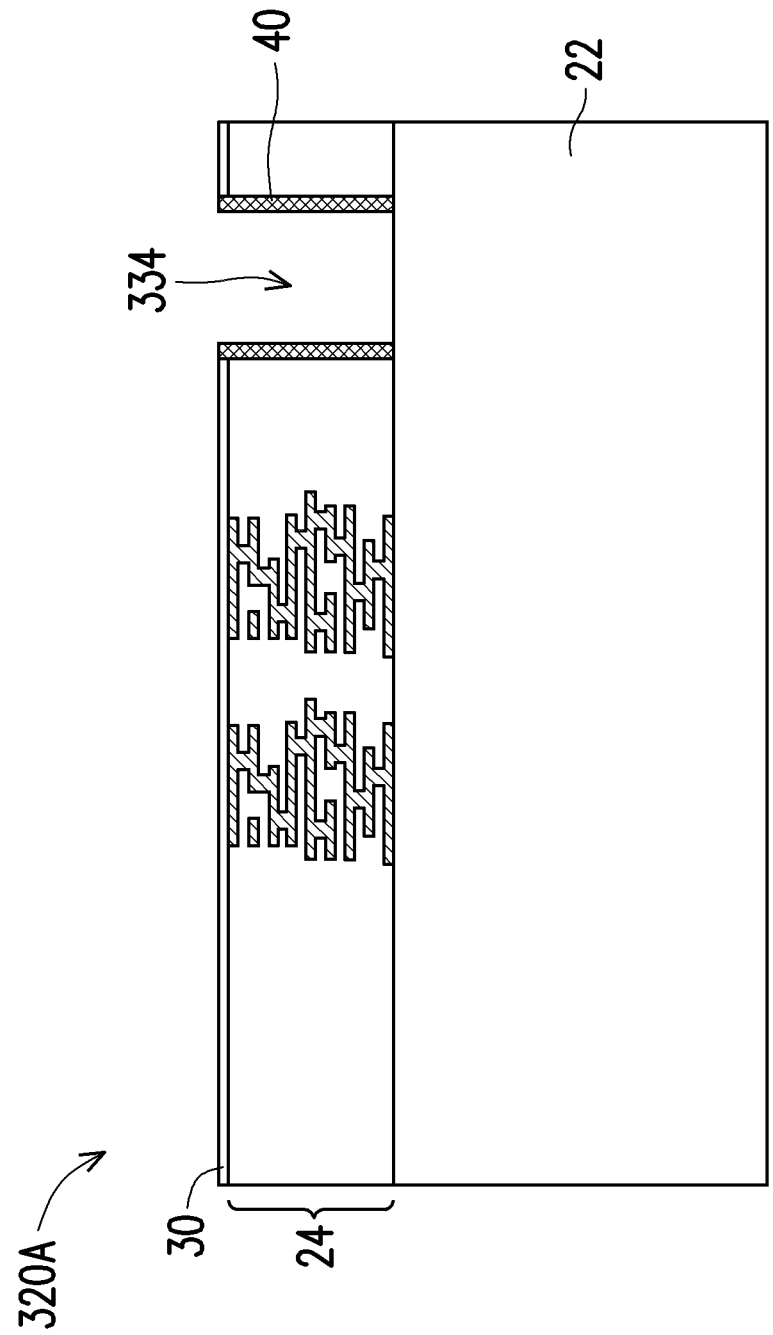
FIGS. 48 through 53 illustrate cross-sectional views of intermediate stages in the formation of a multi-stack die package, according to an embodiment.

FIG. 48 illustrates an intermediate stage of processing after that described in FIG. 6 above and the description of forming this intermediate stage of processing is not repeated herein. In FIG. 48, a cross-sectional view of an integrated circuit die 320A in accordance with some embodiments. The integrated circuit die 320A is similar to the integrated circuit die 20A and the description is not repeated herein.

In FIG. 48, the passivation layer 40 from FIG. 5 is patterned. The opening 334 in the substrate 22 may have a depth of about 5 μm to 10 μm. The patterned passivation layer 40 can help to prevent the diffusion of the materials of the subsequently formed through substrate via 264A (see, e.g., FIG. 41) into the interconnect 24 during subsequent processing.

In some embodiments, the passivation layer 40 is patterned to be removed from horizontal surfaces of the structure in FIG. 5 such that the passivation layer 40 forms spacers along the sidewalls of the interconnect 24 in the opening 34. In some embodiments, the passivation layer 40 is patterned with an etching process, such as an anisotropic etch process.

Figure 49:
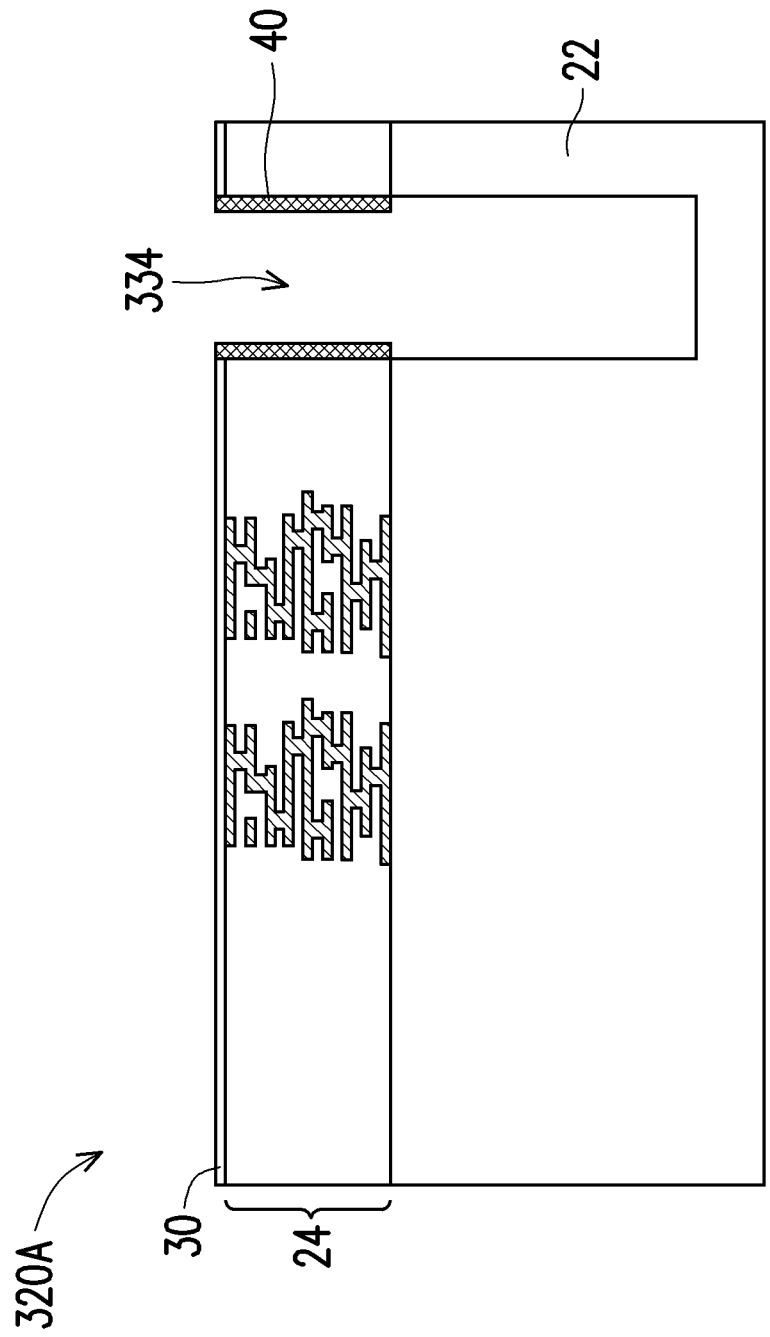

In FIG. 49, the opening 34 from FIG. 48 is extended to form opening 334 after another etching process to remove portions of the substrate 22 using the photoresist stop layer 30 and the patterned passivation layer 40.

Because the patterned passivation layer 40 is covering the exposed sidewalls of the interconnect 24 in the opening 34 during the process to form the opening 334, any possible contamination from the etching process for the opening 334 is blocked from entering the interconnect 24. By blocking the contamination, damage to the metallization patterns of the interconnect layers by, for example, sulfur, used during the etching of the through substrate via is prevented.

Figure 50:
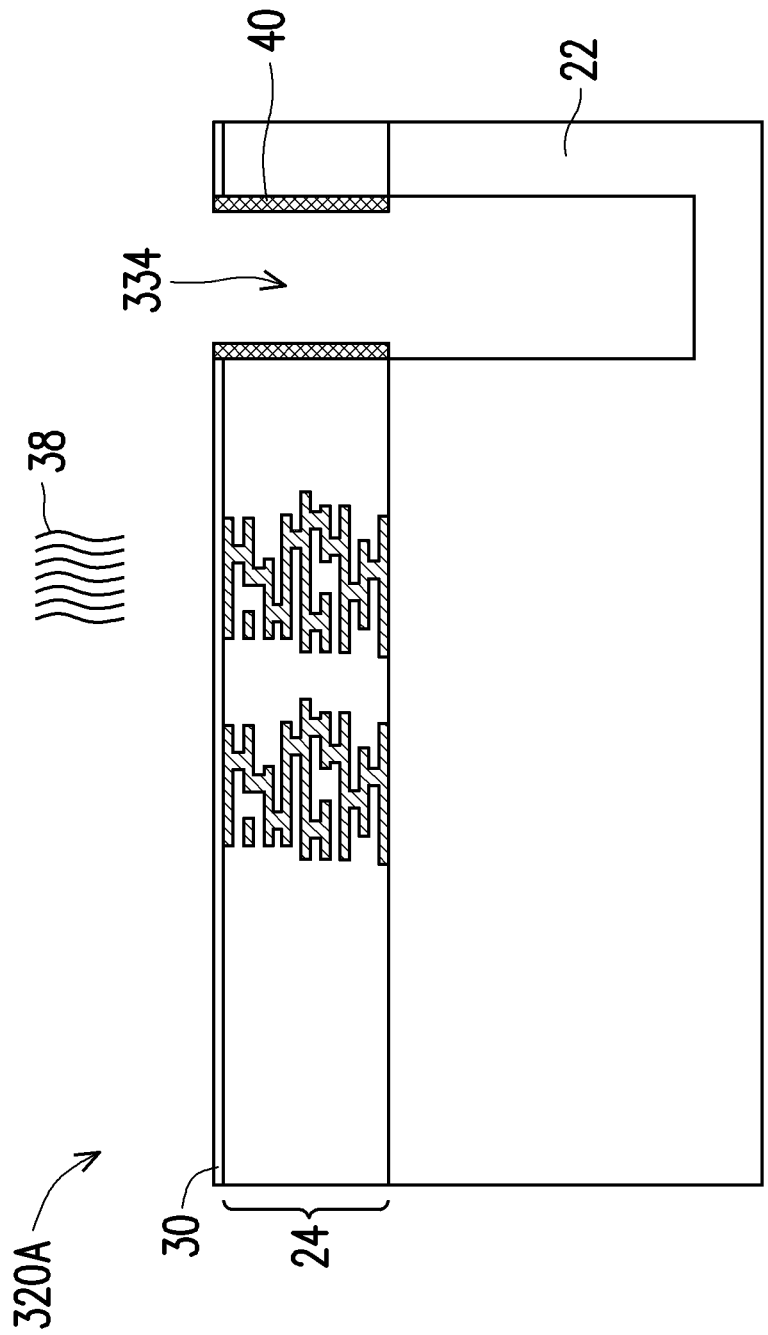

In FIG. 50, a baking process 38 is performed. The baking process 38 is similar to the baking process 38 described above and the description is not repeated herein. The baking process 38 can help to remove moisture and liquid from the openings 334 that accumulated from the etching process for the openings 34 and 334.

Figure 51:
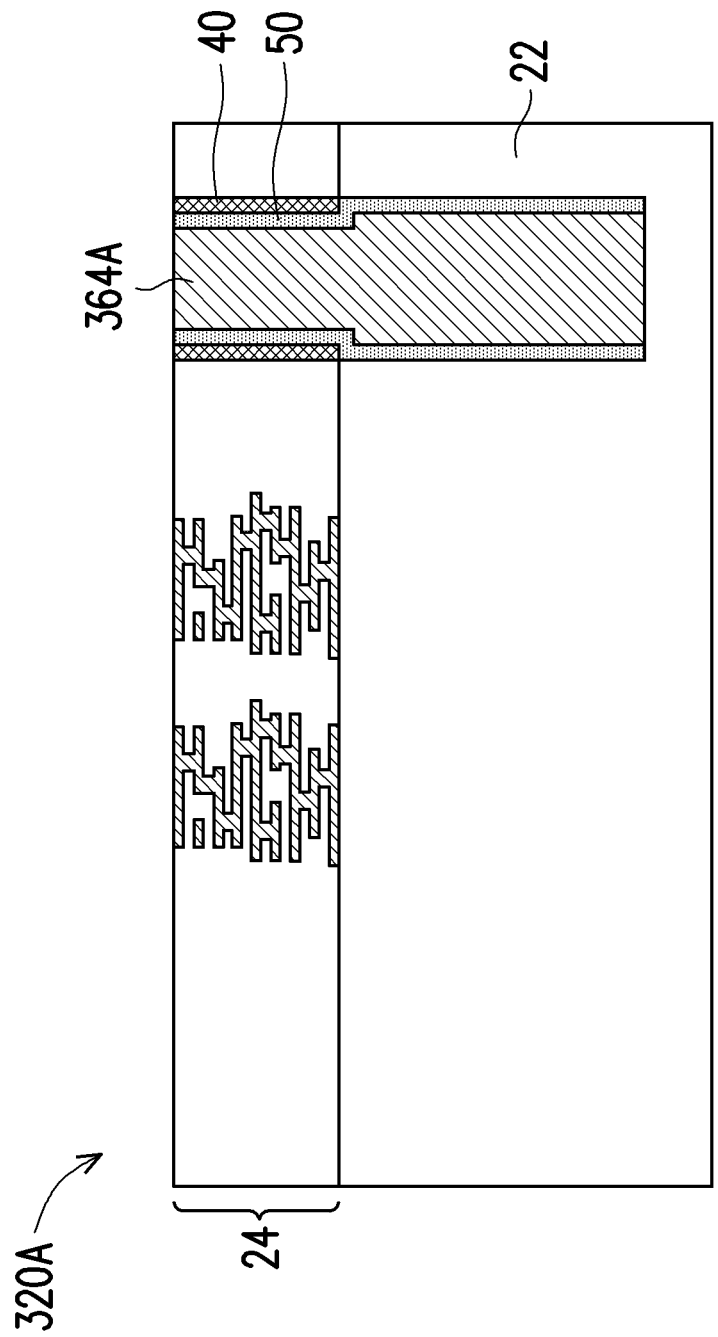

In FIG. 51, after the baking process 38, a TSV 364A is formed in the opening 334 through the interconnect 24 and at least partially into the substrate 22. The TSV 364A may be formed by similar processes and materials as the TSV 64A described above the description is not repeated herein.

One of the final steps of forming the TSV 364A is a planarization process (similar to that described above in reference to TSV 64A) to remove portions of the conductive material 62, the seed layer 60, the liner layer 50, the passivation layer 40, and the stop layer 30 outside the opening 334. Top surfaces of the TSV 364A, the passivation layer 40, and the liner layer 50 are substantially coplanar after the planarization process within process variations. The planarization process may be, for example, a chemical-mechanical polish (CMP), a grinding process, or the like. In this embodiment because the same mask (e.g., stop layer 30 and passivation layer 40) was used to etch the openings in the interconnect 24 and the substrate 22, the TSV 364A has a substantially constant width along the entire length of the TSV 364A.

Figure 52:
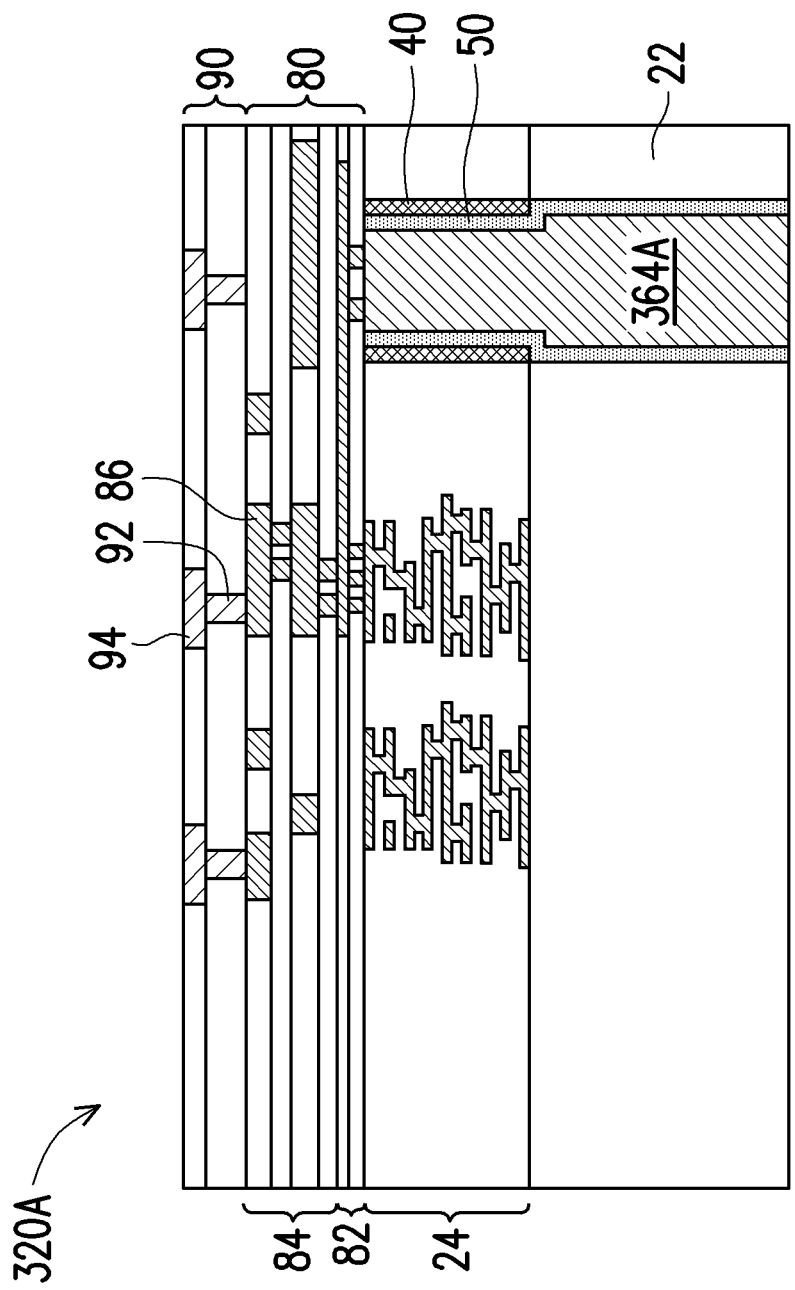

FIG. 52 illustrates subsequent processing on the integrated circuit die 320A of FIG. 41. This subsequent processing is similar to the processing illustrated and described in FIGS. 14 and 15 and the description is not repeated herein.

Figure 53:
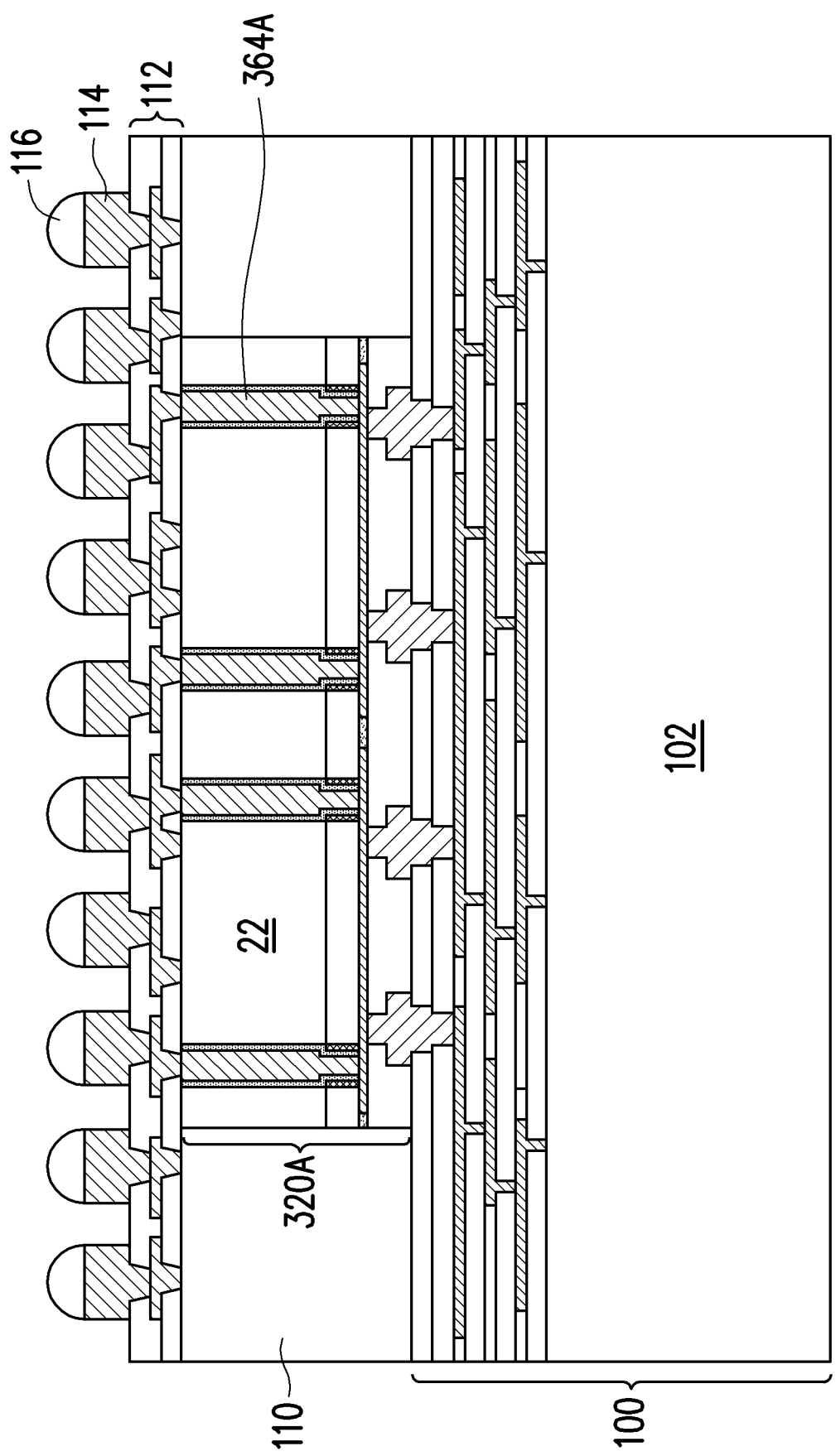

FIG. 53 illustrates subsequent processing on the integrated circuit die 320A of FIG. 52. This subsequent processing is similar to the processing illustrated and described in FIGS. 16 through 19 and the description is not repeated herein.

The embodiment depicted in FIG. 53 is a chip-on-wafer structure bonded in a face-to-face configuration. Alternatively, the integrated circuit die 320A and the package structure 100 may be bonded in a face-to-back configuration. For example, the back of the die 320A (e.g., exposed ends of the TSVs 364A and substrate 22) could be bonded to the face of the package structure 100.

Figure 54:
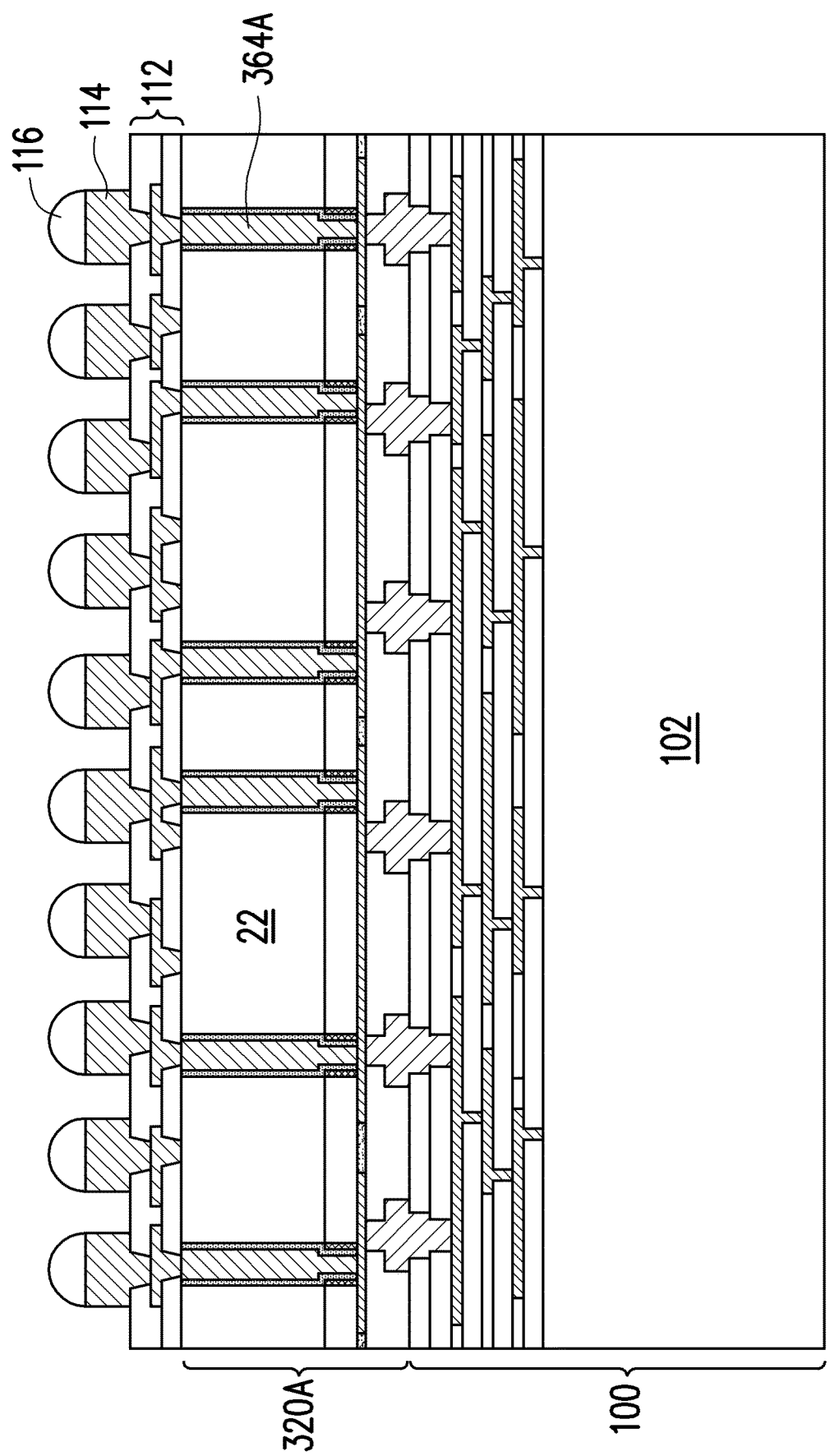
FIG. 54 illustrates a cross-sectional view of an intermediate stage in the formation of a multi-stack die package, according to another embodiment.

In FIG. 54, the structure is a wafer-on-wafer structure bonded in a face-to-face configuration in which the upper structure is a wafer 320A. The wafer 320A is formed similar to the die 320A described above and the description is not repeated herein. With this embodiment, the singulation step of singulating the die 320A and the formation of the encapsulant 110 in the previous embodiment is no longer needed and those steps can be omitted from this embodiment. In this embodiment, the wafer 320A and the package structure 100 are both wafers and are a same size.

In other embodiments, the wafer 320A may be bonded to the package structure 100 in a face-to-back configuration. For example, the back of the wafer 320A (e.g., exposed ends of the TSVs 364A and substrate 22) could be bonded to the face of the package structure 100.

Figure 55:
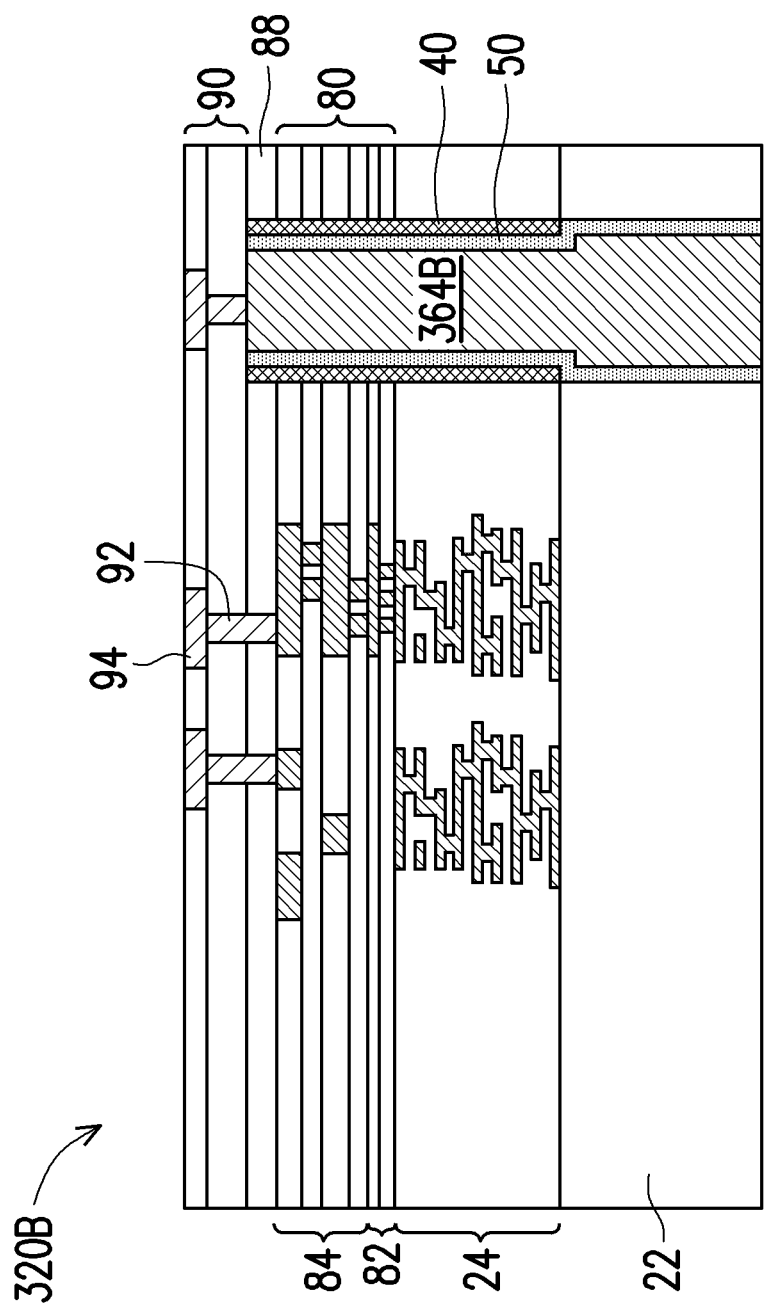
FIGS. 55 through 56 illustrate cross-sectional views of intermediate stages in the formation of a multi-stack die package, according to an embodiment.
Figure 56:
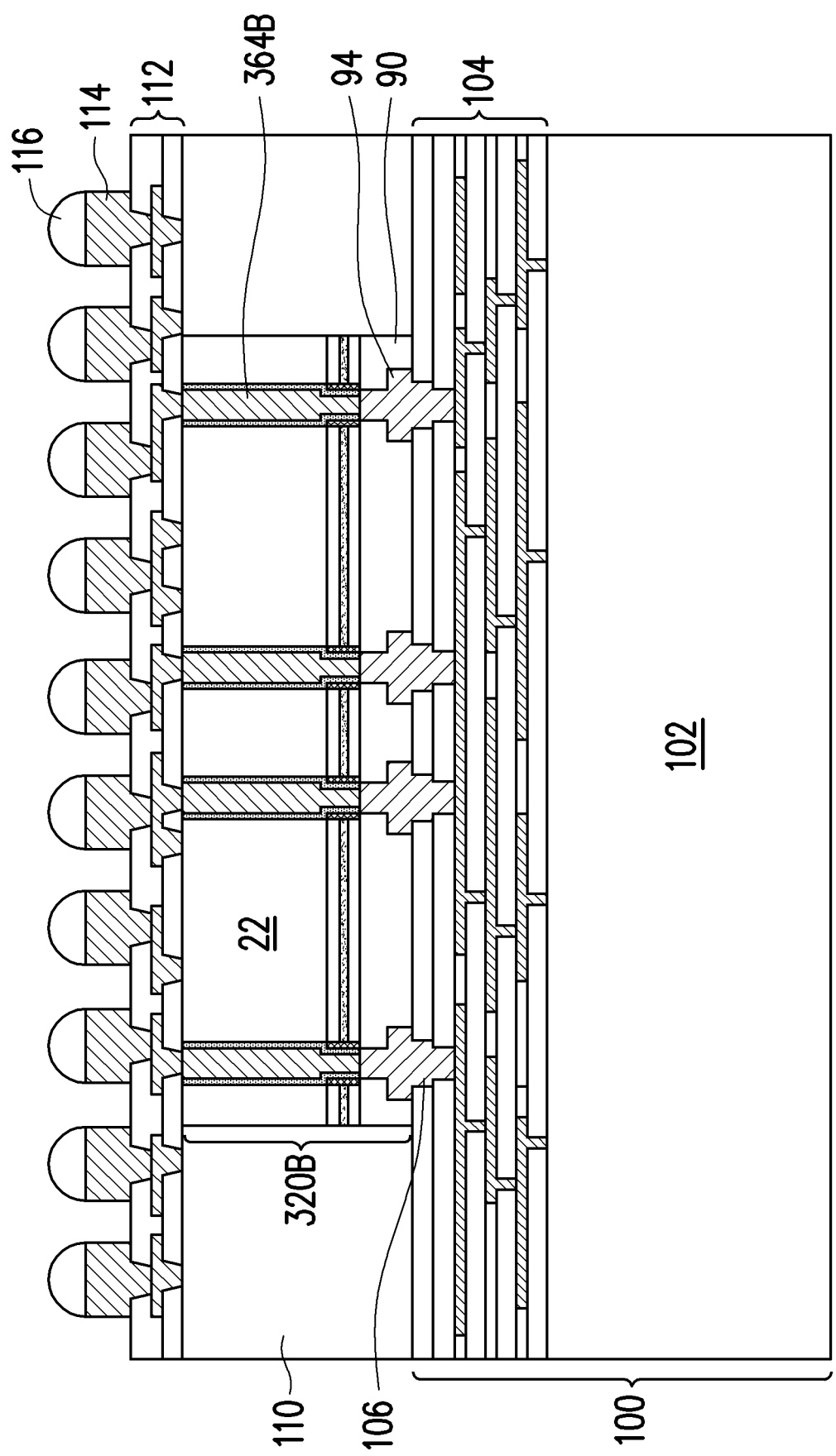

FIGS. 55 through 56 illustrate cross-sectional views of intermediate stages in the formation of a multi-stack die package, according to an embodiment. This embodiment is similar to the embodiment illustrated in FIGS. 48 through 53 except that this embodiment is a TSV-last process (similar to the process described above in FIGS. 21 through 25) instead of a TSV-middle process as described in FIGS. 48 through 53. Details regarding this embodiment that are similar to those for the previously described embodiments will not be repeated herein.

FIG. 55 illustrates a cross-sectional view of an integrated circuit die 320B in accordance with some embodiments. The integrated circuit die 320B may be formed by similar processes and materials as the integrated circuit die 320A described above the description is not repeated herein.

The interconnects 80 and 90 and passivation layer 88 are formed by similar processes and materials as the embodiment in FIGS. 21 through 25 and the description is not repeated herein. Also, similar to the embodiment in FIGS. 21 through 25, the TSV 364B is formed after and through the interconnect 80 and the passivation layer 88 and that description is not repeated herein.

FIG. 55 illustrates an intermediate stage of processing after that described in FIG. 24 above and the description of forming this intermediate stage of processing is not repeated herein.

FIG. 56 illustrates subsequent processing on the integrated circuit die 320B of FIG. 55. This subsequent processing is similar to the processing illustrated and described in FIGS. 16 through 19 and the description is not repeated herein.

The embodiment depicted in FIG. 56 is a chip-on-wafer structure bonded in a face-to-face configuration. Alternatively, the integrated circuit die 320B and the package structure 100 may be bonded in a face-to-back configuration. For example, the back of the die 320B (e.g., exposed ends of the TSVs 364B and substrate 22) could be bonded to the face of the package structure 100.

Figure 57:
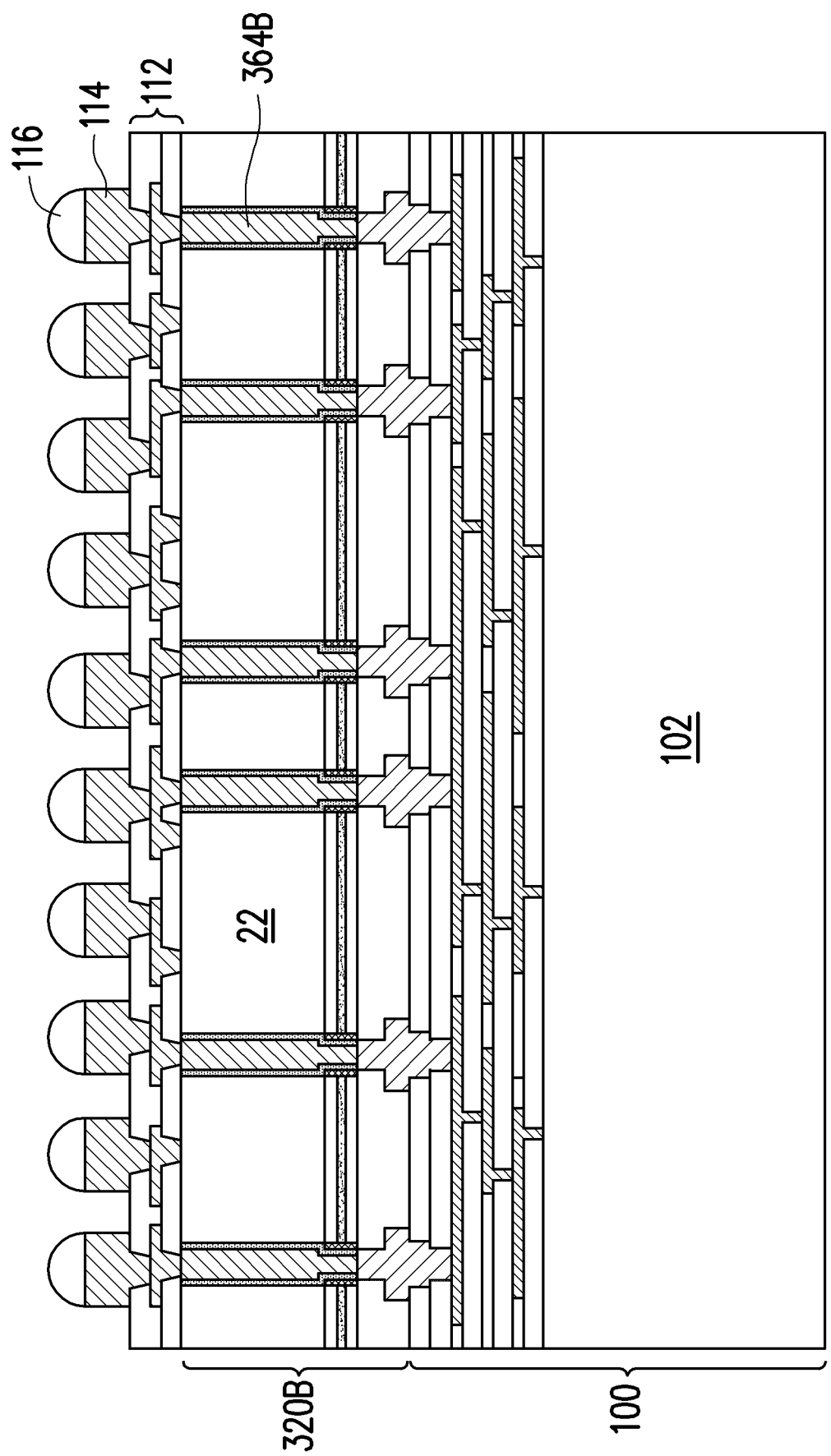
FIG. 57 illustrates a cross-sectional view of an intermediate stage in the formation of a multi-stack die package, according to another embodiment.

In FIG. 57, the structure is a wafer-on-wafer structure bonded in a face-to-face configuration in which the upper structure is a wafer 320B. The wafer 320B is formed similar to the die 320B described above and the description is not repeated herein. With this embodiment, the singulation step of singulating the die 320B and the formation of the encapsulant 110 in the previous embodiment is no longer needed and those steps can be omitted from this embodiment. In this embodiment, the wafer 320B and the package structure 100 are both wafers and are a same size.

In other embodiments, the wafer 320B may be bonded to the package structure 100 in a face-to-back configuration. For example, the back of the wafer 320B (e.g., exposed ends of the TSVs 364B and substrate 22) could be bonded to the face of the package structure 100.

Other features and processes may also be included. For example, testing structures may be included to aid in the verification testing of the 3D packaging or 3 DIC devices. The testing structures may include, for example, test pads formed in a redistribution layer or on a substrate that allows the testing of the 3D packaging or the 3 DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. The device structure includes a passivation layer between a through substrate via (TSV) and the interconnect or redistribution structure to block contamination from entering the interconnect or redistribution structure that can occur during the through via formation. In some embodiments, the passivation layer may include a nitride layer, an undoped silicate glass (USG) layer, the like, or a combination thereof. The contaminants from the formation of the through substrate via can include liquid or moisture used during the formation of the through substrate via and/or can include chemicals, such as sulfur, used during the etching of the through substrate via. In conventional structures, these contaminants can enter the exposed sidewalls of the interconnect layers during the formation of the through substrate via and can damage the metallization patterns and dielectric layers of the interconnect. By blocking the contamination, damage to the metallization patterns of the interconnect layers by the contamination can be prevented.

One embodiment is a method including forming a first interconnect structure over a first substrate, the first interconnect structure comprising dielectric layers and metallization patterns therein, patterning the first interconnect structure to form a first opening, coating the first opening with a barrier layer, etching a second opening through the barrier layer and the exposed portion of the first substrate, depositing a liner in the first opening and the second opening, filling the first opening and the second opening with a conductive material, and thinning the first substrate to expose a portion of the conductive material in the second opening, the conductive material extending through the first interconnect structure and the first substrate forming a through substrate via.

Embodiments may include one or more of the following features. The method where the second opening has a smaller diameter than the first opening. The second opening has a same diameter as the first opening. The method further including forming a second interconnect structure over the first interconnect structure and the through substrate via, the second interconnect structure including dielectric layers and metallization patterns therein, the metallization patterns of the second interconnect structure being electrically coupled to the metallization patterns of the first interconnect structure and to the through substrate via, forming a first dielectric layer over the second interconnect structure, and forming first bond pads in the first dielectric layer, the first bond pads being electrically coupled to the metallization patterns of the second interconnect structure. The method further including hybrid bonding the first dielectric layer and the first bond pads to a second dielectric layer and second bond pads of a package structure, the package structure including a second substrate and a third interconnect structure over the second substrate, the second dielectric layer and the second bond pads being part of the third interconnect structure. The method further including after hybrid bonding the first dielectric layer and the first bond pads to the second dielectric layer and the second bond pads of the package structure, forming a first redistribution structure over the first substrate and the through substrate via, the first redistribution structure including dielectric layers and metallization patterns therein, the metallization patterns of the first redistribution structure being electrically coupled to the through substrate via, and forming a first set of conductive bumps over and electrically coupled to the first redistribution structure. The method further including before forming the first redistribution structure, encapsulating the first substrate, the first interconnect structure, the second interconnect structure, and the first dielectric layer with an encapsulant, the first redistribution structure being formed over the encapsulant. The barrier layer is silicon nitride and where the liner is an oxide. The barrier layer is only on a sidewalls of the first opening.

One embodiment includes forming a first dielectric layer over a first substrate, the first dielectric layer having a first metallization pattern therein. The method also includes forming a first patterned mask over the first dielectric layer. The method also includes performing a first etch process using the first patterned mask as a mask, the first etch process forming a first opening through the first dielectric layer exposing a first portion of the first substrate. The method also includes performing a second etch process using the first patterned mask as a mask, the second etch process etching the exposed first portion of the first substrate to form a second opening in the first substrate, the second opening having a same diameter as the first opening. The method also includes selectively depositing a barrier layer on exposed sidewalls of first dielectric layer in the first opening, sidewalls of the second opening being free of the barrier layer. The method also includes forming a liner on the barrier layer in the first opening and on the sidewalls of the first substrate in the second opening. The method also includes filling the first opening and the second opening with a conductive material. The method also includes and thinning the first substrate to expose a portion of the conductive material in the second opening, the conductive material extending through the first dielectric layer and the first substrate forming a through substrate via.

Embodiments may include one or more of the following features. The method where the barrier layer is silicon nitride and where the liner is an oxide. The method further including forming a second dielectric layer over the first dielectric layer and the through substrate via, the second dielectric layer having a second metallization pattern therein, the second metallization pattern being electrically coupled to first metallization pattern and to the through substrate via, forming a third dielectric layer over the second dielectric layer, and forming first bond pads in the third dielectric layer, the first bond pads being electrically coupled to the second metallization pattern, and hybrid bonding the third dielectric layer and the first bond pads to a fourth dielectric layer and second bond pads of a package structure, the package structure including a second substrate. The method further including after hybrid bonding the third dielectric layer and the first bond pads to the fourth dielectric layer and the second bond pads of the package structure, encapsulating the first substrate, the first dielectric layer, the second dielectric layer, and the third dielectric layer with an encapsulant, forming a first redistribution structure over the first substrate, the through substrate via, and the encapsulant, the first redistribution structure including dielectric layers and metallization patterns therein, the metallization patterns of the first redistribution structure being electrically coupled to the through substrate via, and forming a first set of conductive bumps over and electrically coupled to the first redistribution structure. The conductive material has a smaller width in the first opening than in the second opening. The method further including before selectively depositing the barrier layer on exposed sidewalls of first dielectric layer in the first opening, performing a baking process on at least the first opening and the second opening.

One embodiment includes a first interconnect structure over a first substrate, the first interconnect structure including dielectric layers and metallization patterns therein. The structure also includes a through substrate via extending through the first interconnect structure and the first substrate, the through substrate via including a conductive material extending through the first interconnect structure and the first substrate. The structure also includes a barrier layer between the first interconnect structure and the conductive material. The structure also includes and a liner between the barrier layer and the first substrate.

Embodiments may include one or more of the following features. The structure where the barrier layer physically contacts the first interconnect structure, and where the liner physically contacts the first substrate. The barrier layer is silicon nitride and where the liner is an oxide. The barrier layer is undoped silicate glass (USG) and where the liner is an oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first dielectric layer over a first substrate, the first dielectric layer having a first metallization pattern therein;
    forming a first patterned mask over the first dielectric layer;
    performing a first etch process using the first patterned mask as a mask, the first etch process forming a first opening through the first dielectric layer exposing a first portion of the first substrate;
    performing a second etch process using the first patterned mask as a mask, the second etch process etching the exposed first portion of the first substrate to form a second opening in the first substrate, the second opening having a same diameter as the first opening;
    after forming the second opening in the first substrate, depositing a barrier layer on exposed sidewalls of first dielectric layer in the first opening, sidewalls of the second opening being free of the barrier layer;
    forming a liner on the barrier layer in the first opening and on the sidewalls of the first substrate in the second opening;
    filling the first opening and the second opening with a conductive material; and
    thinning the first substrate to expose a portion of the conductive material in the second opening, the conductive material extending through the first dielectric layer and the first substrate forming a through substrate via.

2. The method of claim 1, wherein the barrier layer is silicon nitride and wherein the liner is an oxide.

3. The method of claim 1 further comprising:
    forming a second dielectric layer over the first dielectric layer and the through substrate via, the second dielectric layer having a second metallization pattern therein, the second metallization pattern being electrically coupled to first metallization pattern and to the through substrate via;
    forming a third dielectric layer over the second dielectric layer; and
    forming first bond pads in the third dielectric layer, the first bond pads being electrically coupled to the second metallization pattern; and
    hybrid bonding the third dielectric layer and the first bond pads to a fourth dielectric layer and second bond pads of a package structure, the package structure comprising a second substrate.

4. The method of claim 3 further comprising:
    after hybrid bonding the third dielectric layer and the first bond pads to the fourth dielectric layer and the second bond pads of the package structure, encapsulating the first substrate, the first dielectric layer, the second dielectric layer, and the third dielectric layer with an encapsulant;
    forming a first redistribution structure over the first substrate, the through substrate via, and the encapsulant, the first redistribution structure comprising dielectric layers and metallization patterns therein, the metallization patterns of the first redistribution structure being electrically coupled to the through substrate via; and
    forming a first set of conductive bumps over and electrically coupled to the first redistribution structure.

5. The method of claim 1, wherein the conductive material has a smaller width in the first opening than in the second opening.

6. The method of claim 1 further comprising:
before selectively depositing the barrier layer on exposed sidewalls of first dielectric layer in the first opening, performing a baking process on at least the first opening and the second opening.

7. The method of claim 1, wherein the liner physically contacts the first substrate.

8. A structure comprising:
a first interconnect structure over a first substrate, the first interconnect structure comprising dielectric layers and metallization patterns therein;
a through substrate via extending through the first interconnect structure and the first substrate, the through substrate via comprising:
a conductive material extending through the first interconnect structure and the first substrate;
a barrier layer between the first interconnect structure and the conductive material; and
a liner between the conductive material and the first substrate, wherein the liner physically contacts the first substrate and the conductive material, the liner being an insulating layer extending from the first substrate to the conductive material;
a second interconnect structure over the first interconnect structure and the through substrate via, the second interconnect structure comprising dielectric layers and metallization patterns therein, the metallization patterns of the second interconnect structure being electrically coupled to the metallization patterns of the first interconnect structure and to the through substrate via;
a first dielectric layer over the second interconnect structure;
first bond pads in the first dielectric layer, the first bond pads being electrically coupled to the metallization patterns of the second interconnect structure; and
a package structure comprising a second substrate and a third interconnect structure over the second substrate, a second dielectric layer and second bond pads of the third interconnect structure being direct bonded to the first dielectric layer and first bond pads.

9. The structure of claim 8, wherein the barrier layer physically contacts the first interconnect structure.

10. The structure of claim 8, wherein the barrier layer is silicon nitride and wherein the liner is an oxide.

11. The structure of claim 8, wherein the barrier layer is undoped silicate glass (USG) and wherein the liner is an oxide.

12. The structure of claim 8, wherein the conductive material has a first width in the first interconnect structure and a second width in the first substrate, the first width being less than the second width.

13. The structure of claim 8, wherein the conductive material has a first width in the first interconnect structure and a second width in the first substrate, the first width being greater than the second width.

14. The structure of claim 8, wherein the conductive material has same width in the first interconnect structure and in the first substrate.

15. The structure of claim 8, wherein the barrier layer physically contacts the first substrate.

16. A method comprising:
forming a first interconnect structure over a first substrate, the first interconnect structure comprising dielectric layers and metallization patterns therein;
patterning the first interconnect structure to form a first opening exposing a portion of the first substrate;
forming a passivation layer in the first opening;
patterning the passivation layer in the first opening;
etching a second opening in the first substrate using the patterned passivation layer as a mask;
depositing a liner in the first opening and the second opening, the liner physically contacting the passivation layer;
filling the first opening and the second opening with a conductive material;
thinning the first substrate to expose a portion of the conductive material in the second opening, the conductive material extending through the first interconnect structure and the first substrate forming a through substrate via;
forming a second interconnect structure over the first interconnect structure and the through substrate via, the second interconnect structure comprising dielectric layers and metallization patterns therein, the metallization patterns of the second interconnect structure being electrically coupled to the metallization patterns of the first interconnect structure and to the through substrate via;
forming a first dielectric layer over the second interconnect structure; and
forming first bond pads in the first dielectric layer, the first bond pads being electrically coupled to the metallization patterns of the second interconnect structure.

17. The method of claim 16, wherein the second opening has a same diameter as the first opening.

18. The method of claim 16 further comprising:
hybrid bonding the first dielectric layer and the first bond pads to a second dielectric layer and second bond pads of a package structure, the package structure comprising a second substrate and a third interconnect structure over the second substrate, the second dielectric layer and the second bond pads being part of the third interconnect structure.

19. The method of claim 16, wherein forming the passivation layer comprises performing a plasma-enhanced chemical vapor deposition (PECVD) process, a high density plasma CVD (HDP-CVD), or a combination thereof, the passivation layer being a non-conformal layer.

20. The method of claim 19, wherein after forming the passivation layer, the passivation layer has a void in the first opening.

* * * * *